(12) United States Patent
Shin et al.

(10) Patent No.: US 8,907,426 B2
(45) Date of Patent: Dec. 9, 2014

(54) SEMICONDUCTOR DEVICE HAVING EMBEDDED STRAIN-INDUCING PATTERN AND METHOD OF FORMING THE SAME

(71) Applicant: Samsung Electronics Co., Ltd., Suwon-si (KR)

(72) Inventors: Dong-Suk Shin, Yongin-si (KR); Myung-Sun Kim, Hwaseong-si (KR); Seong-Jin Nam, Seongnam-si (KR); Pan-Kwi Park, Incheon (KR); Hoi-Sung Chung, Hwaseong-si (KR); Nae-In Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/908,440

(22) Filed: Jun. 3, 2013

(65) Prior Publication Data
US 2013/0320434 A1     Dec. 5, 2013

(30) Foreign Application Priority Data

Jun. 4, 2012 (KR) .................. 10-2012-0060048

(51) Int. Cl.
| | | |
|---|---|---|
| H01L 29/78 | (2006.01) | |
| H01L 29/66 | (2006.01) | |
| H01L 29/08 | (2006.01) | |
| H01L 29/165 | (2006.01) | |
| H01L 21/8238 | (2006.01) | |
| H01L 21/28 | (2006.01) | |
| H01L 29/10 | (2006.01) | |

(52) U.S. Cl.
CPC .......... *H01L 29/7827* (2013.01); *H01L 29/665* (2013.01); *H01L 29/6653* (2013.01); *H01L 29/6656* (2013.01); *H01L 29/6659* (2013.01); *H01L 29/66636* (2013.01); *H01L 29/7834* (2013.01); *H01L 29/7848* (2013.01); *H01L 29/0847* (2013.01); *H01L 29/165* (2013.01); *H01L 21/823807* (2013.01); *H01L 21/823814* (2013.01); *H01L 21/28247* (2013.01); *H01L 29/1083* (2013.01)
USPC ........................ 257/368; 257/369; 257/408

(58) Field of Classification Search
CPC ................... H01L 29/66636; H01L 29/7848
USPC ......................... 257/368, 369, 408, E29.266
See application file for complete search history.

(56) References Cited

U.S. PATENT DOCUMENTS

| | | | |
|---|---|---|---|
| 6,342,422 B1 | 1/2002 | Wu | |
| 7,553,717 B2 | 6/2009 | Chakravarthi et al. | |

(Continued)

FOREIGN PATENT DOCUMENTS

JP          2011165859          8/2011

*Primary Examiner* — Matthew W Such
*Assistant Examiner* — Scott Stowe
(74) *Attorney, Agent, or Firm* — Onello & Mello, LLP

(57) ABSTRACT

In a semiconductor device, a first active region has a first Σ-shape, and the second active region has a second Σ-shape. When a line that is perpendicular to the substrate and passes a side surface of a first gate electrode in the first region is defined as a first vertical line, when a line that is perpendicular to the substrate and passes a side surface of a second gate electrode in the second region is defined as a second vertical line, when a shortest distance between the first vertical line and the first trench is defined as a first horizontal distance, and when a shortest distance between the second vertical line and the second trench is defined as a second horizontal distance, a difference between the first horizontal distance and the second horizontal distance is equal to or less than 1 nm.

20 Claims, 45 Drawing Sheets

(56) References Cited

U.S. PATENT DOCUMENTS

| | | |
|---|---|---|
| 7,667,227 B2 | 2/2010 | Shimamune et al. |
| 7,851,313 B1 | 12/2010 | Luo et al. |
| 7,994,062 B2 | 8/2011 | Wojtczak et al. |
| 8,071,442 B2 | 12/2011 | Kronholz et al. |
| 2008/0173941 A1 | 7/2008 | Zhu et al. |
| 2011/0049567 A1 | 3/2011 | Peng et al. |
| 2011/0186912 A1 | 8/2011 | Murthy et al. |
| 2011/0284968 A1 | 11/2011 | Lee et al. |
| 2011/0287600 A1* | 11/2011 | Cheng et al. .................. 438/299 |
| 2011/0287611 A1* | 11/2011 | Cheng et al. .................. 438/478 |
| 2011/0312145 A1* | 12/2011 | Tsai et al. ..................... 438/300 |

* cited by examiner

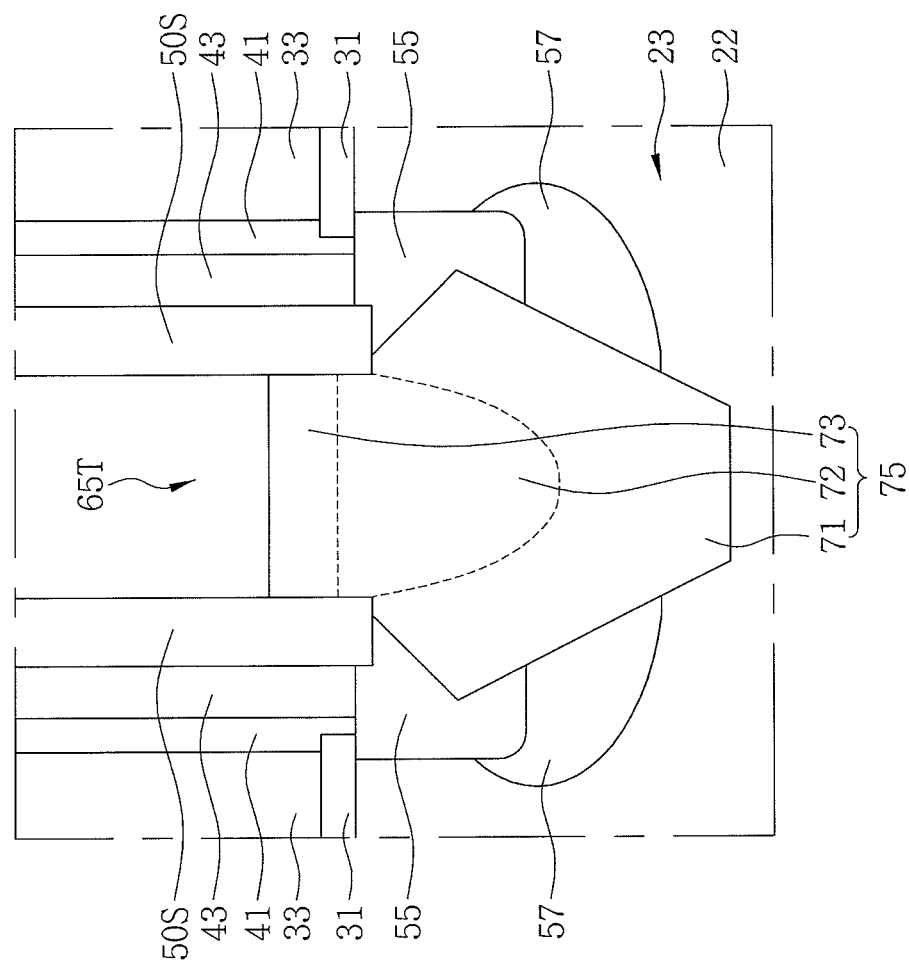

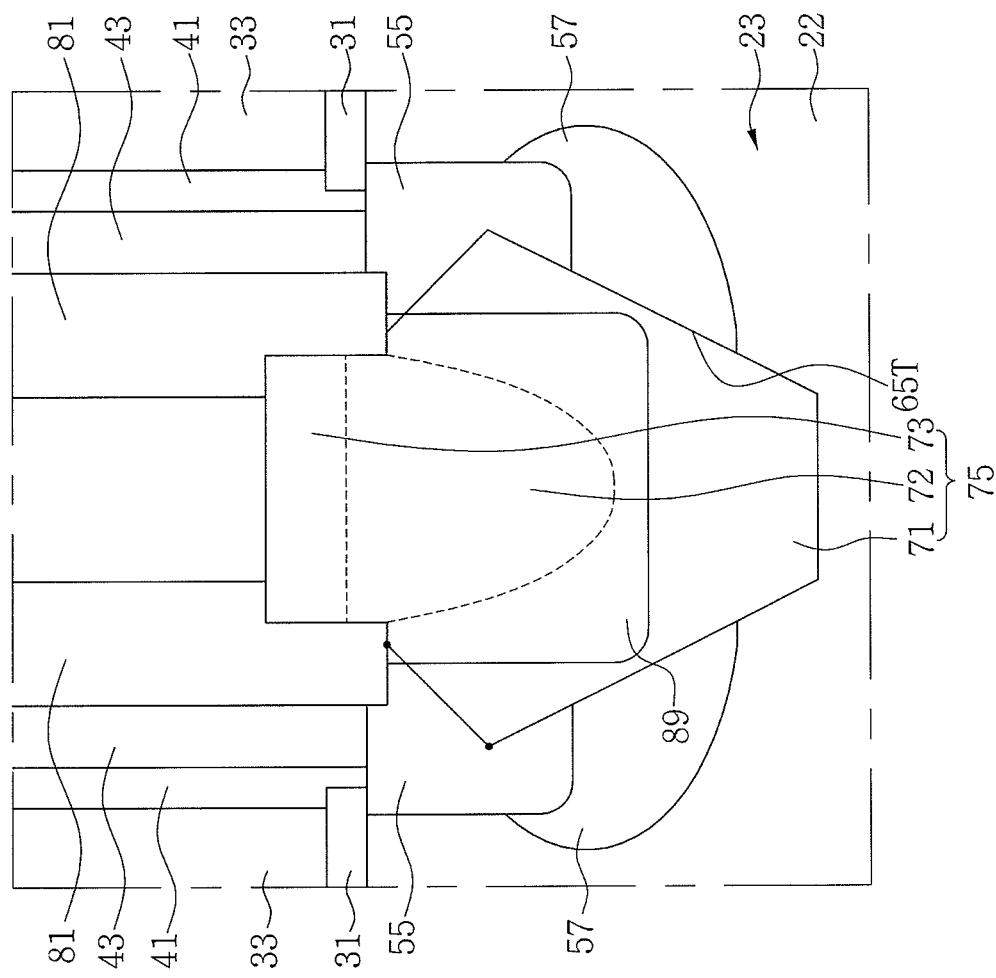

SEMICONDUCTOR DEVICE HAVING EMBEDDED STRAIN-INDUCING PATTERN AND METHOD OF FORMING THE SAME

CROSS-REFERENCE TO RELATED APPLICATION

This application claims priority under 35 U.S.C. §119 to Korean Patent Application No. 10-2012-0060048 filed on Jun. 4, 2012, the disclosure of which is hereby incorporated by reference in its entirety.

BACKGROUND

1. Field

Embodiments of the inventive concepts relate to semiconductor devices having a strain-inducing pattern embedded in a substrate and methods of forming the same.

2. Description of Related Art

In order to improve electrical characteristics of a semiconductor device, strain technology has been studied. For example, it has been identified that carrier mobility can be improved by applying stress to a channel region.

SUMMARY

Embodiments of the inventive concepts provide semiconductor devices having strain-inducing patterns formed throughout a substrate at regular locations.

Other embodiments of the inventive concepts provide methods of forming semiconductor devices having strain-inducing patterns formed throughout a substrate at regular locations.

Still other embodiments of the inventive concepts provide an electronic apparatus employing semiconductor devices having a strain-inducing pattern.

In one aspect, a semiconductor device comprises: a substrate having a first region and having a second region having a higher pattern density than the first region, the substrate extending in a horizontal direction of extension; a first active region defined in the first region; a first gate electrode on the first active region; a first trench in the first active region and offset-aligned to the first gate electrode; a first strain-inducing pattern in the first trench; a second active region defined in the second region; a second gate electrode on the second active region; a second trench in the second active region and offset-aligned to the second gate electrode; and a second strain-inducing pattern in the second trench, wherein the first active region has a first Σ-shaped configuration bordered in part by the first trench, and the second active region has a second Σ-shaped configuration bordered in part by the second trench, and wherein a vertical line that is perpendicular to the horizontal direction of extension of the substrate and intersects a side surface of the first gate electrode is defined as a first vertical line, wherein a vertical line that is perpendicular to the horizontal direction of extension of the substrate and intersects a side surface of the second gate electrode is defined as a second vertical line, wherein a shortest distance between the first vertical line and the first trench is defined as a first horizontal distance, wherein a shortest distance between the second vertical line and the second trench is defined as a second horizontal distance, and wherein a difference between the first horizontal distance and the second horizontal distance is equal to or less than 1 nm.

In one embodiment, the first active region includes: a first upper surface facing the first gate electrode; a first upper side surface facing the first strain-inducing pattern below the first upper surface; a first lower side surface facing the first strain-inducing pattern below the first upper side surface; a first upper edge disposed between the first upper surface and the first upper side surface; and a first intermediate edge disposed between the first upper side surface and the first lower side surface, the first intermediate edge being nearer than the first upper edge with respect to the first vertical line, and the first horizontal distance being a horizontal distance between the first vertical line and the first intermediate edge; and the second active region includes: a second upper surface facing the second gate electrode; a second upper side surface facing the second strain-inducing pattern below the second upper surface; a second lower side surface facing the second strain-inducing pattern below the second upper side surface; a second upper edge disposed between the second upper surface and the second upper side surface; and a second intermediate edge disposed between the second upper side surface and the second lower side surface, the second intermediate edge being nearer than the second upper edge with respect to the second vertical line, and the second horizontal distance being a horizontal distance between the second vertical line and the second intermediate edge.

In another embodiment, a horizontal line that is parallel to the substrate and intersects an upper end of the first active region is defined as a first horizontal line, when a horizontal line that intersects the first upper edge is defined as a second horizontal line, when a horizontal line that intersects the first intermediate edge is defined as a third horizontal line, and when a horizontal line that intersects a bottom of the trench is defined as a fourth horizontal line, and wherein a first vertical distance between the first horizontal line and the third horizontal line is smaller than a second vertical distance between the third horizontal line and the fourth horizontal line when taken along the first vertical line.

In another embodiment, a third horizontal distance between the first upper edge and the first vertical line is greater than the first horizontal distance when taken along the second horizontal line.

In another embodiment, the third horizontal distance is one to 1.5 times the first vertical distance.

In another embodiment, an angle of intersection between the first upper side surface of the first active region and the second horizontal line ranges from 30 to 40 degrees.

In another embodiment, an angle of intersection between the first lower side surface of the first active region and the fourth horizontal line ranges from 50 to 60 degrees.

In another embodiment, each of the first and second strain-inducing patterns includes a first semiconductor layer, a second semiconductor layer on the first semiconductor layer, and a third semiconductor layer on the second semiconductor layer and that has an protrudes at a level that is greater than those of the first and second active regions.

In another embodiment, the first semiconductor layer is in direct contact with the first and second active regions.

In another embodiment, the first and second active regions include single crystalline silicon; the first and second semiconductor layers include a SiGe layer; and the second semiconductor layer has a higher Ge content than the first semiconductor layer.

In another embodiment, the third semiconductor layer comprises a SiGe layer having a lower Ge content than the second semiconductor layer.

In another embodiment, the third semiconductor layer comprises an Si layer.

In another embodiment, the first and second active regions include n-type impurities; the first semiconductor layer includes p-type impurities; and the second semiconductor layer includes p-type impurities having a higher concentration than the first semiconductor layer.

In another aspect, a semiconductor device comprises: an active region defined on a substrate; a gate electrode on the active region; a lightly doped drain (LDD) in the active region adjacent to the gate electrode; a trench in the active region adjacent to the gate electrode and disposed at an outer side of the LDD; and a strain-inducing pattern in the trench, wherein the active region includes: an upper surface; a first side surface facing the strain-inducing pattern below the upper surface; a second side surface facing the strain-inducing pattern below the first side surface; a first edge disposed between the upper surface and the first side surface; and a second edge between the first side surface and the second side surface, wherein the second edge is nearer than the first edge with respect to a vertical line that is perpendicular to the substrate and intersects a side surface of the gate electrode, and wherein the second edge is formed on a surface of the LDD.

In one embodiment, the strain-inducing pattern includes a first semiconductor layer, a second semiconductor layer on the first semiconductor layer, and a third semiconductor layer on the second semiconductor layer and that protrudes at a higher level than the first edge; the active region includes n-type impurities; the LDD includes p-type impurities; the first semiconductor layer includes p-type impurities having a higher concentration than the LDD; and the second semiconductor layer includes p-type impurities having a higher concentration than the first semiconductor layer.

In another embodiment, the semiconductor device further comprises: a first spacer on the side surface of the gate electrode; and a second spacer on the first spacer, wherein the first spacer is in direct contact with the LDD.

In another embodiment, the second spacer is in direct contact with the LDD and the strain-inducing pattern.

In another embodiment, the strain-inducing pattern includes: a first surface connected to the first edge and having a different slope from the first side surface of the active region; a second surface connected to the first surface and having a different slope from the first surface; and a third surface connected to the second surface and formed at an upper end of the strain-inducing pattern, and the second spacer is in direct contact with the LDD, the first edge, the first surface, the second surface, and the third surface.

In another embodiment, an angle of intersection between a horizontal line passing the first edge and the first surface of the strain-inducing pattern is smaller than that between the horizontal line and the first side surface of the active region.

In another embodiment, the semiconductor device, further comprises a halo formed within the active region and having different conductive impurities from the LDD, wherein the halo covers a side surface and a lower end of the LDD, and the first side surface is formed on a surface of the LDD, and the second side surface is formed on surfaces of the LDD and the halo.

In another aspect, a semiconductor device comprises: a substrate having a first region and a having second region having a higher pattern density than the first region; a first active region defined in the first region; a first gate electrode covering an upper portion and a side surface of the first active region; a first trench in the first active region and offset-aligned to the first gate electrode; a first strain-inducing pattern the first trench; a second active region defined in the second region; a second gate electrode covering an upper portion and a side surface of the second active region; a second trench in the second active region and offset-aligned to the second gate electrode; and a second strain-inducing pattern in the second trench, wherein the first active region has a first $\Sigma$-shaped configuration bordered in part the first trench, and the second active region has a second $\Sigma$-shape configuration bordered in part by the second trench, and wherein a vertical line that is perpendicular to the substrate and intersects the side surface of the first gate electrode is defined as a first vertical line, wherein a vertical line that is perpendicular to the substrate and intersects the side surface of the second gate electrode is defined as a second vertical line, wherein a shortest distance between the first vertical line and the first trench is defined as a first horizontal distance, wherein a shortest distance between the second vertical line and the second trench is defined as a second horizontal distance, and wherein a difference between the first horizontal distance and the second horizontal distance is equal to or less than 1 nm.

In another aspect, an electronic device comprises: a mother board; a semiconductor substrate mounted on the mother board; an active region defined on the semiconductor substrate; a gate electrode disposed on the active region; a lightly doped drain (LDD) formed within the active region adjacent to the gate electrode; a trench formed within the active region adjacent to the gate electrode and disposed at an outer side of the LDD; and a strain-inducing pattern in the trench, wherein the active region includes: an upper surface; a first side surface facing the strain-inducing pattern below the upper surface; a second side surface facing the strain-inducing pattern below the first side surface; a first edge between the upper surface and the first side surface; and a second edge between the first side surface and the second side surface, wherein the second edge is nearer than the first edge with respect to a vertical line that is perpendicular to the substrate and passes a side surface of the gate electrode, and wherein the second edge is formed on a surface of the LDD.

In another aspect, a method of forming a semiconductor device comprises: preparing a substrate having an active region; forming a gate electrode on the active region; forming a lightly doped drain (LDD) in the active region adjacent to the gate electrode; forming a trench, which passes through the LDD, in the active region adjacent to the gate electrode; and forming a strain-inducing pattern within the trench, wherein the active region includes an upper surface, a first side surface facing the strain-inducing pattern below the upper surface, a second side surface facing the strain-inducing pattern below the first side surface, a first edge between the upper surface and the first side surface, and a second edge between the first side surface and the second side surface, wherein the second edge is nearer than the first edge with respect to a vertical line that is perpendicular to the substrate and passes a side surface of the gate electrode, and wherein the second edge is formed on a surface of the LDD.

In one embodiment, the forming of the trench includes: forming a sacrificial spacer on the side surface of the gate electrode; anisotropically etching the active region exposed to an outer side of the sacrificial spacer to form a first trench; isotropically etching the active region exposed to an interior of the first trench to form a second trench; and directionally etching the active region exposed to an interior of the second trench to form a third trench.

In another embodiment, the first trench includes a U-shape, and wherein an angle of intersection between a horizontal line passing a bottom of the first trench and a sidewall of the first trench ranges from 86 to 89 degrees.

In another embodiment, the second trench includes a round sidewall, and a nearest point of the round sidewall from the vertical line that is perpendicular to the substrate and passes the side surface of the gate electrode is formed on a surface of the LDD.

In another embodiment, a lower surface of the sacrificial spacer is exposed to the second trench.

In another embodiment, the first side surface is formed on a surface of the LDD, and the second surface extends from the surface of the LDD to a lower level than the LDD.

In another embodiment, the forming of the strain-inducing pattern includes: forming a first semiconductor layer in the trench; forming a second semiconductor layer on the first semiconductor layer; and forming a third semiconductor layer on the second semiconductor layer, the first and second semiconductor layers including a different material from that of the active region.

In another embodiment, the first, second, and third semiconductor layers are formed using a selective epitaxial growth (SEG) technique.

In another embodiment, the first and second semiconductor layers include a SiGe layer, and the second semiconductor layer has a higher Ge content than the first semiconductor layer.

In another embodiment, the third semiconductor layer includes a Si layer or a SiGe layer having a lower Ge content than the second semiconductor layer.

In another aspect, a method of forming a semiconductor device comprises: forming a first trench in a substrate; expanding a distance between inner sidewalls of the first trench using an isotropic etch process to form a second trench having curved inner sidewalls and having an inner width; and expanding a distance between inner sidewalls of the second trench using a directional etch process to form a third trench having linear upper and lower inner sidewalls that intersect at an angle relative to each other, and wherein an inner width of the third trench at a point of intersection of the upper and lower inner sidewalls is controlled in response to the inner width of the curved inner sidewalls of the second trench.

In one embodiment, the first trench is formed using an anisotropic etch.

In another embodiment, the inner width of the second trench is controlled in response to parameters of the isotropic etch process.

In another embodiment, the inner width of the third trench at the point of intersection of the upper and lower inner sidewalls is controlled in response to parameters of the directional etch process.

In another embodiment, the method further comprises filling the trench with a strain-inducing material.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 12B, 12C, 13B, 14B, 17B, 18B, and 22B are enlarged views showing certain configuration elements of FIGS. 12A, 13A, 14A, 17A, 18A, and 22A, respectively.

DETAILED DESCRIPTION OF EMBODIMENTS

Figure 1:
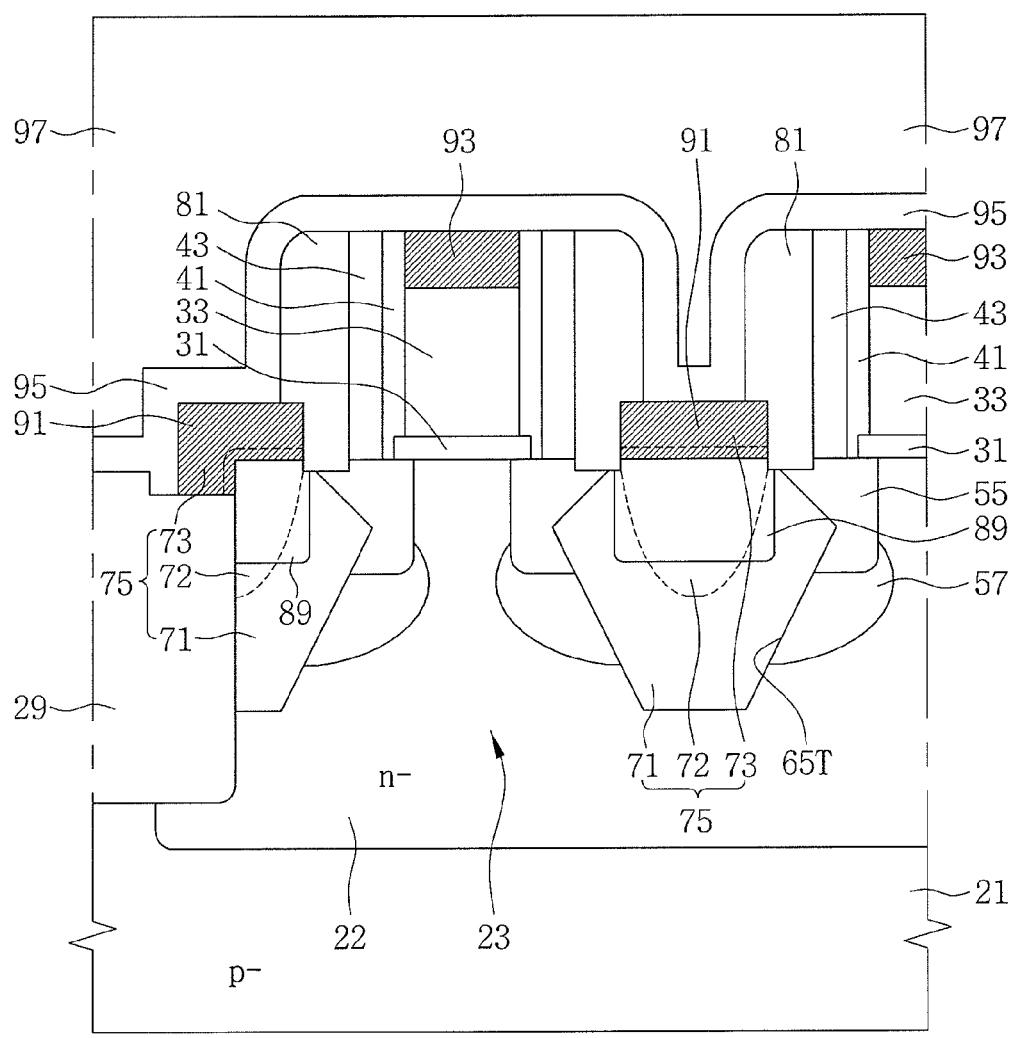
FIG. 1 is a cross-sectional view for describing a semiconductor device in accordance with embodiments of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

FIG. 1 is a cross-sectional view for describing a semiconductor device in accordance with embodiments of the inventive concepts, and FIGS. 2 to 4I are enlarged views showing a portion of FIG. 1 in detail.

Referring to FIG. 1, an n-well 22, a first active region 23, a device isolation layer 29, first gate dielectric layers 31, first gate electrodes 33, first re-oxidation layers 41, first inner spacers 43, first outer spacers 81, first lightly doped drains (LDDs) 55, first halos 57, trenches 65T, a first semiconductor layer 71, a second semiconductor layer 72, a third semiconductor layer 73, P-source/drains 89, first and second metal silicide patterns 91 and 93, an etch-stopping layer 95, and an interlayer insulating layer 97 may be formed on a substrate 21. The first semiconductor layer 71, the second semiconductor layer 72, and the third semiconductor layer 73 may constitute a strain-inducing pattern 75. The strain-inducing pattern 75 may fill the trenches 65T. The trenches 65T may be offset-aligned to the first gate electrodes 33. The first active region 23 may be formed in a Σ-shape by the trenches 65T.

Figure 2:
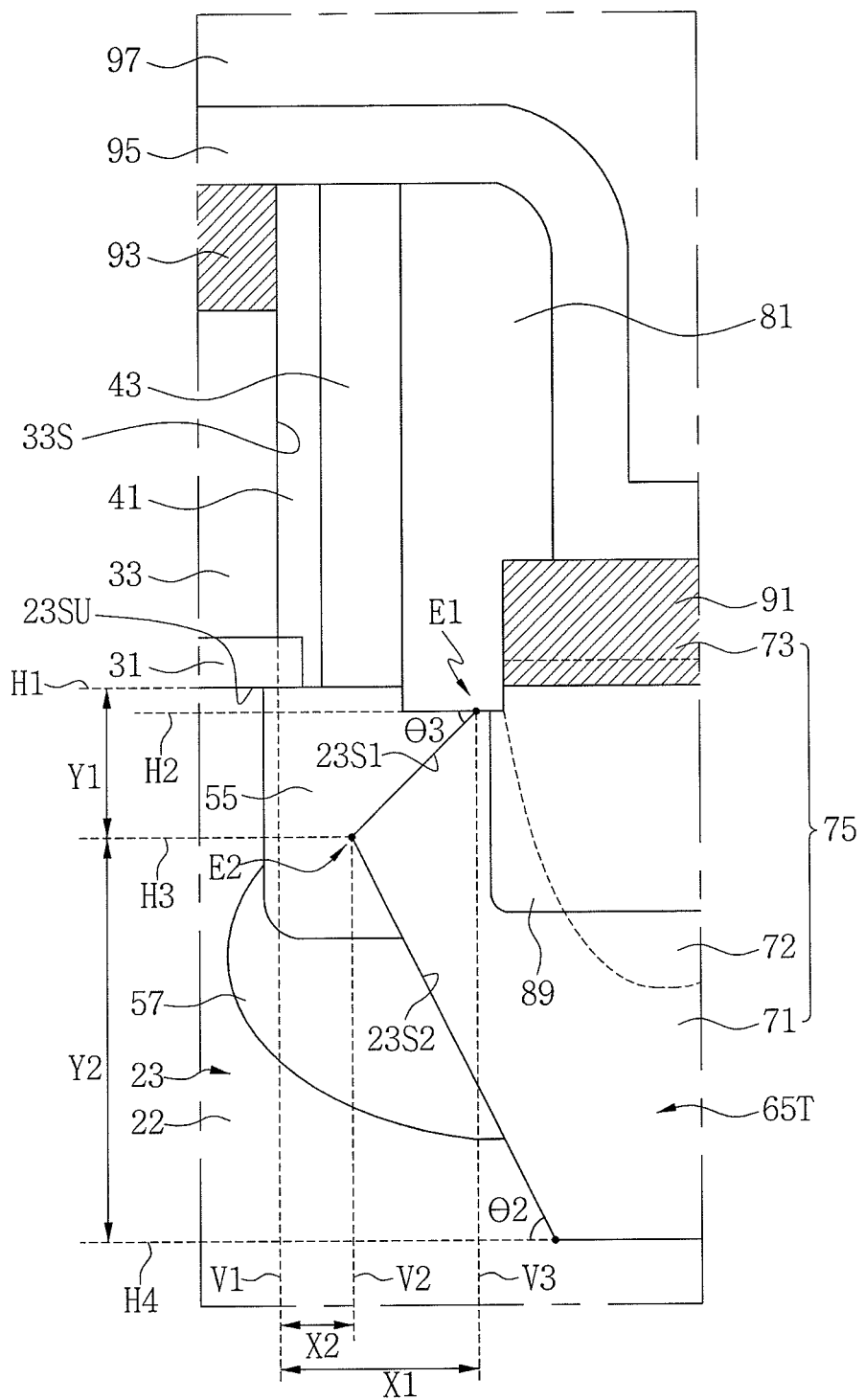
FIGS. 2 to 4I are enlarged views illustrating a portion of part of FIG. 1 in detail.

Referring to FIG. 2, the first active region 23 may include a first side surface 23S1 and second side surface 23S2 formed by the trenches 65T. The first side surface 23S1 may be referred to as an upper side surface, and the second side surface 23S2 may be referred to as a lower side surface. The strain-inducing pattern 75 may be in direct contact with the first side surface 23S1 and the second side surface 23S2. The second side surface 23S2 may be formed below the first side surface 23S1. The first side surface 23S1 may be located at the first LDD 55. The second side surface 23S2 may be located at the first LDD 55, the first halo 57, and the first active region 23. A first edge E1 may be formed between an upper surface 23SU of the first active region 23 and the first side surface 23S1. A second edge E2 may be present between the first side surface 23S1 and the second side surface 23S2 of the first active region 23. The first edge E1 may be referred to as an upper edge, and the second edge E2 may be referred to as an intermediate edge.

The upper surface 23SU of the first active region 23 may extend to an outer side of the first gate electrode 33. The first edge E1 may be located below the first outer spacers 81. The first edge E1 may be located at a surface of the first LDD 55. The second edge E2 may be formed at an outer side of the first gate electrode 33. The second edge E2 may be located at a surface of the first LDD 55.

A vertical line that is perpendicular to the horizontal direction of extension of the substrate 21 and intersects a side surface 33S of the first gate electrode 33 may be defined as a first vertical line V1. A vertical line that is perpendicular to the substrate 21, is parallel to the first vertical line V1, and intersects the second edge E2 may be defined as a second vertical line V2. A vertical line that is perpendicular to the substrate 21, is parallel to the second vertical line V2, and intersects the first edge E1 may be defined as a third vertical line V3.

A horizontal line that is orthogonal to the first vertical line V1 and passes an upper end of the first active region 23 may be defined as a first horizontal line H1. A horizontal line that is parallel to the first horizontal line H1 and intersects the first edge E1 may be defined as a second horizontal line H2. A horizontal line that is parallel to the second horizontal line H2 and intersects the second edge E2 may be defined as a third horizontal line H3. A horizontal line that is parallel to the third horizontal line H3 and intersects a bottom of the trench 65T may be defined as a fourth horizontal line H4.

The second side surface 23S2 may form a second angle of intersection θ2 with respect to the fourth horizontal line H4. The first side surface 23S1 may form a third angle of intersection θ3 with respect to the second horizontal line H2. In some embodiments, the second angle of intersection θ2 may range from 50 to 60 degrees. For example, the second angle of intersection θ2 may be 55 degrees. In some embodiments, the third angle of intersection θ3 may range 30 to 40 degrees. For example, the third angle of intersection θ3 may be 35 degrees.

With regard to the first vertical line V1, the distance between the first horizontal line H1 and the third horizontal line H3 may be defined as a first vertical distance Y1, and the distance between the third horizontal line H3 and the fourth horizontal line H4 may be defined as a second vertical distance Y2. The first vertical distance Y1 may be interpreted as a vertical distance from an upper end of the first active region 23 to the second edge E2, and the second vertical distance Y2 may be interpreted as a vertical distance from the second edge E2 to a lower end of the trench 65T. In some embodiments, the first vertical distance Y1 may be smaller than the second vertical distance Y2.

With regard to the second horizontal line H2, the distance between the first vertical line V1 and the third vertical line V3 may be defined as a first horizontal distance X1. With regard to the third horizontal line H3, the distance between the first vertical line V1 and the second vertical line V2 may be defined as a second horizontal distance X2. The first horizontal distance X1 may be interpreted as an offset distance of the first edge E1 from the first gate electrode 33, and the second horizontal distance X2 may be interpreted as an offset distance of the second edge E2 from the first gate electrode 33. In some embodiments first horizontal distance X1 may be greater than the second horizontal distance X2.

In some embodiments, the second horizontal distance X2 may be 0.001 nm to 5 nm. For example, the second horizontal distance X2 may be about 3 nm. In some embodiments, the first horizontal distance X1 may be one to 1.5 times the first vertical distance Y1.

Surfaces or edges of the upper surface 23SU, the first edge E1, the first side surface 23S1, the second edge E2, the second side surface 23S2, and the fourth horizontal line H4 may be combined or connected to generally form a Σ-shaped structure. By a "Σ-shaped" structure or "Σ-shape", in embodiments of the present inventive concepts, such a description is meant to include structures that generally form such a configuration or structure, and can include curved or irregular surfaces and corners, as well as straight surfaces and sharp corners.

Figure 3A:
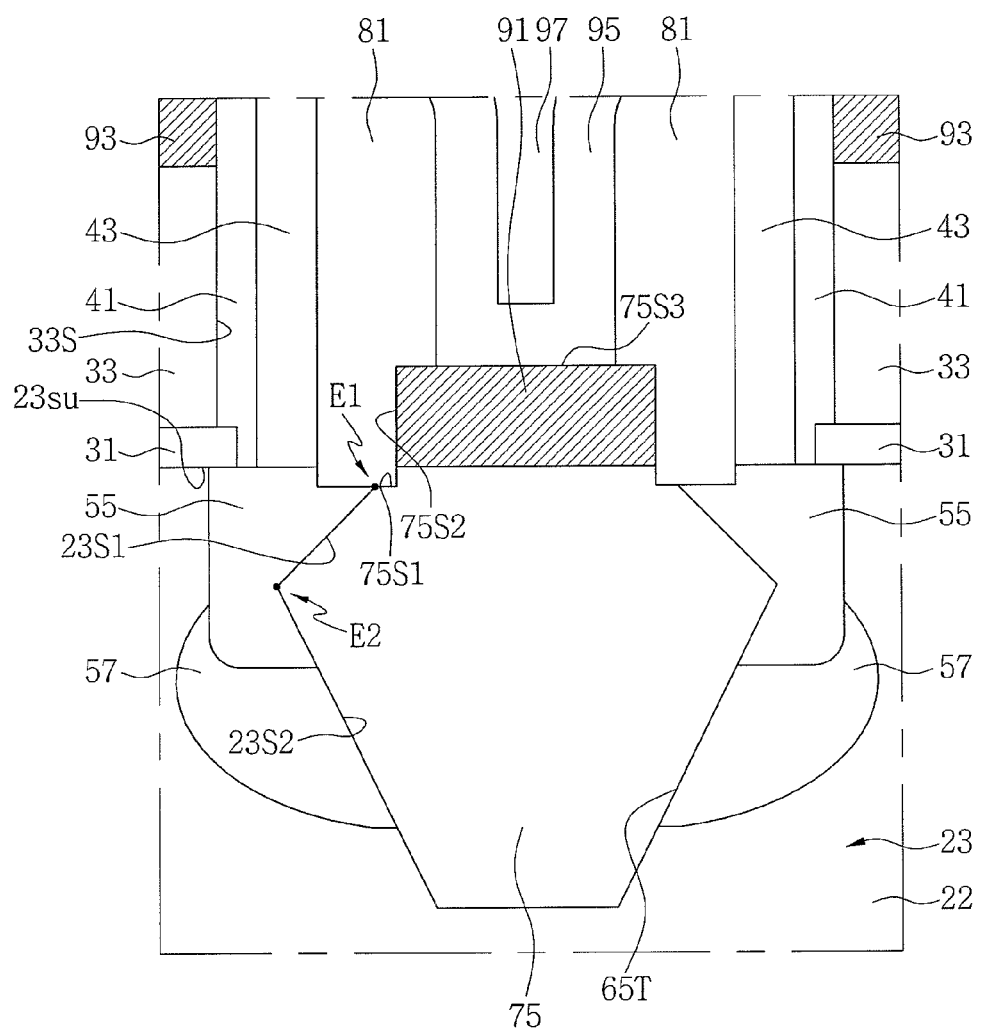

Referring to FIG. 3A, the strain-inducing pattern 75 may pass through the first LDD regions 55 and the first halo regions 57 to extend into the first active region 23. The strain-inducing pattern 75 may include a first surface 75S1, a second surface 75S2, and a third surface 75S3. The first surface 75S1 may be in contact with the first edge E1, and have a different slope relative to horizontal with respect to the first side surface 23S1 of the first active region 23. The first surface 75S1 may have a similar slope to the upper surface 23SU of the first active region 23 adjacent to the first edge E1, for example, in some embodiments, they can be parallel to each other.

The third surface 75S3 may be positioned on an upper end of the strain-inducing pattern 75. The second surface 75S2 may be positioned between the first surface 75S1 and the third surface 75S3, and in direct contact with the first surface 75S1 and the third surface 75S3. The second surface 75S2 may have a different slope relative to the first surface 75S1 and the third surface 75S3. The first outer spacer 81 may be in direct contact with the first LDD 55, the first edge E1, the first surface 75S1, the second surface 75S2, and the third surface 75S3.

Figure 3B:
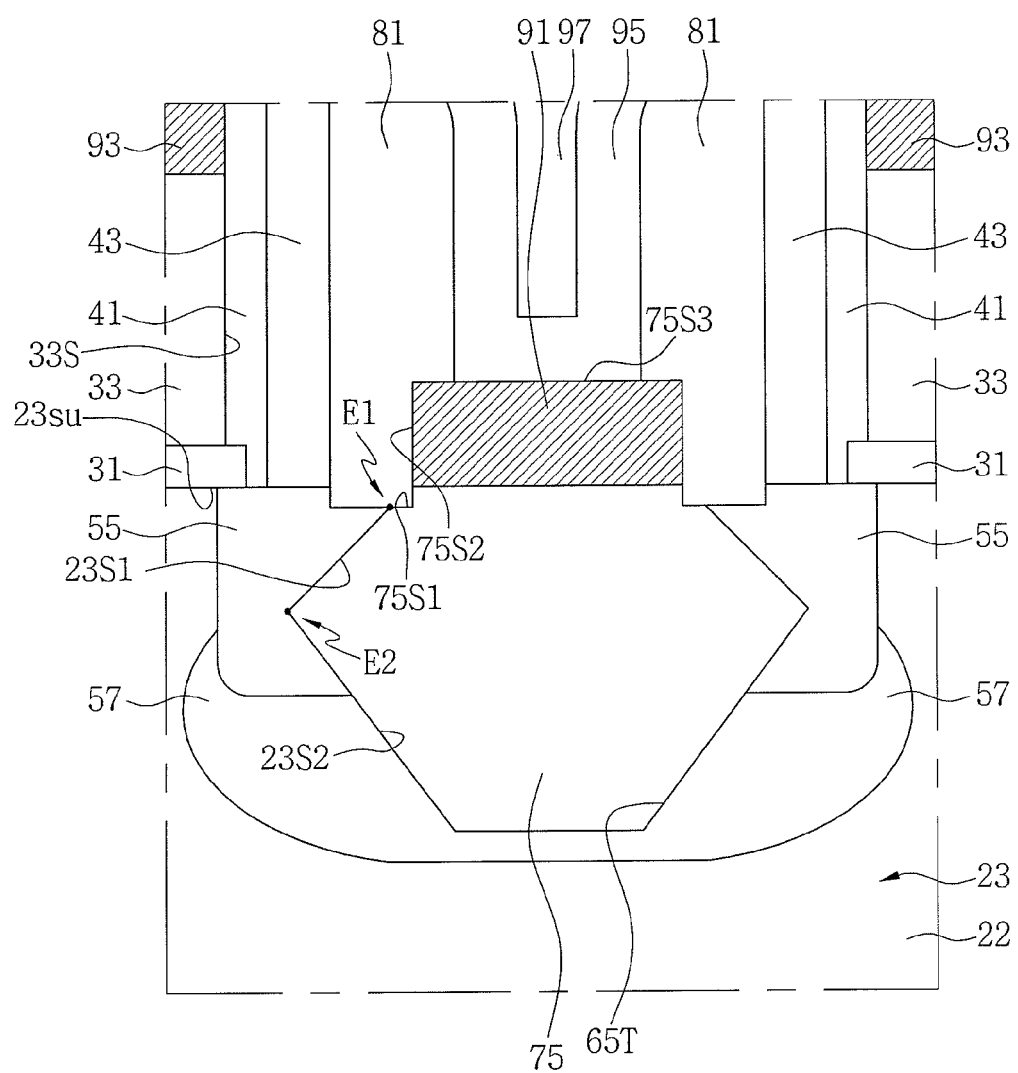

Referring to FIG. 3B, a lower end of the strain-inducing pattern 75 may be formed at a higher level than bottoms of the first halos 57.

Figure 4A:
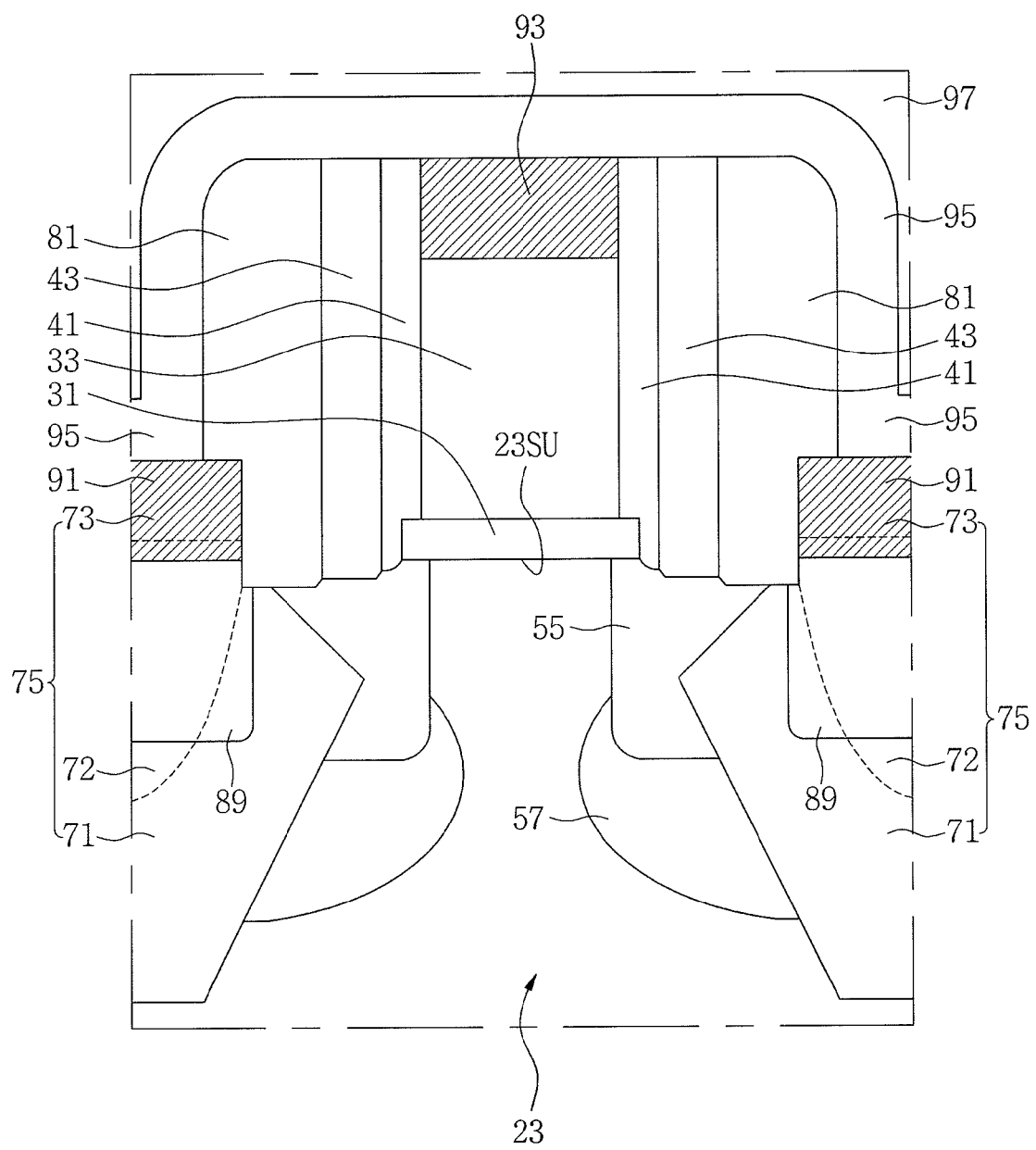

Referring to FIG. 4A, the upper surface 23SU of the first active region 23 may include a variety of step geometries. For example, in some embodiments, the boundary between the first active region 23 and the first re-oxidation layer 41 may be formed at a lower level than the boundary between the first active region 23 and the first gate dielectric layer 31. In some embodiments, the boundary between the first LDD 55 and the first inner spacer 43 may be formed at a lower level than the boundary between the first active region 23 and the first re-oxidation layer 41. In some embodiments, the boundary between the first LDD 55 and the first outer spacer 81 may be formed at a lower level than the boundary between the first LDD 55 and the first inner spacer 43.

Figure 4B:
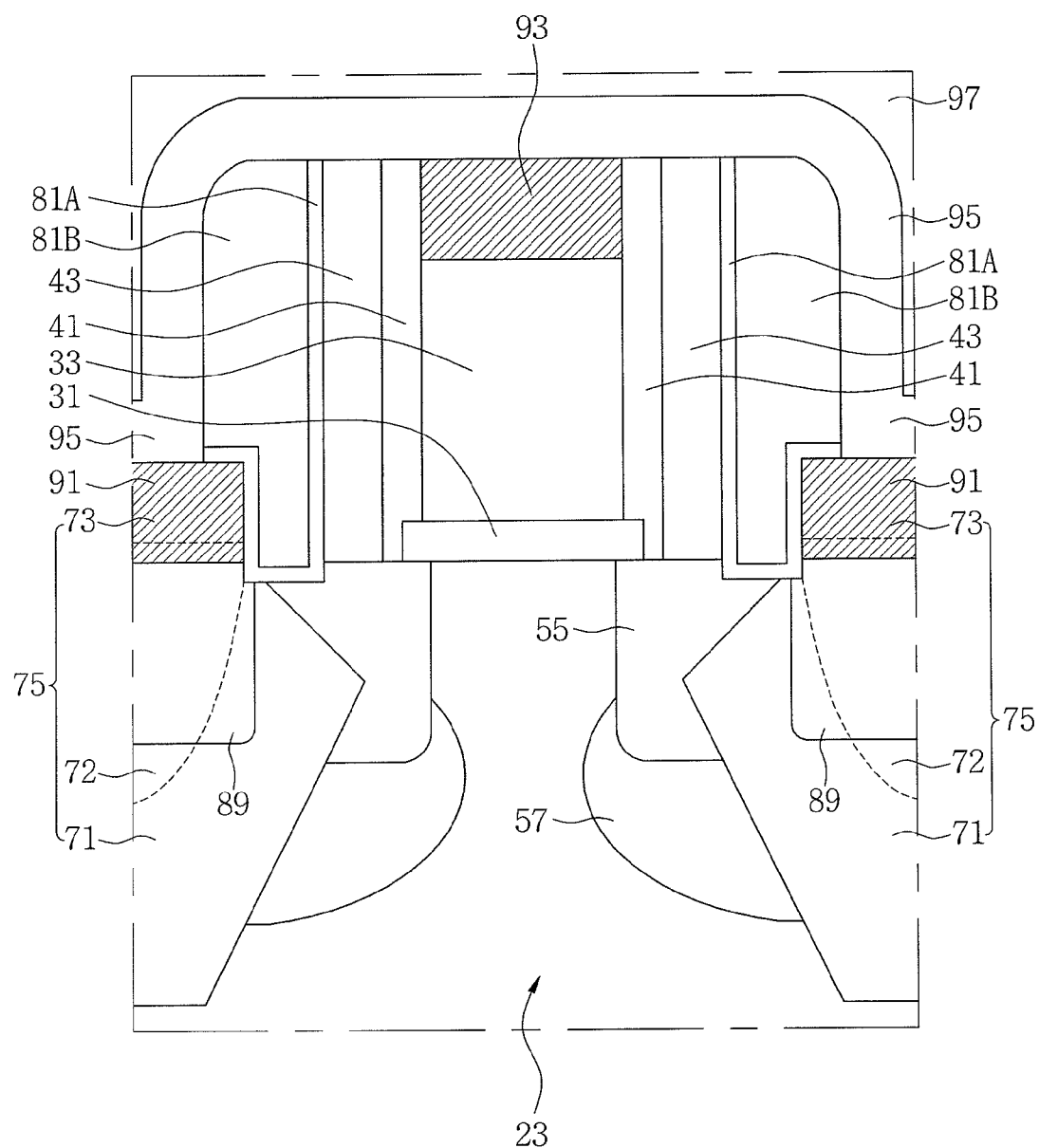

Referring to FIG. 4B, in some embodiments, the first outer spacers 81 may include a first material layer 81A and a second material layer 81B disposed on the first material layer 81A.

Figure 4C:
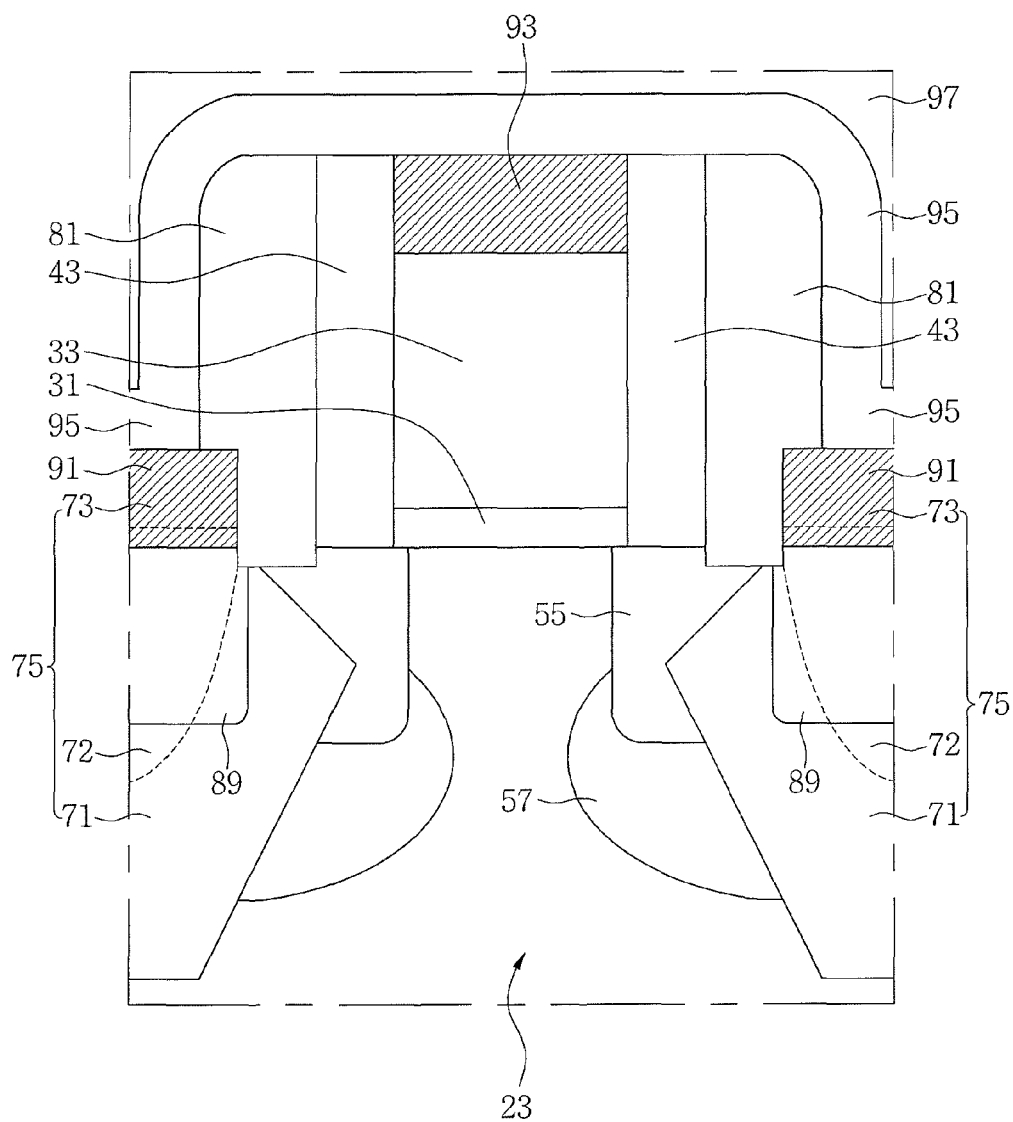

Referring to FIG. 4C, in some embodiments, the first re-oxidation layers 41 may be omitted. The first inner spacers 43 may be in contact with the first gate electrodes 33.

Figure 4D:
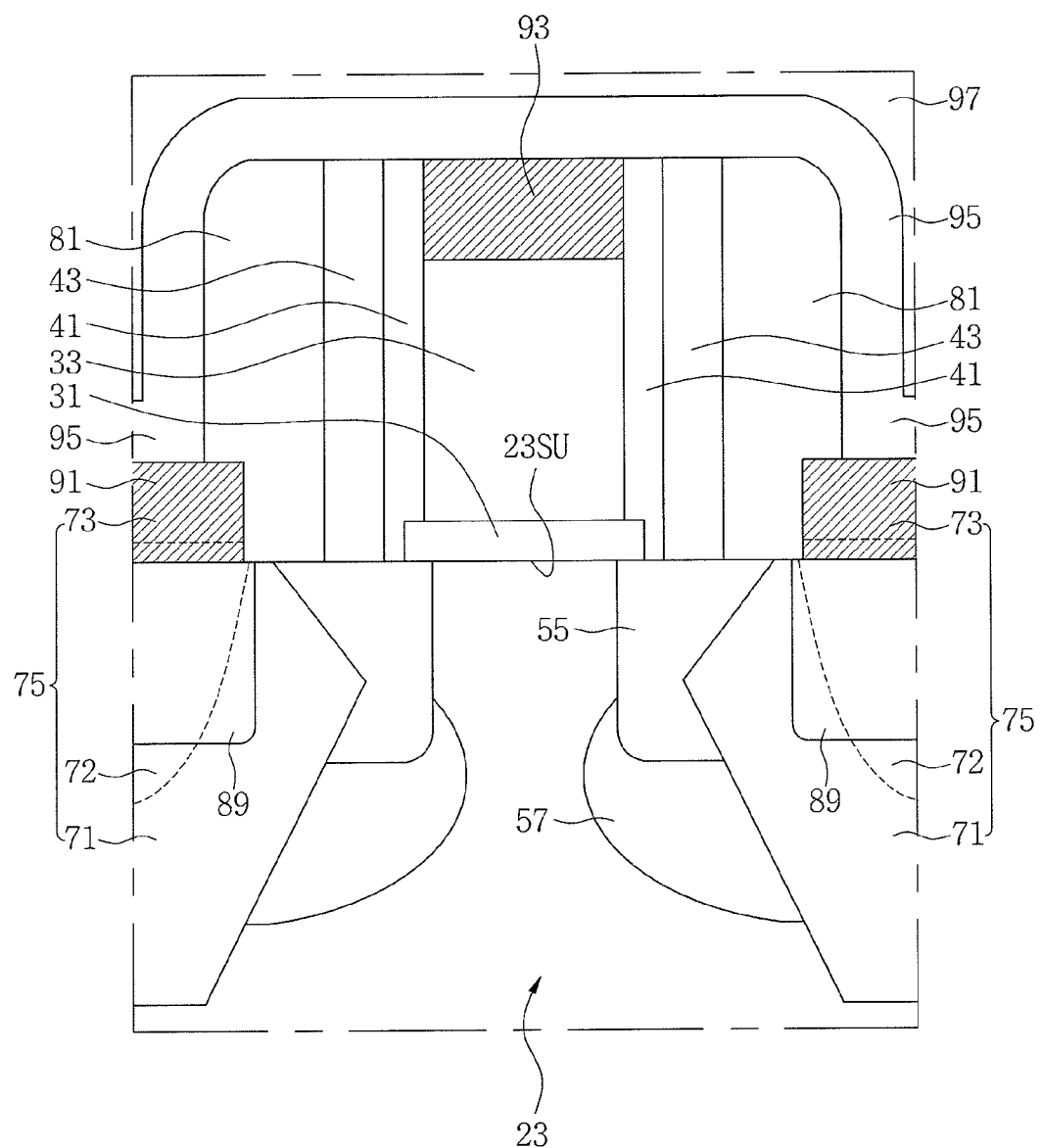

Referring to FIG. 4D, in some embodiments, the upper surface 23SU of the first active region 23 may be horizontal.

Figure 4E:
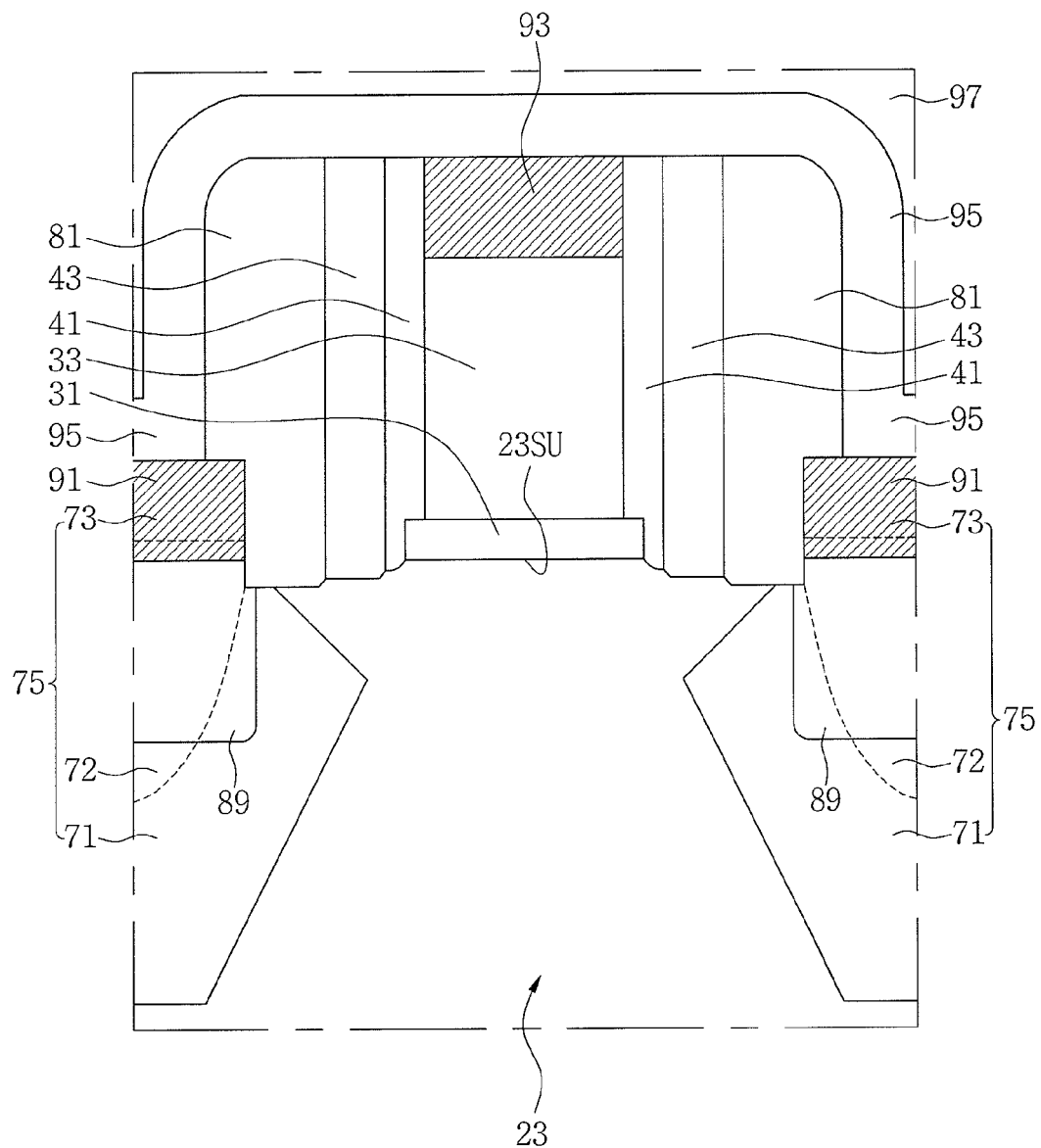

Referring to FIG. 4E, in some embodiments, the first LDD 55 and the first halo 57 may be omitted.

Figure 4F:
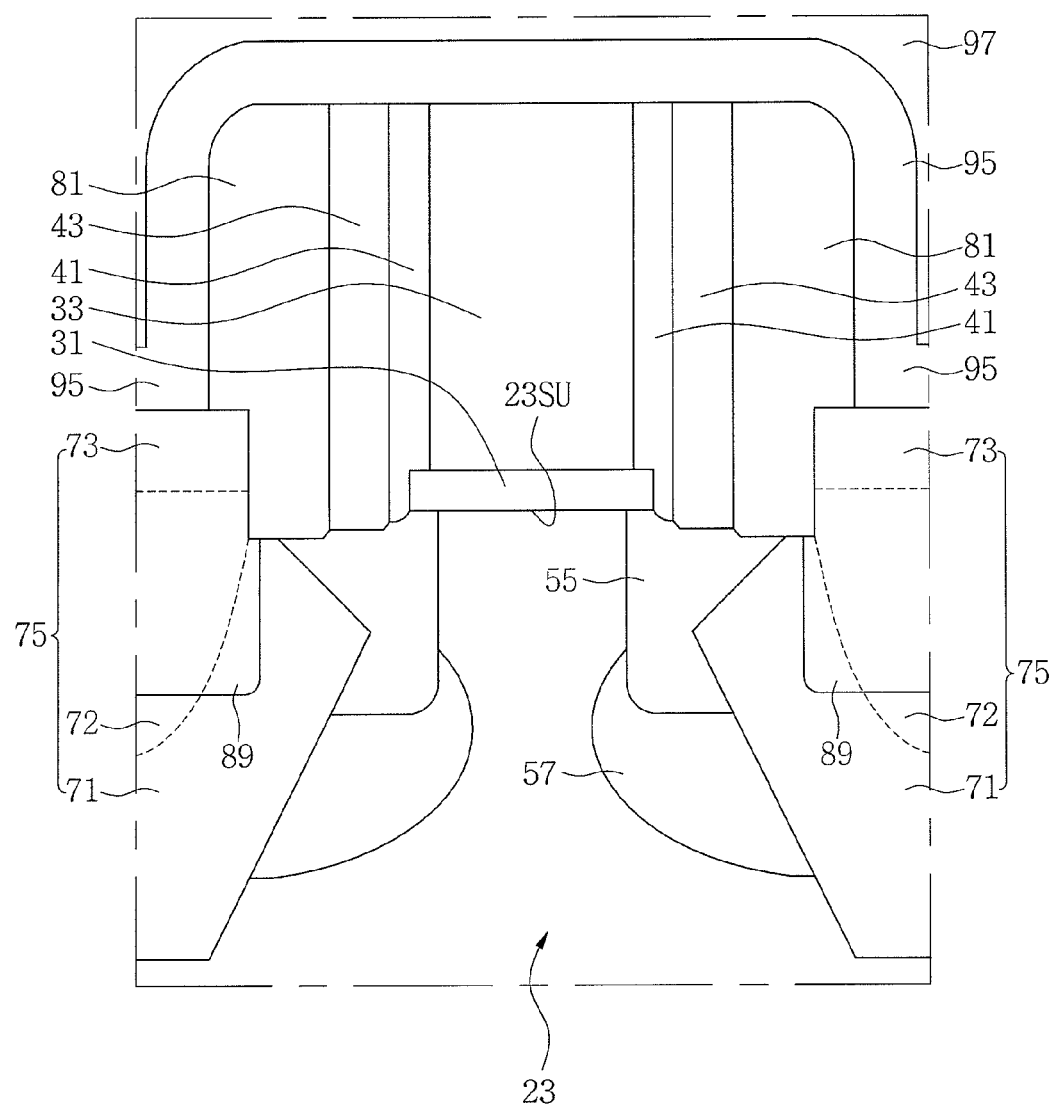

Referring to FIG. 4F, in some embodiments, the first and second metal silicide patterns 91 and 93 may be omitted. In such an embodiment, the first gate electrode 33 may comprise a conductive layer such as a polysilicon layer.

Figure 4G:
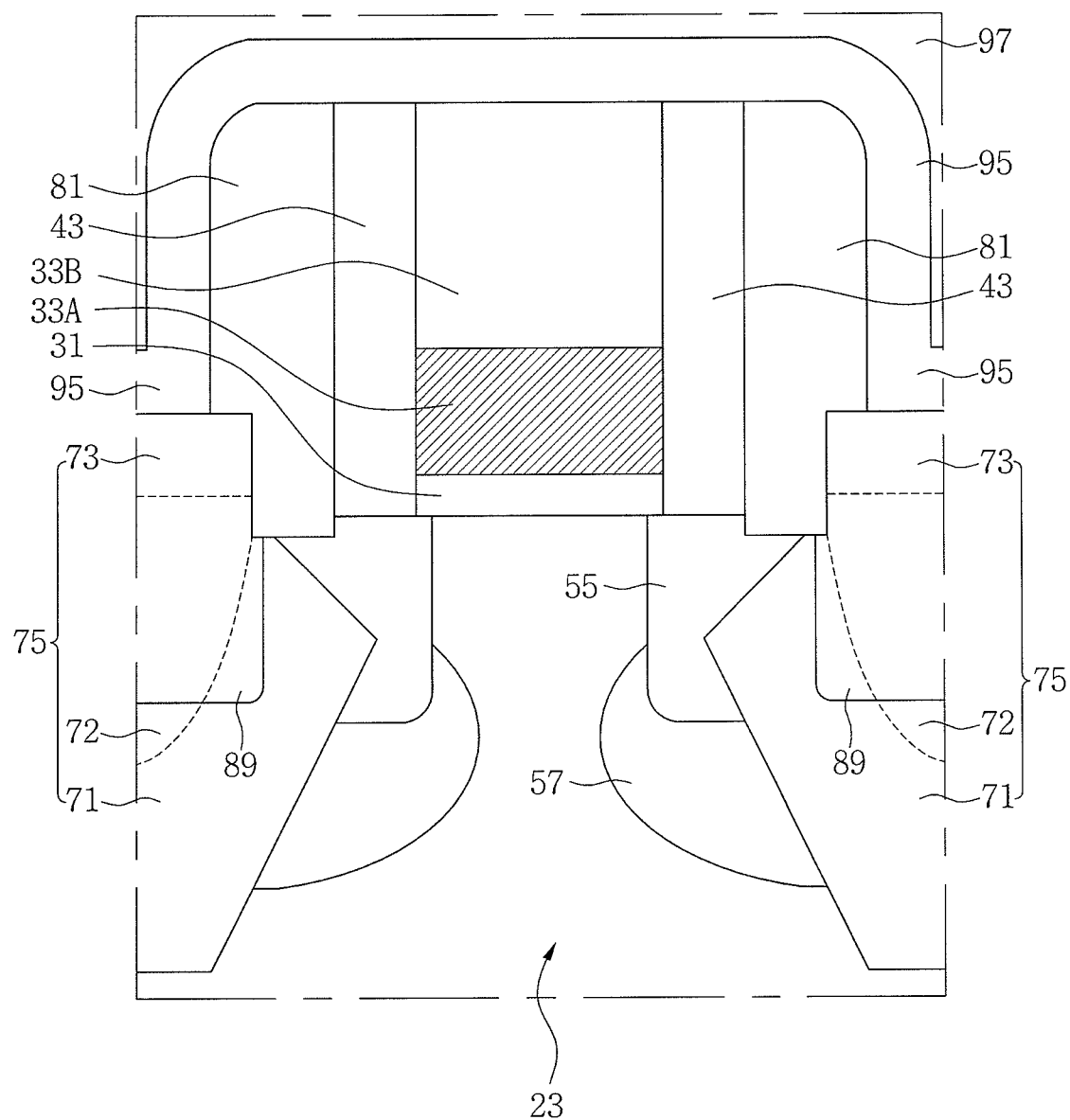

Referring to FIG. 4G, in some embodiments, a first lower gate electrode 33A and a first upper gate electrode 33B may be sequentially formed on the first gate dielectric layer 31. The first re-oxidation layers 41 may be omitted. The first inner spacers 43 may be in contact with the first lower gate electrode 33A and the first upper gate electrode 33B. For example, the first lower gate electrode 33A may be a metal layer, and the first upper gate electrode 33B may be a polysilicon layer.

Figure 4H:
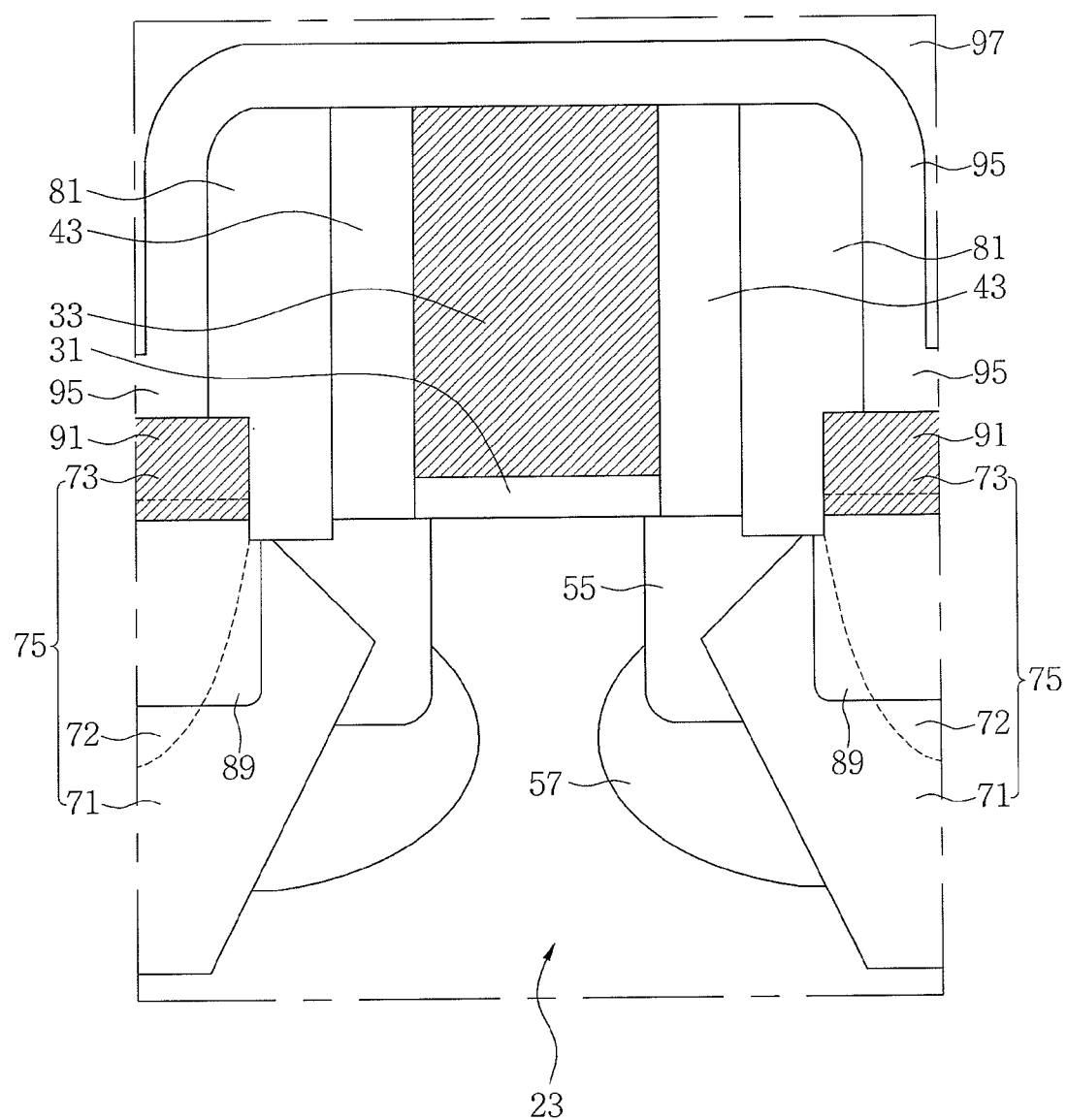

Referring to FIG. 4H, in some embodiments, the first gate electrode 33 may be formed on the first gate dielectric layer 31. For example, the first gate electrode 33 may comprise a metal layer.

Figure 4I:
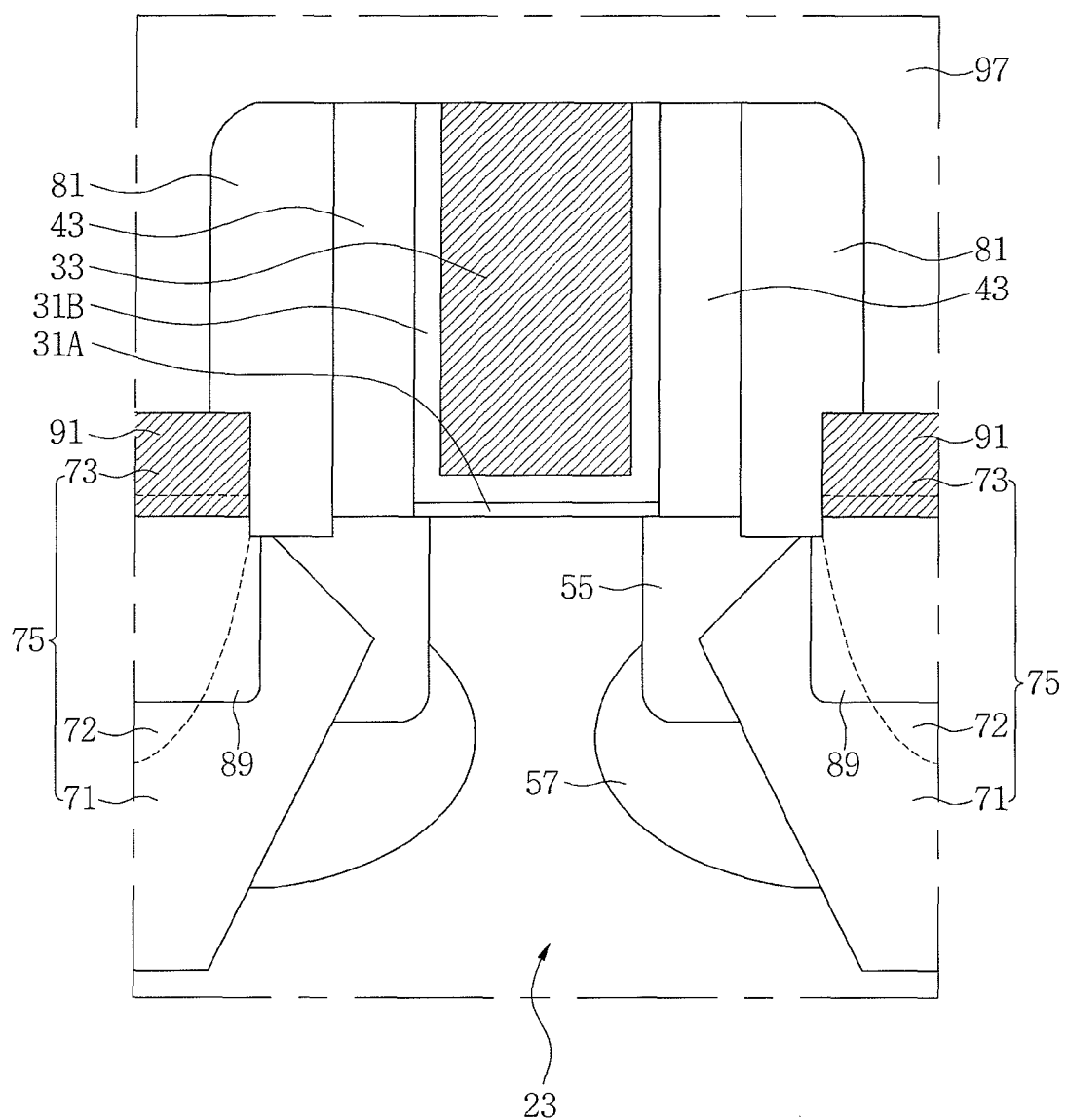

Referring to FIG. 4I, in some embodiments, a first lower gate dielectric layer 31A, a first upper gate dielectric layer 31B, and the first gate electrode 33 may be formed on the first active region 23. The first lower gate dielectric layer 31A may be in direct contact with the first active region 23. The first lower gate dielectric layer 31A may be referred to as an interface layer. For example, the first lower gate dielectric layer 31A may include silicon oxide formed by a wet cleaning process. The first upper gate dielectric layer 31B may surround a side surface and bottom of the first gate electrode 33. For example, the first upper gate dielectric layer 31B may include a high-K material. The first gate electrode 33 may be a metal layer.

Figure 5A:
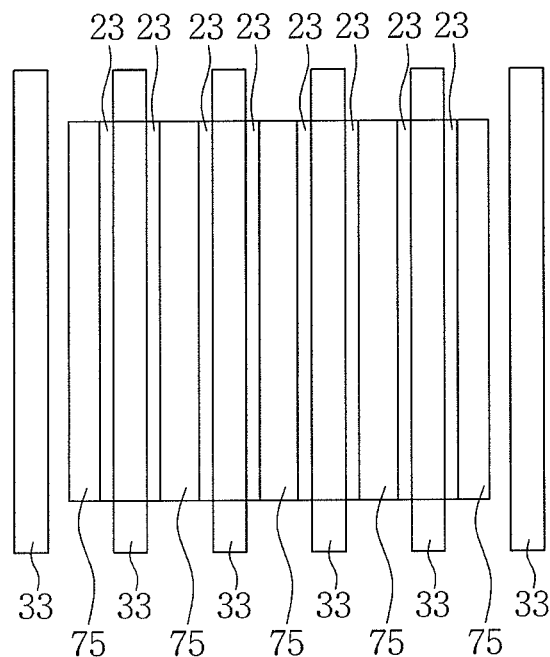
FIG. 5A is a layout diagram for describing a semiconductor device in accordance with embodiments of the inventive concepts.
Figure 5B:
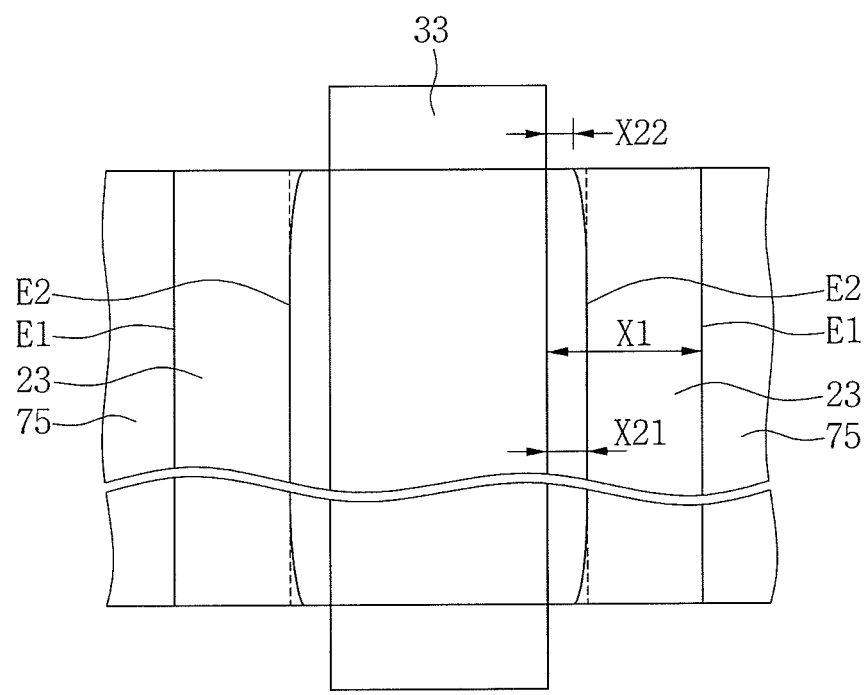
FIG. 5B is an enlarged view illustrating certain components of FIG. 5A in detail.

FIG. 5A is a layout for illustrating a semiconductor device in accordance with embodiments of the inventive concepts. FIG. 5B is an enlarged view showing certain components of FIG. 5A in detail, and FIGS. 5C and 5D are enlarged views showing certain components of FIG. 5B in detail.

Referring to FIG. 5A, a plurality of first gate electrodes 33 crossing a first active region 23 may be formed. A strain-inducing pattern 75 may be formed within the first active region 23 between the first gate electrodes 33.

Figure 5C:
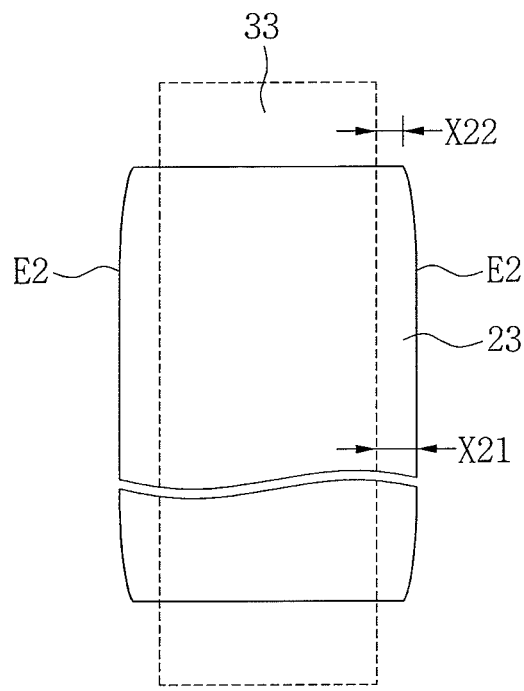
FIGS. 5C and 5D are enlarged views showing certain components of FIG. 5B in detail.
Figure 5D:
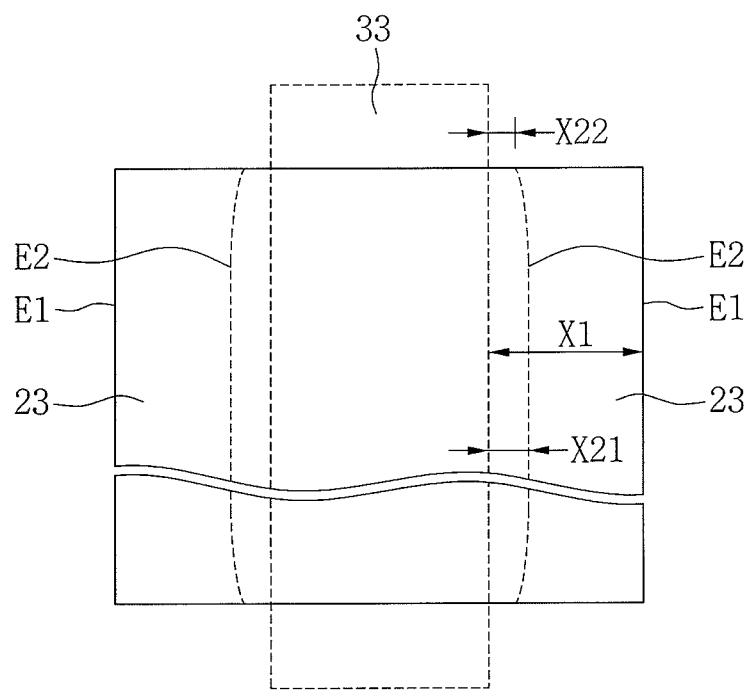

Referring to FIGS. 5B to 5D, the first active region 23 may include a first edge E1 and a second edge E2. The distance between the first edge E1 and the first gate electrode 33 may be defined as a first horizontal distance X1. The second edge E2 may demonstrate a tendency to become closer in proximity to the first gate electrode 33 with the approach from a center to an edge of the first active region 23. In other embodiments, the second edge E2 may demonstrate a tendency to become distant from the first gate electrode 33 with the approach from the center to the edge of the first active region 23.

The distance between the second edge E2 and the first gate electrode 33 in the vicinity of the center of the first active region 23 may be defined as a second horizontal distance X21, and the distance between the second edge E2 and the first gate electrode 33 in the vicinity of the edge of the first active region 23 may be defined as a third horizontal distance X22. According to the embodiments of the inventive concepts, the difference between the second horizontal distance X21 and the third horizontal distance X22 may be significantly improved, as compared to that achievable in the related art. In various embodiments of the present inventive concepts, the difference between the second horizontal distance X21 and the third horizontal distance X22 may be equal to or less than 1 nm.

Figure 6:
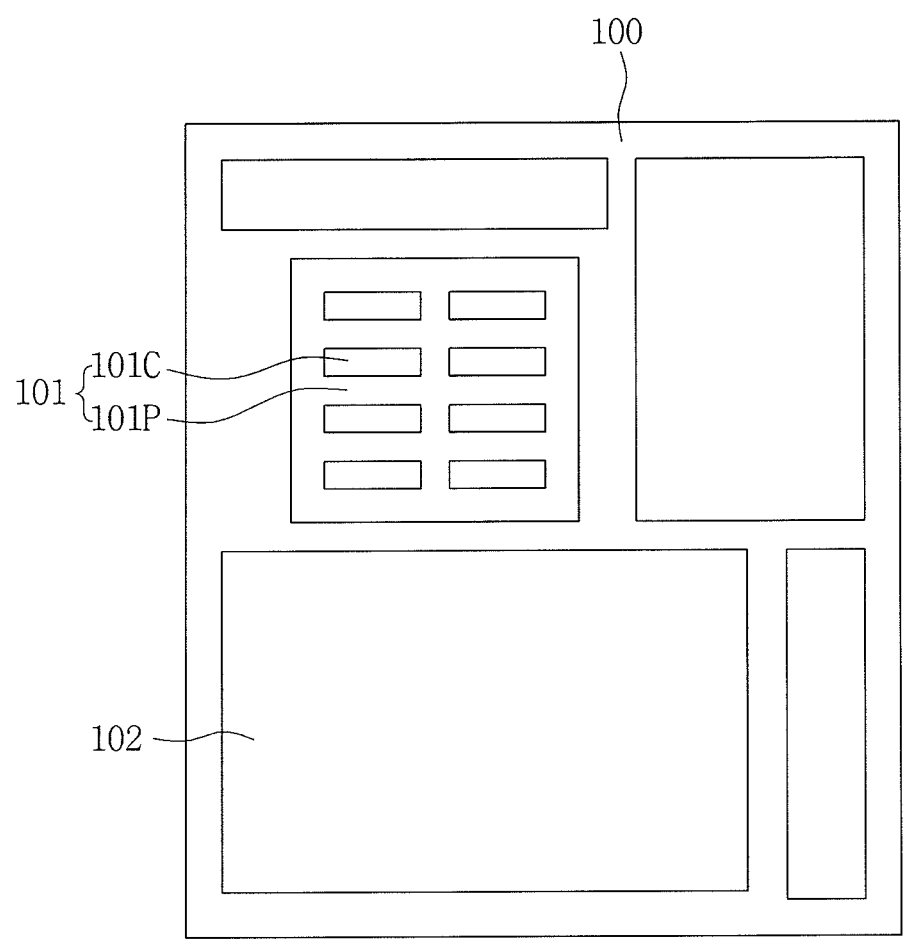
FIG. 6 is a layout diagram for describing a semiconductor device in accordance with embodiments of the inventive concepts.
Figure 7:
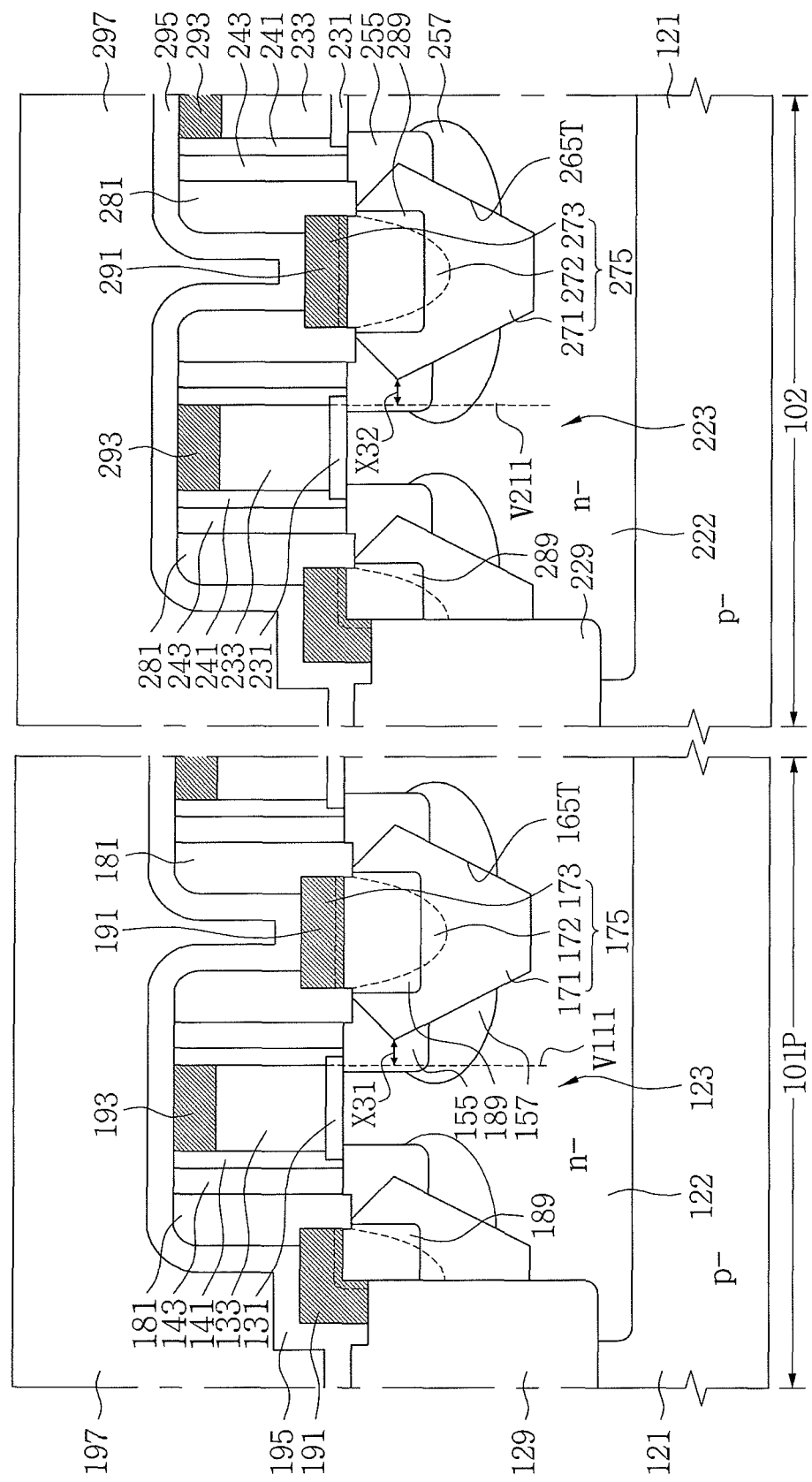
FIG. 7 is a cross-sectional view.

FIG. 6 is a layout for describing a semiconductor device in accordance with embodiments of the inventive concepts, and FIG. 7 is a cross-sectional view.

Referring to FIG. 6, the semiconductor chip 100 may include a first region 101P and a second region 102. A plurality of PMOS transistors may be formed in the first region 101P and the second region 102. The second region 102 may have a higher pattern density than the first region 101P. For example, the first region 101P may have an active open density of 5% or less, and the second region 102 may have an active open density of 5% to 15%.

The semiconductor chip 100 may be a microprocessor. The semiconductor chip 100 may include a memory area 101. The memory area 101 may include the first region 101P and a cell array 101C. The cell array 101C may include memory cells such as an SRAM. The first region 101P may be positioned at the periphery of the cell array 101C, and referred to as an SRAM-peri. The second region 102 may be positioned adjacent to the memory area 101. The second region 102 may be referred to as a logic area.

Referring to FIGS. 6 and 7, in some embodiments, the first region 101P may include a first n-well 122 and first device isolation layer 129 formed on the substrate 121. A first active region 123 may be defined within the first n-well 122 by the first device isolation layer 129. First gate dielectric layers 131, first gate electrodes 133, first re-oxidation layers 141, first inner spacers 143, and first outer spacers 181 may be formed on the first active region 123. First LDDs 155 and first halos 157 may be formed within the first active region 123. First trenches 165T offset-aligned to the first gate electrodes 133 may be formed on the first active region 123. The first active region 123 may be formed in a first Σ-shaped configuration by the first trenches 165T. A first lower semiconductor layer 171, a first intermediate semiconductor layer 172, a first upper semiconductor layer 173, first P-source/drains 189, and first metal silicide patterns 191 and 193 may be formed in the first trenches 165T. The first lower semiconductor layer 171, the first intermediate semiconductor layer 172, and the first upper semiconductor layer 173 may constitute a first strain-inducing pattern 175. A first etch-stopping layer 195 and a first interlayer insulating layer 197 may be formed on the substrate 121.

The second region 102 may include a second n-well 222 and a second device isolation layer 229 formed on the substrate 121. A second active region 223 may be defined within the second n-well 222 by the second device isolation layer 229. Second gate dielectric layers 231, second gate electrodes 233, second re-oxidation layers 241, second inner spacers 243, and second outer spacers 281 may be formed on the second active region 223. Second LDDs 255 and second halos 257 may be formed in the second active region 223. Second trenches 265T offset-aligned to the second gate electrodes 233 may be formed in the second active region 223. The second active region 223 may be formed in a second Σ-shaped configuration by the second trenches 265T. A second lower semiconductor layer 271, a second intermediate semiconductor layer 272, a second upper semiconductor layer 273, second P-source/drains 289, and second metal silicide patterns 291 and 293 may be formed in the second trenches 265T. The second lower semiconductor layer 271, the second intermediate semiconductor layer 272, and the second upper semiconductor layer 273 may constitute a second strain-inducing pattern 275. A second etch-stopping layer 295 and a second interlayer insulating layer 297 may be formed on the substrate 121.

A vertical line that is perpendicular to the substrate 121 and passes a side surface of the first gate electrode 133 may be defined as a first vertical line V111, and a vertical line that is perpendicular to the substrate 121 and passes a side surface of the second gate electrode 233 may be defined as a second vertical line V211. The shortest distance between the first vertical line V111 and the first trench 165T may be defined as a first horizontal distance X31. The shortest distance between the second vertical line V211 and the second trench 265T may be defined as a second horizontal distance X32. In some embodiments, the difference between the first horizontal distance X31 and the second horizontal distance X32 may be 1 nm or less. According to the embodiments of the inventive concepts, a difference between the first horizontal distance X31 and the second horizontal distance X32 may be significantly decreased as compared to the related art. In other words, the pattern loading effect may be minimized.

Figure 8A:
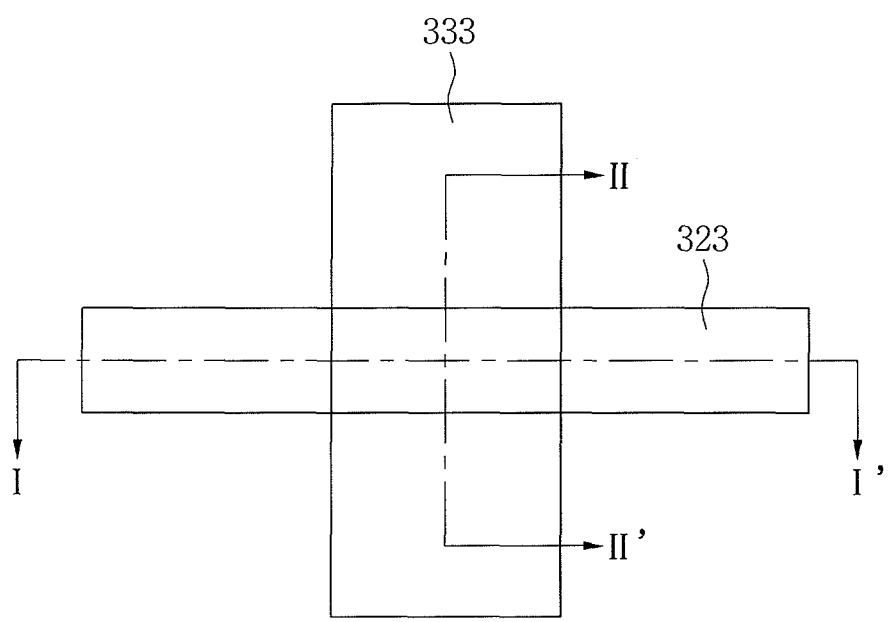
FIG. 8A is a layout diagram for describing a semiconductor device in accordance with embodiments of the inventive concepts.
Figure 8B:
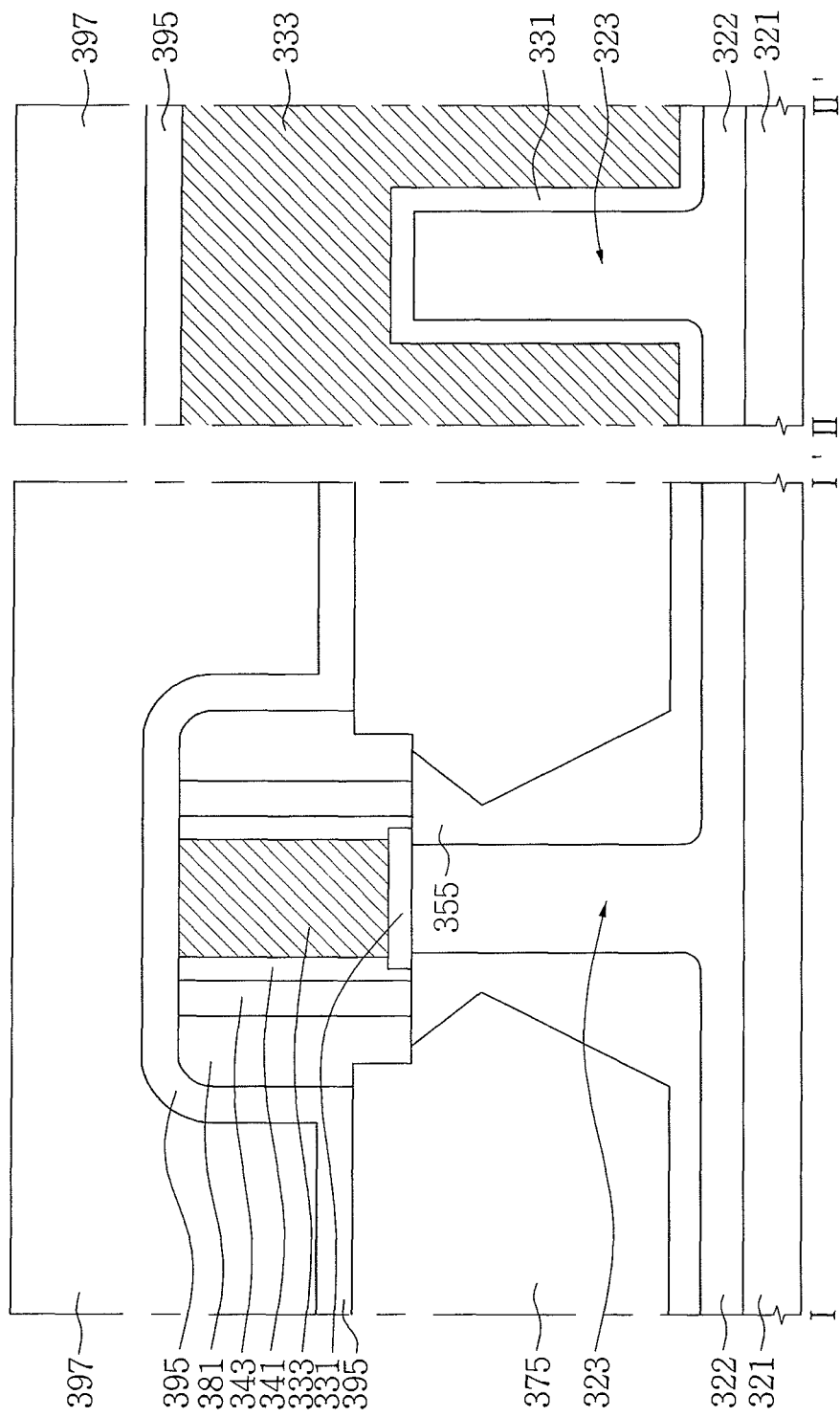
FIG. 8B is a cross-sectional view.

FIG. 8A is a layout diagram for describing a semiconductor device in accordance with embodiments of the inventive concepts, and FIG. 8B is a cross-sectional view taken along lines I-I' and II-II' of FIG. 8A.

Referring to FIGS. 8A and 8B, a gate electrode 333 crossing an active region 323 may be provided on a substrate 321. The active region 323 may have a fin shape or a wire shape. The gate electrode 333 may cover upper and side surfaces of the active region 323. Trenches offset-aligned to the gate electrode 333 may be formed within the active region 323. A strain-inducing pattern 375 may be formed in the trenches. The strain-inducing pattern 375 may be offset-aligned relative to the gate electrode 333.

In some embodiments, the active region 323 may be defined within an n-well 322 on the substrate 321. A gate dielectric layer 331 may be formed between the active region 323 and the gate electrode 333. Re-oxidation layers 341, inner spacers 343, and outer spacers 381 may be formed on side surfaces of the gate electrode 333. LDDs 355 may be formed within the active region 123. The LDDs 355 may cover side surfaces and bottom of the strain-inducing pattern 375. An etch stopping layer 395 and interlayer insulating layer 397 may be formed on the substrate 321.

Figure 9:
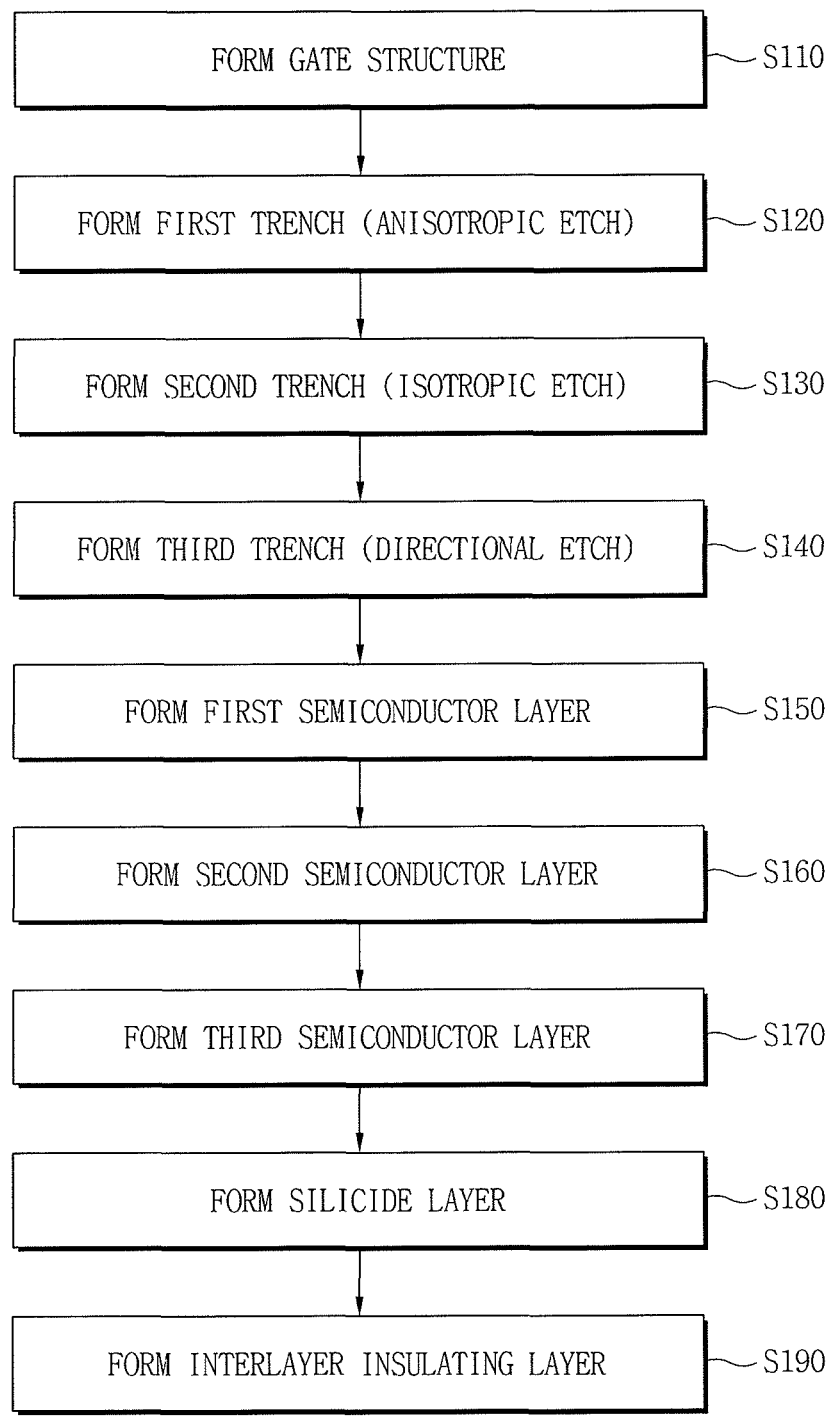
FIG. 9 is a flowchart for describing a method of forming a semiconductor device in accordance with embodiments of the inventive concepts.

FIG. 9 is a flowchart for describing a method of forming a semiconductor device in accordance with embodiments of the inventive concepts, and FIGS. 10, 11, 12A, 13A, 14A, 15, 16, 17A, 18A, 19, 20A, 20B, 21, 22A, 23, and 24 are cross-sectional views for describing methods of forming semiconductor devices in accordance with embodiments of the inventive concepts. FIGS. 12B, 12C, 13B, 14B, 17B, 18B, and 22B are enlarged views showing some configuration elements of FIGS. 12A, 13A, 14A, 17A, 18A, and 22A, respectively.

Referring to FIG. 9, the method of forming a semiconductor device in accordance with embodiments of the inventive concepts may include forming a gate structure (S110), forming a first trench (S120), forming a second trench (S130), forming a third trench (S140), forming a first semiconductor layer (S150), forming a second semiconductor layer (S160), forming a third semiconductor layer (S170), forming a silicide layer (S180), and forming an interlayer insulating layer (S190). Hereinafter, the method will be described with reference to process-specific drawings, in detail.

Figure 10:
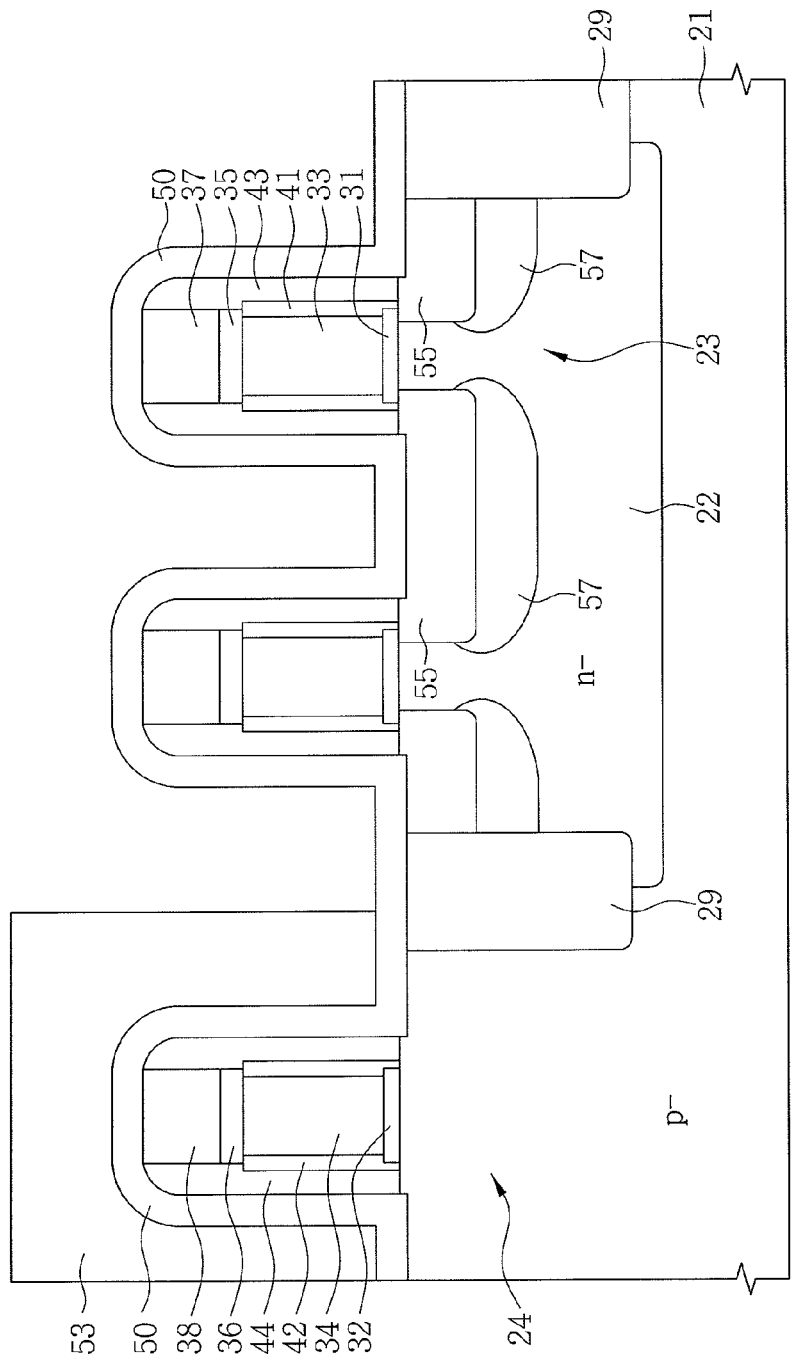
FIGS. 10, 11, 12A, 13A, 14A, 15, 16, 17A, 18A, 19, 20*a*, 20*b*, 21, 22A, 23, and 24 are cross-sectional views for describing methods of forming semiconductor devices in accordance with embodiments of the inventive concepts.

Referring to FIGS. 9 and 10, first gate structures 31, 33, 35, and 37, and second gate structures 32, 34, 36, and 38 may be formed on a substrate 21 (S110).

The substrate 21 may be a single crystalline semiconductor substrate such as a silicon wafer. For example, the substrate 21 may include single crystalline silicon having p-type impurities. A device isolation layer 29 defining a first active region 23 and second active region 24 may be formed on the substrate 21. The device isolation layer 29 may be formed using a shallow trench isolation (STI) process. The device isolation layer 29 may include silicon oxide, silicon nitride, silicon oxynitride, or a combination thereof. The first active region 23 may be defined within the n-well 22 formed on a predetermined area of the substrate 21. The first active region 23 may include single crystalline silicon having n-type impurities. The second active region 24 may include single crystalline silicon having p-type impurities.

First and second gate dielectric layers 31 and 32, first and second gate electrodes 33 and 34, first and second buffer patterns 35 and 36, and first and second mask patterns 37 and 38 may be formed on the substrate 21. The first gate dielectric layers 31, the first gate electrodes 33, the first buffer patterns 35, and the first mask patterns 37 may be sequentially stacked on the first active region 23. The first gate dielectric layers 31, the first gate electrodes 33, the first buffer patterns 35, and the first mask patterns 37 may be foamed as the first gate structures 31, 33, 35, and 37. Each of the first gate structures 31, 33, 35, and 37 may cross the first active region 23, and extend onto the device isolation layer 29.

The first gate dielectric layers 31 may comprise, in some embodiments, silicon oxide, silicon nitride, silicon oxynitride, a high-K dielectric layer, or a combination thereof. The first gate electrodes 33 may comprise, in some embodiments, polysilicon, metal silicide, metal, a metal oxide, metal nitride, conductive carbon, or a combination thereof. For example, the first gate electrodes 33 may include polysilicon layer having p-type impurities. The first buffer patterns 35 and the first mask patterns 37 may comprise different materials with respect to each other. For example, the first buffer patterns 35 may include silicon oxide, and the first mask patterns 37 may include silicon nitride. The first buffer patterns 35 and the first mask patterns 37 may be formed as hard mask patterns.

The second gate dielectric layer 32, the second gate electrode 34, the second buffer pattern 36, and the second mask pattern 38 may be sequentially stacked on the second active region 24. The second gate dielectric layer 32, the second gate electrode 34, the second buffer pattern 36, and the second mask pattern 38 may be formed as the second gate structures 32, 34, 36, and 38.

In some embodiments, the second gate dielectric layer 32 may include silicon oxide, silicon nitride, silicon oxynitride, a high-K dielectric layer, or a combination thereof. The second gate electrode 34 may include polysilicon, metal silicide, metal, metal oxide, metal nitride, conductive carbon, or a combination thereof. For example, the second gate electrode 34 may include a polysilicon layer having n-type impurities. The second buffer pattern 36 may include silicon oxide, and the second mask pattern 38 may include silicon nitride.

First re-oxidation layers 41 may be formed on side surfaces of the first gate electrodes 33. The first re-oxidation layers 41 may include silicon oxide such as thermal oxide. Second re-oxidation layers 42 may be formed on side surfaces of the second gate electrode 34. The second re-oxidation layers 42 may include silicon oxide such as thermal oxide. In other embodiments, the first re-oxidation layers 41 or the second re-oxidation layers 42 may be omitted.

First inner spacers 43 may be formed on side surfaces of the first gate structures 31, 33, 35, and 37. The first inner spacers 43 may cover outer sides of the first re-oxidation layers 41, and be in contact with the first active region 23. The first inner spacers 43 may include an insulating layer such as silicon oxide. Second inner spacers 44 may be formed on side surfaces of the second gate structures 32, 34, 36, and 38. The second inner spacers 44 may cover outer sides of the second re-oxidation layers 42, and be in contact with the second active region 24. The second inner spacers 44 may include an insulating layer such as silicon oxide. The formation of the first inner spacers 43 and the second inner spacers 44 may include, in some embodiments, a thin film formation process and an anisotropic etch process. The first active region 23, second active region 24, and device isolation layer 29 disposed outer sides of the first inner spacers 43 and second inner spacers 44 may be partly recessed.

First LDDs 55 and first halos 57 may be formed using the first gate structures 31, 33, 35, and 37, the first re-oxidation layers 41, and the first inner spacers 43 as an ion implantation mask. The first LDDs 55 may be formed within the first active region 23 adjacent to outer sides of the first gate electrodes 33. The first LDDs 55 may be diffused under the first inner spacers 43. The first LDDs 55 may include conductivity type impurities that are different from those of the n-well 22. For example, the first LDDs 55 may include p-type impurities.

The first halos 57 may be formed at a lower level than upper ends of the first LDDs 55. The first halos 57 may cover a bottom of the first LDDs 55, and partly cover side surfaces of the first LDDs 55. For example, the first halos 57 may be formed to surround lower parts of the first LDDs 55. The first halos 57 may include different conductivity type impurities relative to the first LDDs 55, and have the same conductivity type impurities as the n-well 22. For example, the first halos 57 may include n-type impurities. The concentration of the n-type impurities in the first halos 57 may be higher than that of the n-well 22.

A sacrificial spacer layer 50 conformally covering the entire substrate 21 may be formed. The sacrificial spacer layer 50 may cover outer side surfaces of the first inner spacers 43 and the second inner spacers 44. The sacrificial spacer layer 50 may have an etch selectivity with respect to the first inner spacers 43 and second inner spacers 44. For example, in some embodiments, the sacrificial spacer layer 50 may include silicon nitride.

The third mask pattern 53 may be formed on the sacrificial spacer layer 50. The third mask pattern 53 may be a photoresist pattern. The third mask pattern 53 may cover the second active region 24 and expose the first active region 23. The third mask pattern 53 may partly cover the device isolation layer 29.

In other embodiments, the first LDDs 55 or the first halos 57 may be formed after the sacrificial spacer layer 50 is formed. In still other embodiments, the first LDDs 55 or the first halos 57 may be formed after third mask pattern 53 is formed.

Figure 11:
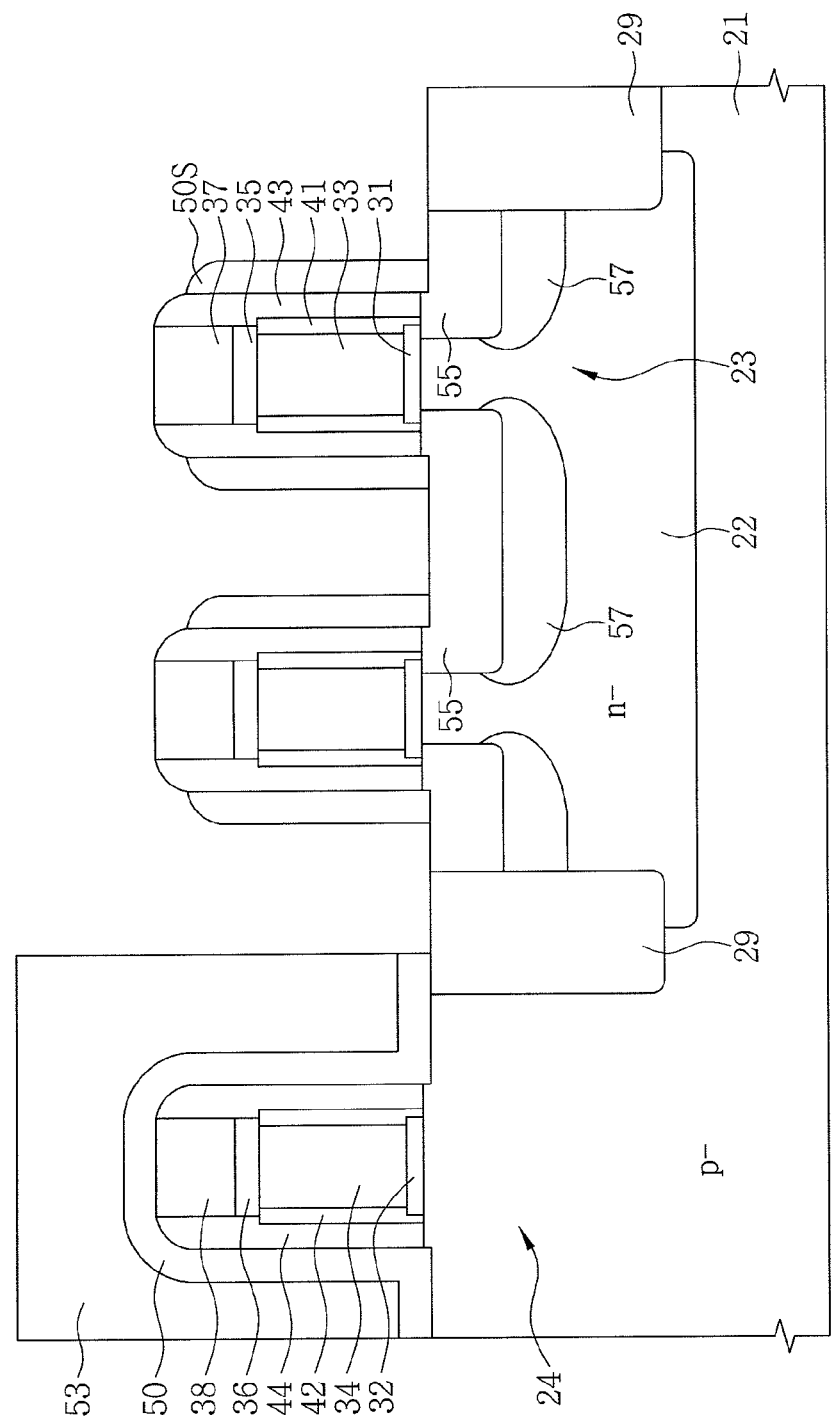

Referring to FIGS. 9 and 11, sacrificial spacers 50S may be formed by anisotropically etching the sacrificial spacer layer 50 using the third mask pattern 53 as an etch mask. The sacrificial spacers 50S may cover outer side of the first inner spacers 43. The sacrificial spacers 50S may be in contact with the upper surface of the first LDDs 55. The first LDDs 55 may be exposed to outer sides of the sacrificial spacers 50S. Lower ends of the sacrificial spacers 50S may be formed at a lower level than those of the first gate dielectric layers 31. The sacrificial spacer layer 50 may be retained on the second active region 24.

Figure 12A:
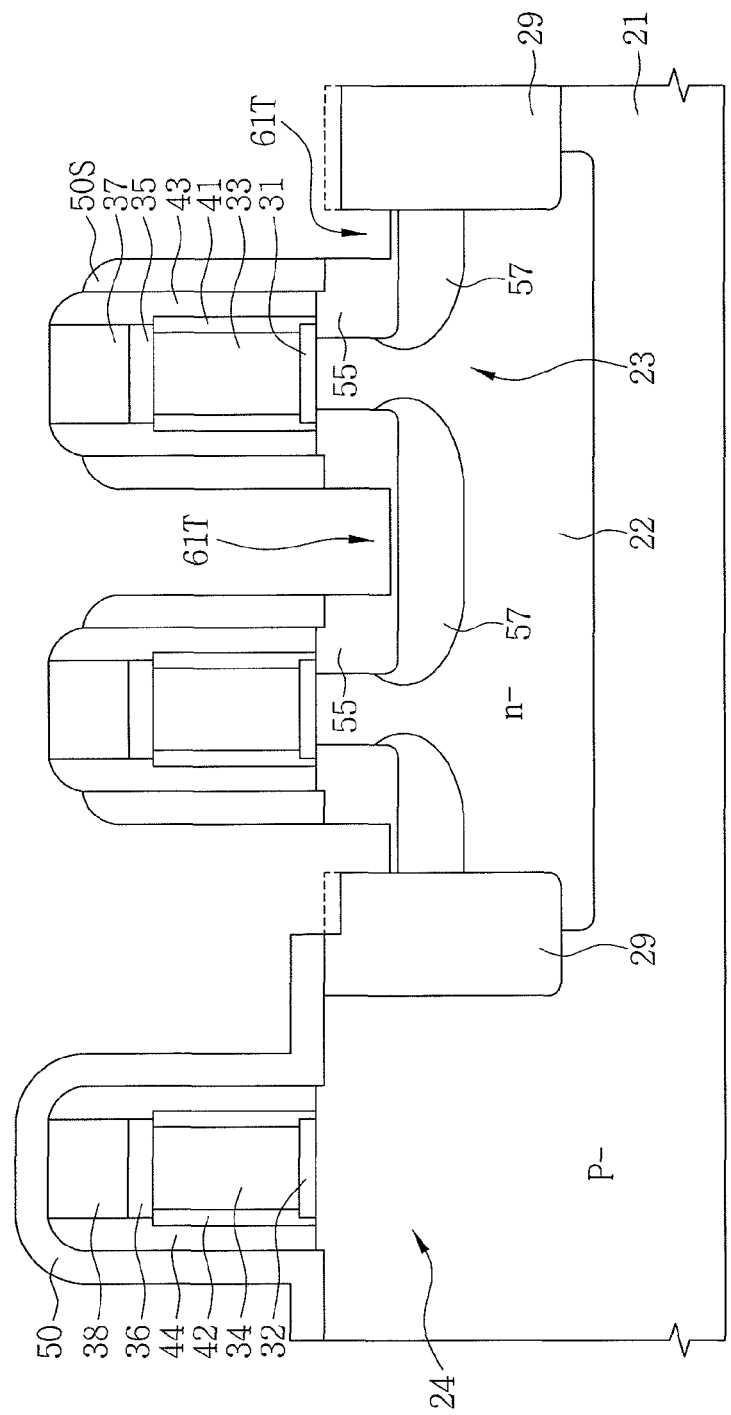

Referring to FIGS. 9 and 12A, the third mask pattern 53 is removed, and first trenches 61T may be formed by etching the first active region 23 using the first gate structures 31, 33, 35, and 37, the first inner spacers 43, and the sacrificial spacers 50S as an etch mask (S120). The sacrificial spacer layer 50 may be exposed on the second active region 24 by removing the third mask pattern 53.

To form the first trenches 61T, an anisotropic etch process using HBr, $CF_4$, $O_2$, $Cl_2$, $NF_3$, or a combination thereof may be applied. Each of the first trenches 61T may have U-shape. The device isolation layer 29 may be partly recessed while the first trenches 61T are formed.

Figure 12B:
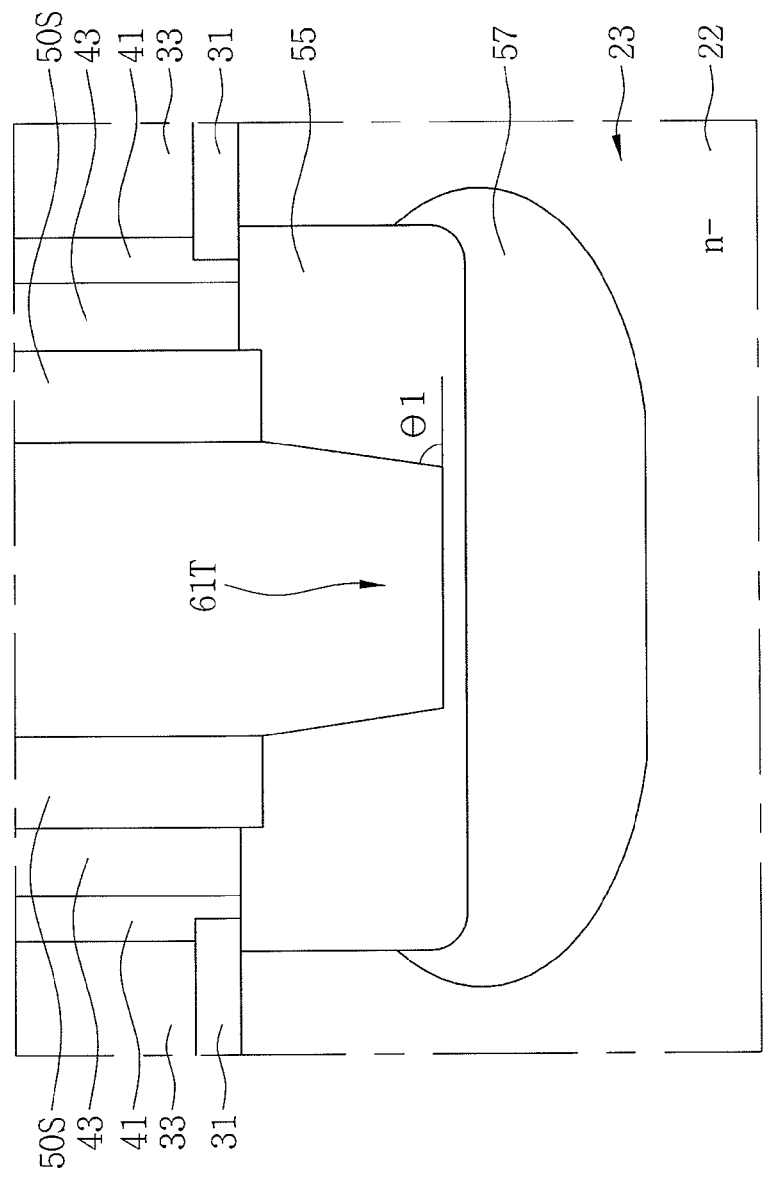

Referring to FIG. 12B, each of the first trenches 61T may have a shape in which a lower part thereof is narrower than an upper part thereof. A sidewall of the first trench 61T may be formed so as to have a first angle of intersection θ1 with respect to a horizontal line passing a bottom of the first trench 61T. The first angle of intersection θ1 may range from 86 to 89 degrees. The first trenches 61T may be located in the first LDDs 55. The first LDDs 55 may be exposed to the sidewalls and bottoms of the first trenches 61T. The bottoms of the first trenches 61T may be formed at a higher level than those of the first LDDs 55.

Figure 12C:
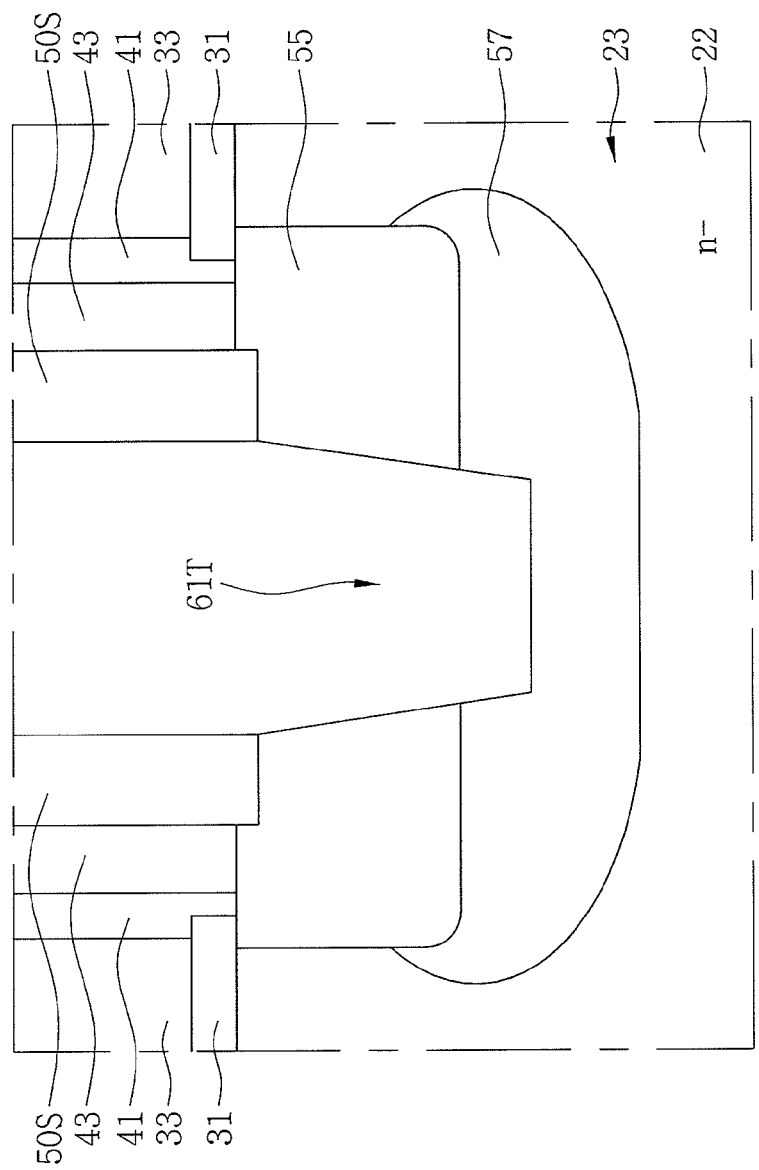

Referring to FIG. 12C, the first trenches 61T may optionally pass through the first LDDs 55 to extend in the first halos 57. The first LDDs 55 and the first halos 57 may be exposed to the sidewalls of the first trenches 61T. In this example, the first halos 57 may be further optionally exposed to the bottoms of the first trenches 61T.

Figure 13A:
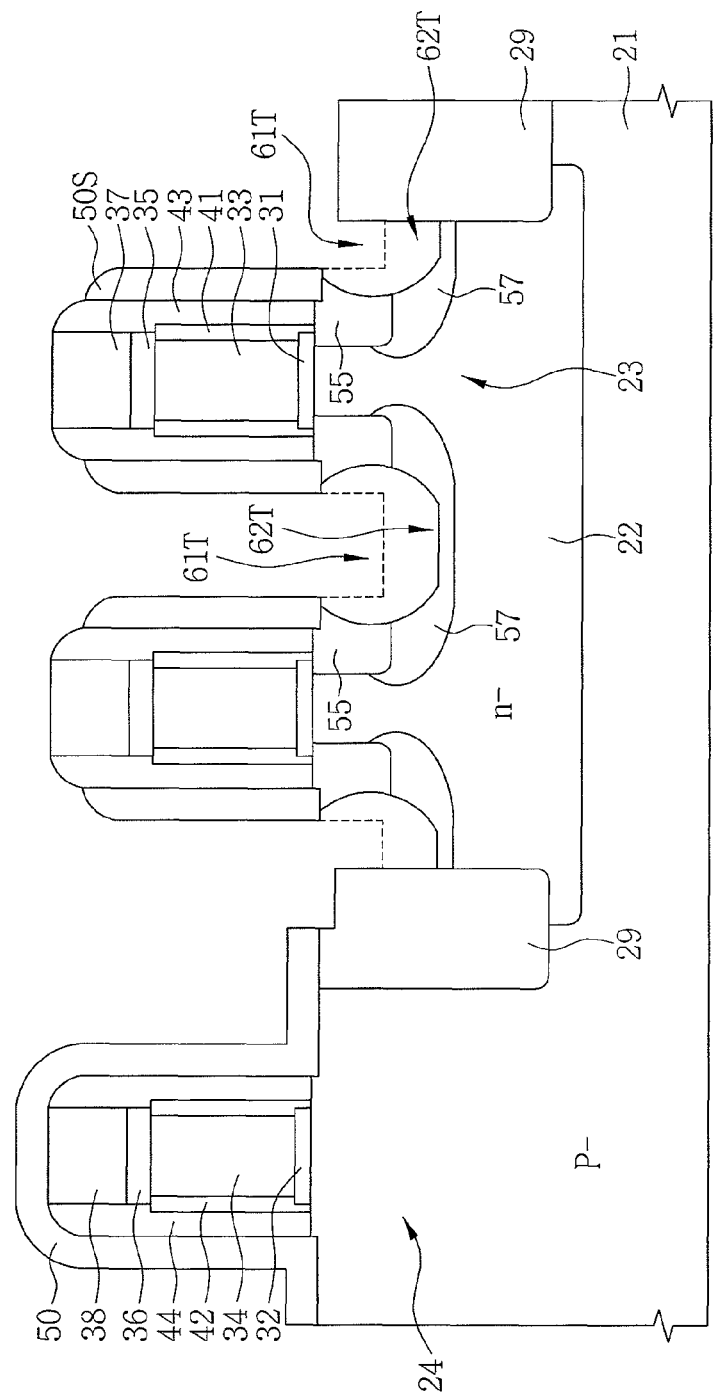

Referring to FIGS. 9 and 13A, second trenches 62T may be formed by etching sidewalls and bottoms of the first trenches 61T using an isotropic etch process (S130). The second trenches 62T may be formed in the first active region 23. Sidewalls of the second trenches 62T may be rounded. To form the second trenches 62T, a dry etch process, a wet etch process, or a combination thereof may be used. In some embodiments, the dry etch process may use HBr, $CF_4$, $O_2$, $Cl_2$, $NF_3$, or a combination thereof. The wet etch process may use a standard clean-1 (SC-1) solution, HF, or a combination thereof. The formation of the first trenches 61T and the second trenches 62T may include an in-situ or ex-situ process.

Figure 13B:
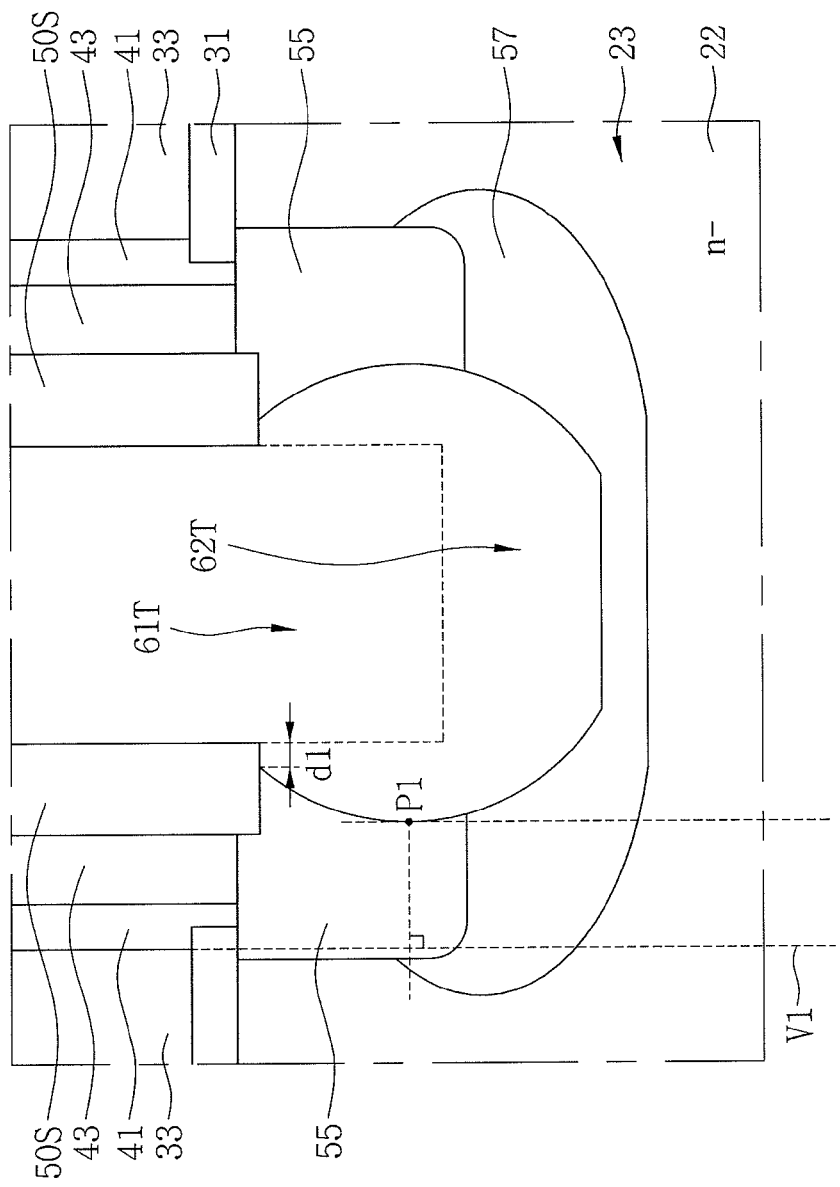

Referring to FIG. 13B, the first LDDs 55 and the first halo 57 may be exposed to sidewalls of the second trench 62T. The first halos 57 may be exposed to a bottom of the second trench 62T. The first LDDs 55 may be retained below the first inner spacers 43 and the sacrificial spacers 50S. Undercuts may be formed at lower parts of the sacrificial spacers 50S due to the presence of and positioning of second trench 62T. A first width d1 of bottom surfaces of the sacrificial spacers 50S may be exposed. As shown in FIG. 13B, a composite form of the first trench 61T and the second trench 62T may be interpreted as a semi-isotropic shape.

A vertical line that is perpendicular to the substrate 21 and that passes, or intersects, a side surface of the first gate electrode 33 may be defined as a first vertical line V1. A point that is the closest from the first vertical line V1 at a sidewall of the second trench 62T may be defined as a first point P1. The first point P1 may be located at a side surface of the first LDD 55. In some embodiments, the first point P1 may be located between the bottom and the top of the first LDD 55.

In accordance with the embodiments of the inventive concepts, since the first trench 61T are formed using the isotropic etch process, a pattern loading effect can be minimized. The widths of the first trenches 61T can have very uniform distribution throughout the substrate 21. Also, since the second trenches 62T are formed using the isotropic etch process, a location of the first point P1 can be easily controlled. The first point P1 can be formed at a desired location by adjusting an amount of etching of the first trench 61T and the second trench 62T. The first point P1 can be formed at very uniform locations throughout the substrate 21.

Figure 14A:
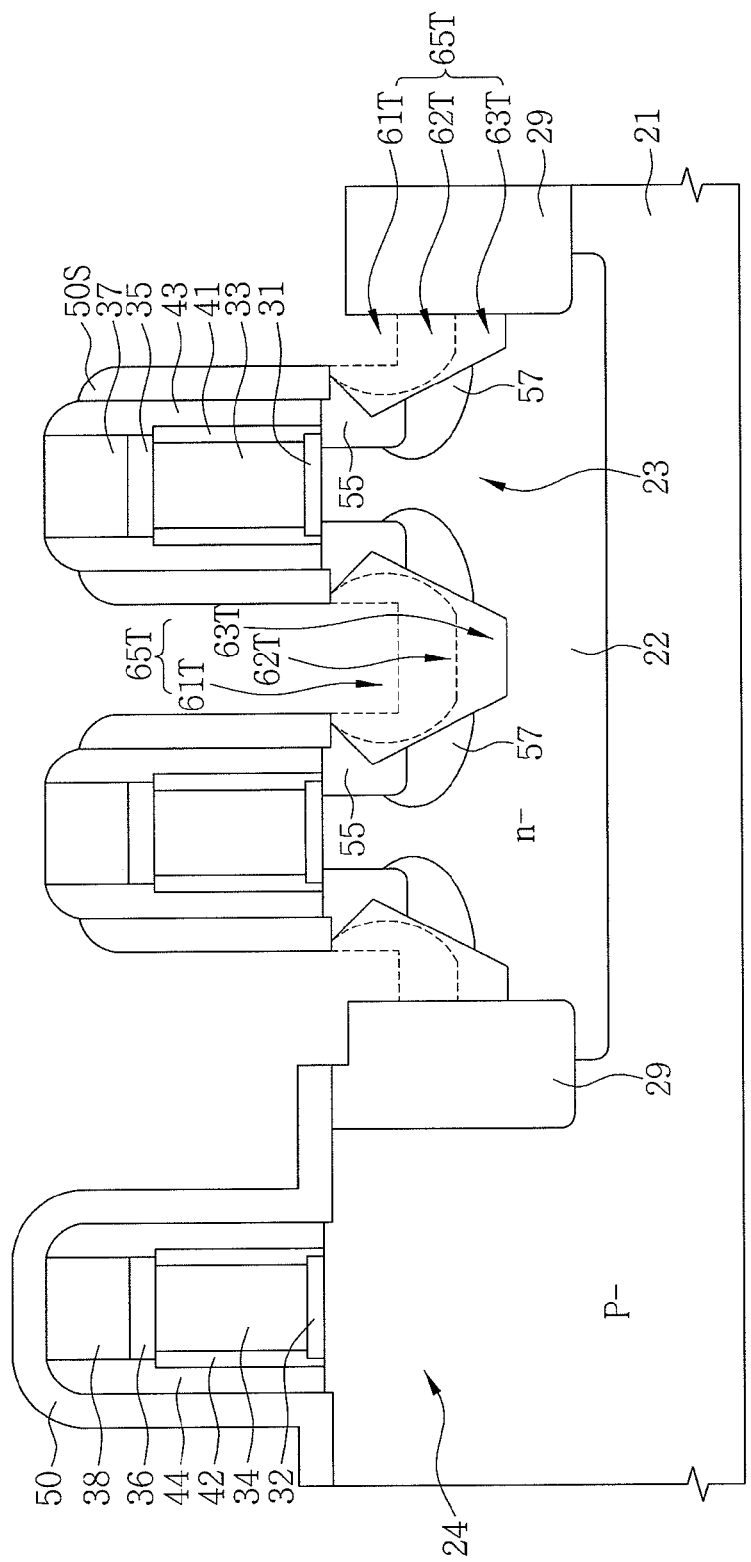

Referring to FIGS. 9 and 14A, third trenches 63T may be formed using a directional etch process (S140). The first trenches 61T, the second trenches 62T, and the third trenches 63T may configure trenches 65T. The third trenches 63T may be formed using $NH_4OH$, $NH_3OH$, tetra-methyl-ammonium-hydroxide (TMAH), KOH, NaOH, benzyltrimethylammonium hydroxide (BTMH), or a combination thereof. The third trenches 63T may pass through the first LDDs 55 and the first halos 57 to extend into the first active region 23. The first LDDs 55, the first halos 57, and the first active region 23 may be exposed within the trenches 65T.

In the directional etch process, etch rates may be different depending on a crystallographic direction of the first active region 23. The directional etch process may show a high etch rate with respect to <100> and <110> among the crystallographic directions of the first active region 23. The directional etch may show a very low etch rate with respect to <111> among the crystallographic directions of the first active region 23. The trenches 65T and the first active region 23 may be formed in a sigma shape, as described herein.

Figure 14B:
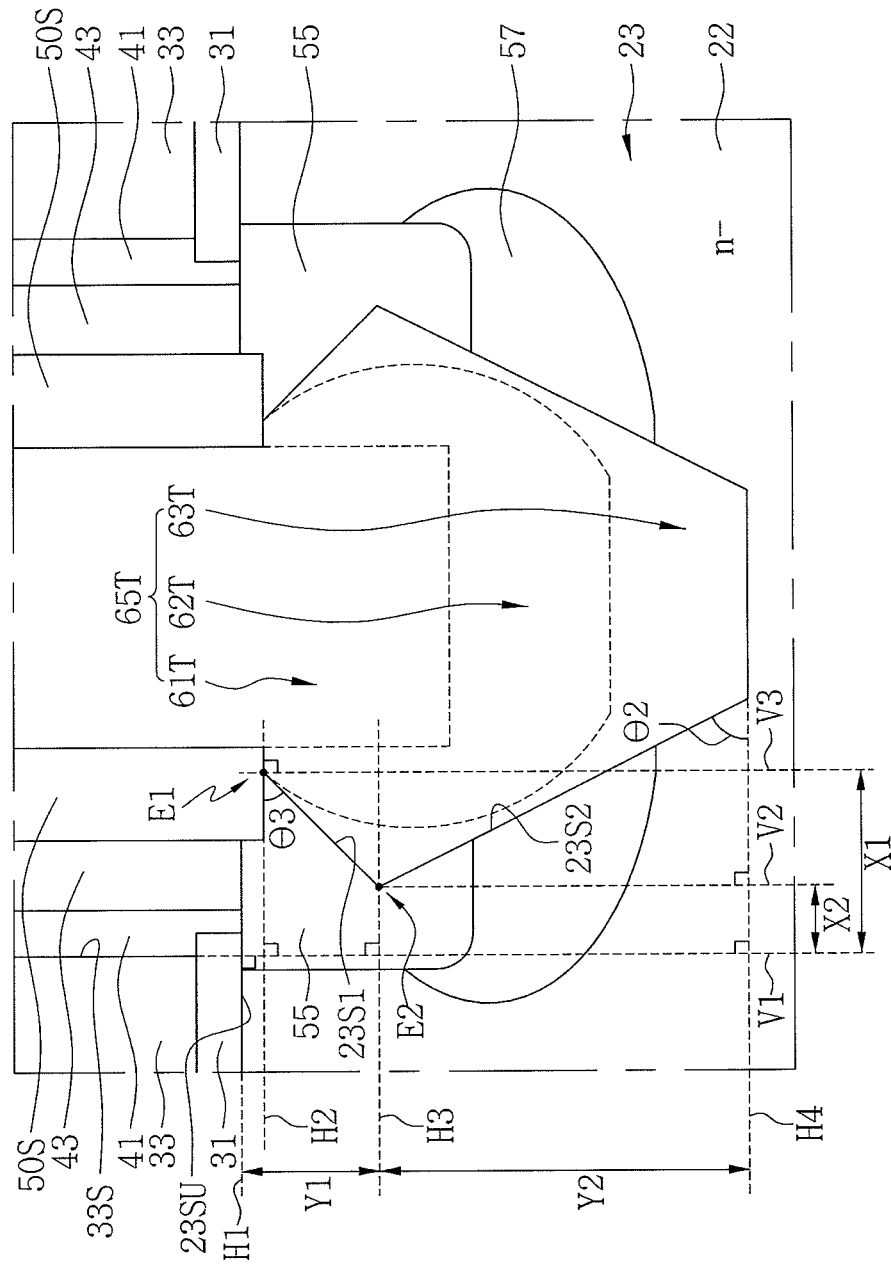

Referring to FIG. 14B, a first side surface 23S1 and second side surface 23S2 of the first active region 23 may be exposed in the trenches 65T. The second side surface 23S2 may be formed under the first side surface 23S1. The first LDD 55 may be exposed to the first side surface 23S1. The first LDD 55, the first halo 57, and the first active region 23 may be exposed to the second side surface 23S2. A first edge E1 may be formed between an upper surface 23SU and the first side surface 23S1 of the first active region 23. A second edge E2 may be formed between the first side surface 23S1 and the second side surface 23S2 of the first active region 23.

In some embodiments, the upper surface 23SU of the first active region 23 may extend to an outer side of the first gate electrode 33. In some embodiments, the first edge E1 may be located under the sacrificial spacers 50S. In some embodiments, the first edge E1 may be located on a surface of the first LDD 55. In some embodiments, the second edge E2 may be located at an outer side of the first gate electrode 33. In some embodiments, the second edge E2 may be located on the surface of the first LDD 55.

A vertical line that is perpendicular to the substrate 21 and intersects or passes a side surface 33S of the first gate electrode 33 may be defined as a first vertical line V1. A vertical line that is perpendicular to the substrate 21, is parallel to the first vertical line V1, and intersects or passes the second edge E2 may be defined as a second vertical line V2. A vertical line that is perpendicular to the substrate 21, is parallel to the second vertical line V2, and intersects or passes the first edge E1 may be defined as a third vertical line V3.

A horizontal line that is perpendicular to the first vertical line V1 and intersects or passes an upper end of the first active region 23 may be defined as a first horizontal line H1. A horizontal line that is perpendicular to the first horizontal line H1 and intersects or passes the first edge E1 may be defined as a second horizontal line H2. A horizontal line that is parallel to the second horizontal line H2 and intersects or passes the second edge E2 may be defined as a third horizontal line H3. A horizontal line that is parallel to the third horizontal line H3 and intersects or passes a bottom of the trench 65T may be defined as a fourth horizontal line H4.

The second side surface 23S2 may form a second angle of intersection θ2 with respect to the fourth horizontal line H4. The first side surface 23S1 may form a third angle of intersection θ3 with respect to the second horizontal line H2. The second angle of intersection θ2 may range from 50 degrees to 60 degrees. For example, the second angle of intersection θ2 may be 55 degrees. The third angle of intersection θ3 may be may range from 30 to 40 degrees. For example, the third angle of intersection θ3 may be 35 degrees.

In the first vertical line V1, the distance between the first horizontal line H1 and the third horizontal line H3 may be defined as a first vertical distance Y1, and the distance between the third horizontal line H3 and the fourth horizontal line H4 may be defined as a second vertical distance Y2. The first vertical distance Y1 may be interpreted as a vertical distance between the top of the first active region 23 and the second edge E2, and the second vertical distance Y2 may be interpreted as a vertical distance between the second edge E2 and the bottom of the trench 65T. In some embodiments, the first vertical distance Y1 may be smaller than the second vertical distance Y2.

In the second horizontal line H2, the distance between the first vertical line V1 and the third vertical line V3 may be defined as a first horizontal distance X1. In the third horizontal line H3, the distance between the first vertical line V1 and the second vertical line V2 may be defined as the second horizontal distance X2. The first horizontal distance X1 may be interpreted as an offset distance between the first edge E1 and the first gate electrode 33, and the second horizontal distance X2 may be interpreted as an offset distance between the second edge E2 and the first gate electrode 33. The first horizontal distance X1 may be greater second horizontal distance X2.

The second horizontal distance X2 may be between 0.001 nm and 5 nm. For example, the second horizontal distance X2 may be about 3 nm. The first horizontal distance X1 may be one to 1.5 times the first vertical distance Y1.

In accordance with the embodiments of the inventive concepts, since the first trenches 61T is formed using an anisotropic etch process, a pattern loading effect can be minimized. The width of the first trenches 61T can have very uniform distribution throughout the substrate 21. Since the second trenches 62T is formed using an isotropic etch process, the location of the first point P1 can be easily controlled. The first point P1 is formed at a desired position by controlling an amount of etching of the first trench 61T and the second trench 62T. The first point P1 can be located at uniform positions throughout the substrate 21. The location of the second edge E2 can be controlled by adjusting the position of the first point P1. The locations of the first edge E1 and the second edge E2 can be controlled by using the first trench 61T, the second trench 62T, and the third trench 63T. A difference between the locations of the first edge E1 and the second edge E2 may be significantly improved throughout the substrate 21, compared to the related art.

Figure 15:
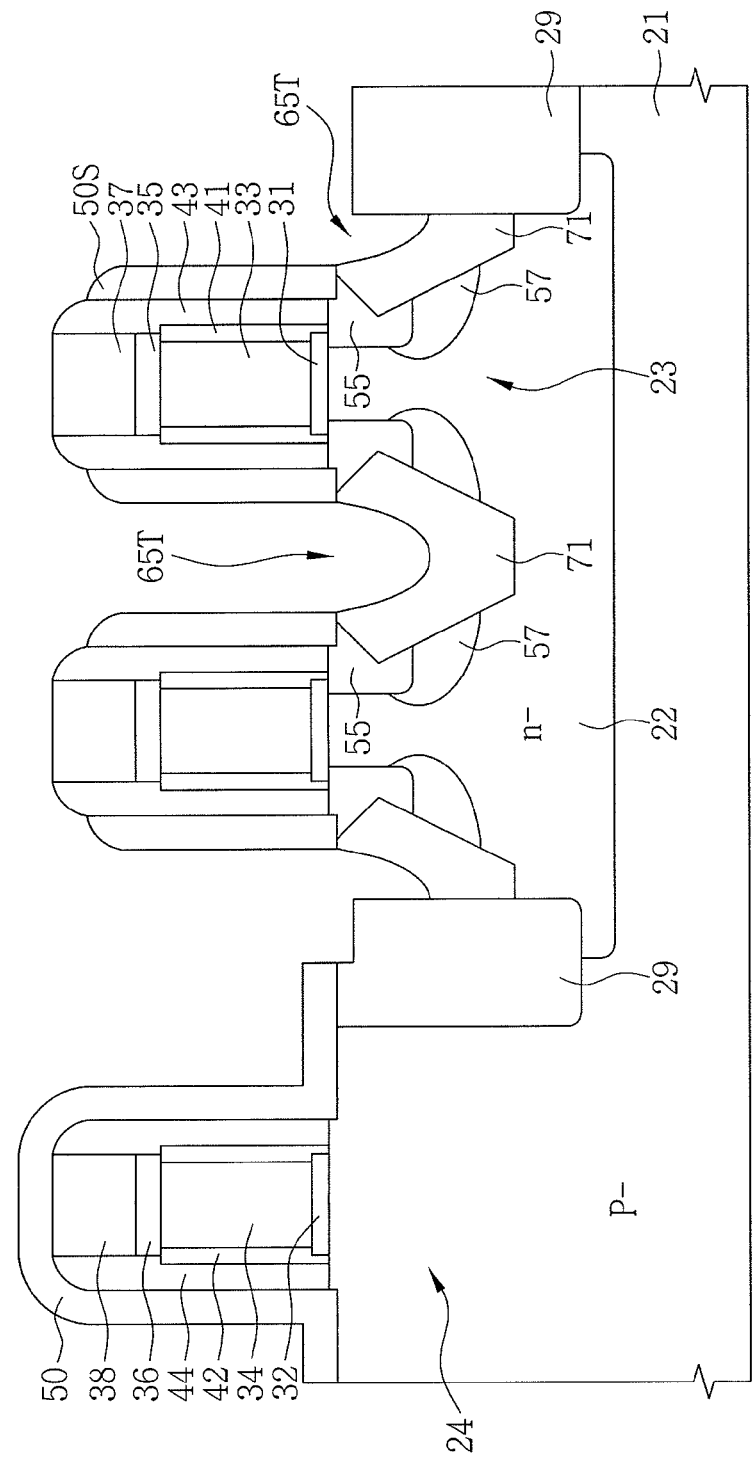

Referring to FIGS. 9 and 15, a first semiconductor layer 71 may be formed in the trenches 65T using a selective epitaxial growth (SEG) process (S150). The first semiconductor layer 71 may cover inner walls of the trenches 65T. The first semiconductor layer 71 may be in direct contact with the first LDDs 55, the first halos 57, and the first active region 23.

In some embodiments, the first semiconductor layer 71 may include SiGe. In some embodiments, the first semiconductor layer 71 may include p-type impurities. For example, the first semiconductor layer 71 may include B. In some embodiments, the p-type impurities in the first semiconductor layer 71 may have a higher concentration than those in the first LDDs 55. In some embodiments, a content of Ge content in the first semiconductor layer 71 may be 5% to 25%. For example, the content of Ge in the first semiconductor layer 71 may be about 25%.

Figure 16:
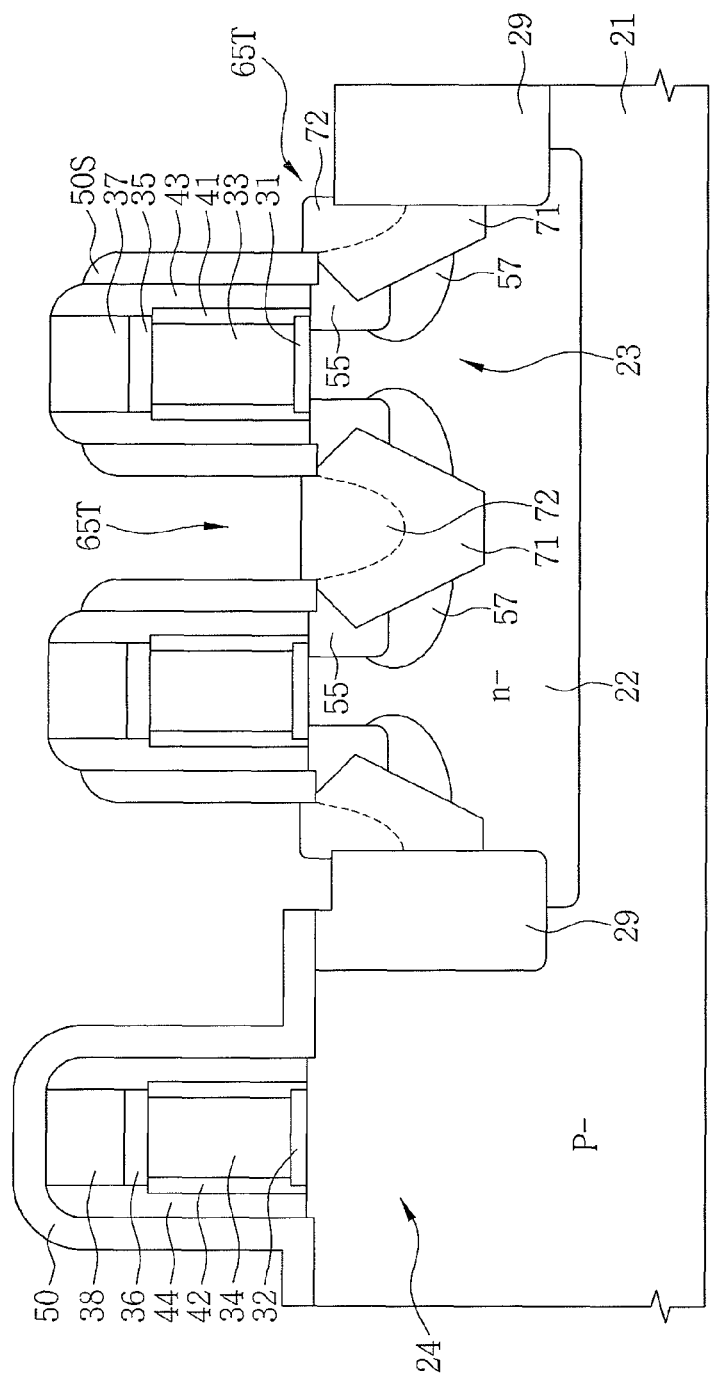

Referring to FIGS. 9 and 16, a second semiconductor layer 72 may be formed on the first semiconductor layer 71 using an SEG process (S160). The second semiconductor layer 72 may fully fill the trenches 65T.

In some embodiments, the second semiconductor layer 72 may include SiGe. In some embodiments, the second semiconductor layer 72 may include p-type impurities. For example, the second semiconductor layer 72 may include B. In some embodiments, the p-type impurities in the second semiconductor layer 72 may have a higher concentration than those in the first semiconductor layer 71. In some embodiments, the Ge content in the second semiconductor layer 72 may be 25% to 50%. For example, the Ge content in the second semiconductor layer 72 may be about 35%.

Figure 17A:
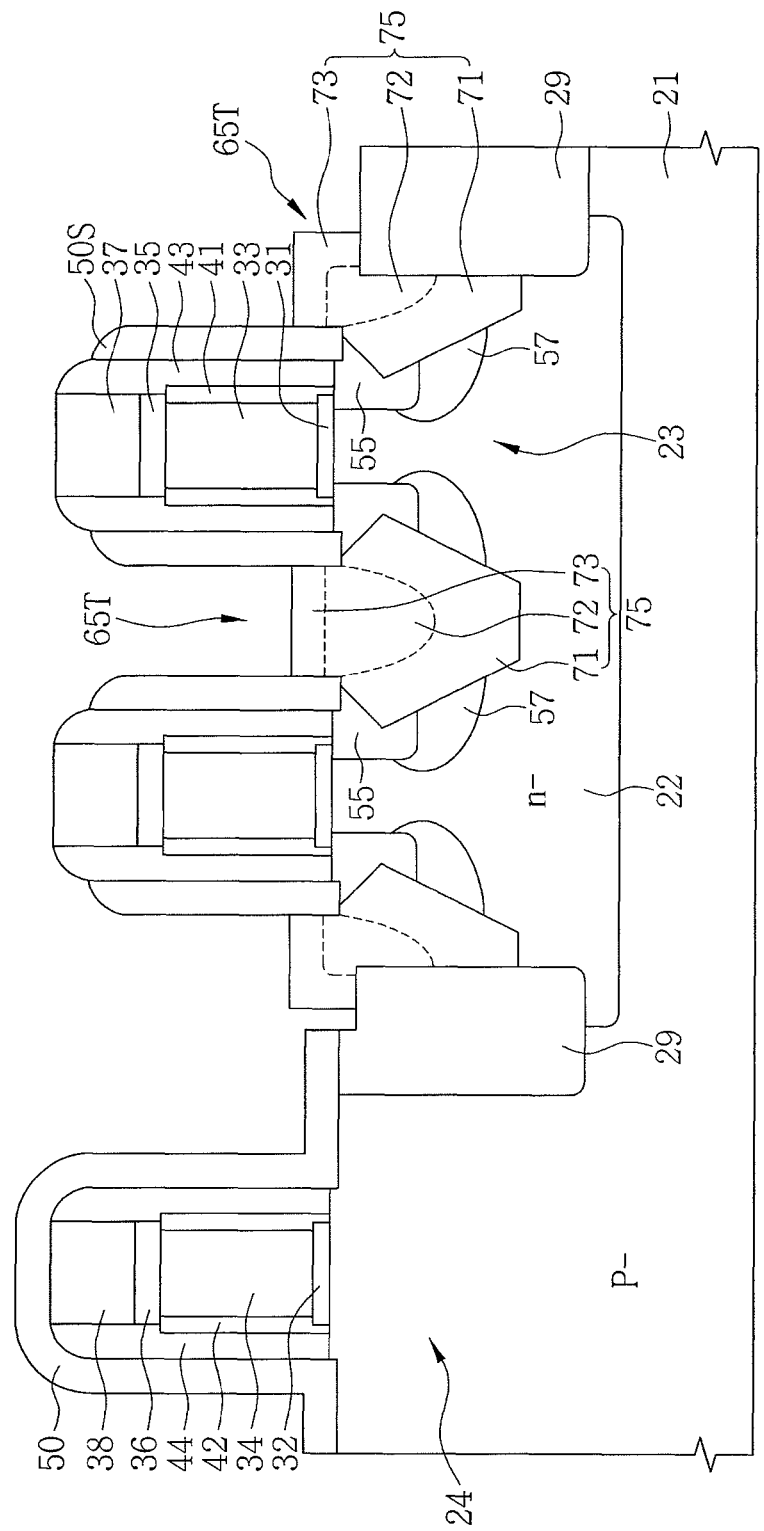

Referring to FIGS. 9 and 17A, a third semiconductor layer 73 may be formed on the second semiconductor layer 72 using an SEG process (S170). Collectively, the first semiconductor layer 71, the second semiconductor layer 72, and the third semiconductor layer 73 may constitute a strain-inducing pattern 75.

In some embodiments, the third semiconductor layer 73 may include SiGe or Si. In some embodiments, the third semiconductor layer 73 may include p-type impurities. For example, the third semiconductor layer 73 may include B. In some embodiments, the p-type impurities in the third semiconductor layer 73 may have a concentration similar to that of the p-type impurities in the second semiconductor layer 72. In some embodiments, the Ge content in the third semiconductor layer 73 may be 0% to 10%. For example, the third semiconductor layer 73 may be single crystalline silicon.

Referring to FIG. 17B, in some embodiments, an upper surface of the strain-inducing pattern 75 may fully fill the trench 65T, and protrude at a higher level relative to the upper end of the first active region 23.

Figure 18A:
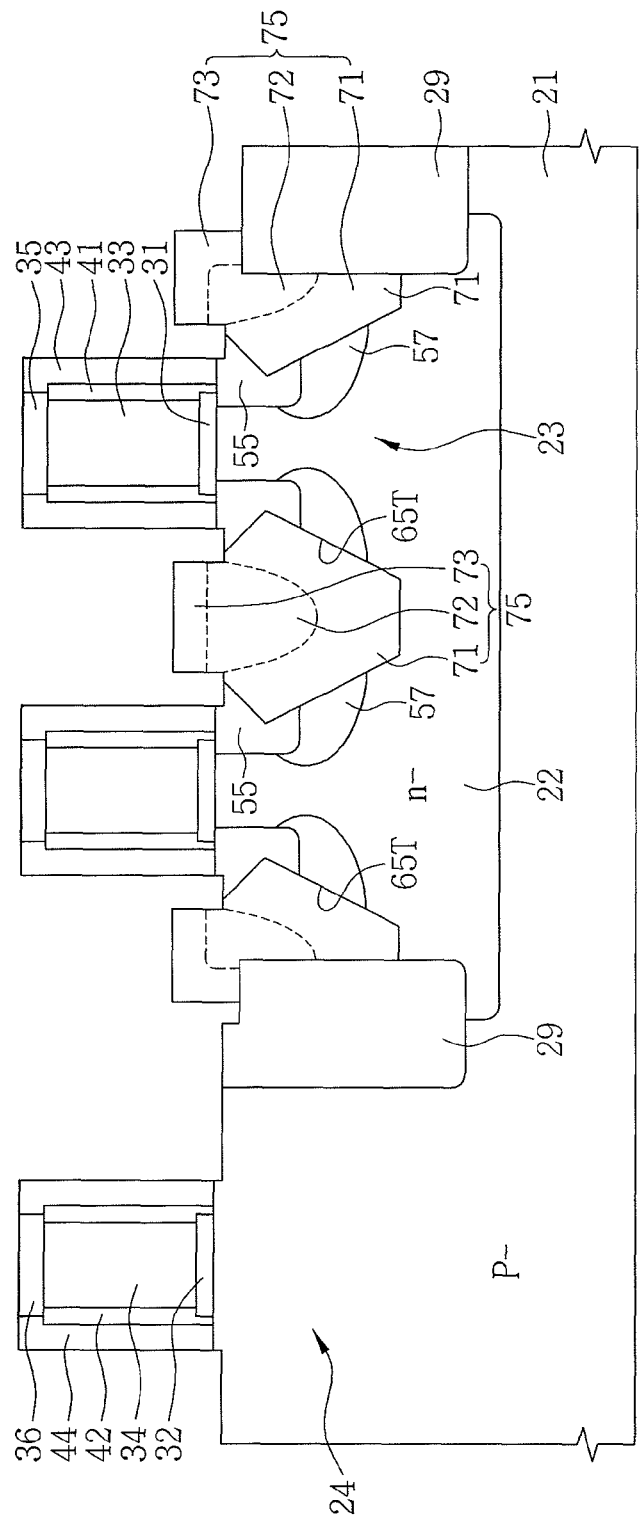

Referring to FIGS. 9 and 18A, the sacrificial spacers 50S and the sacrificial spacer layer 50 may be removed to expose the first active region 23 and the second active region 24. While removing the sacrificial spacers 50S and the sacrificial spacer layer 50, the first and second mask patterns 37 and 38 may be removed. The first LDDs 55 may be exposed between the first inner spacers 43 and the strain-inducing pattern 75.

Figure 18B:
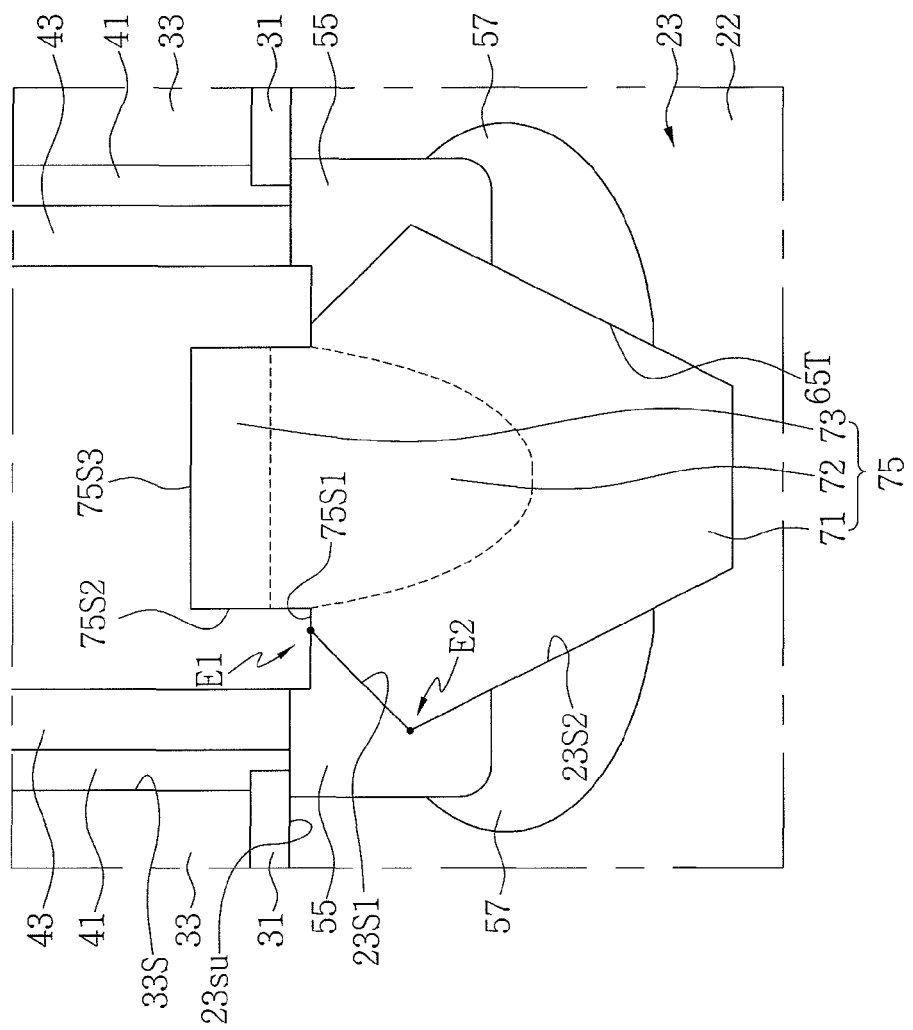

Referring to FIG. 18B, the strain-inducing pattern 75 may include a first surface 75S1, a second surface 75S2, and a third surface 75S3. The first surface 75S1 may be in contact with the first edge E1, and has a different slope relative to the first side surface 23S1 of the first active region 23. The first surface 75S1 may have a similar slope to the upper surface 23SU of the first active region 23 adjacent to the first edge E1. For example, they may be parallel to each other. An angle of intersection between the first surface 75S1 and the second horizontal line H2 may be smaller than third angle of intersection θ3.

The third surface 75S3 may be formed at an upper end of the strain-inducing pattern 75. The second surface 75S2 may be formed between the first surface 75S1 and the third surface 75S3, and in contact with the first surface 75S1 and the third surface 75S3. The second surface 75S2 may have a different slope from the first surface 75S1 and the third surface 75S3. The second surface 75S2 may have a similar angle to the first vertical line V1.

Figure 19:
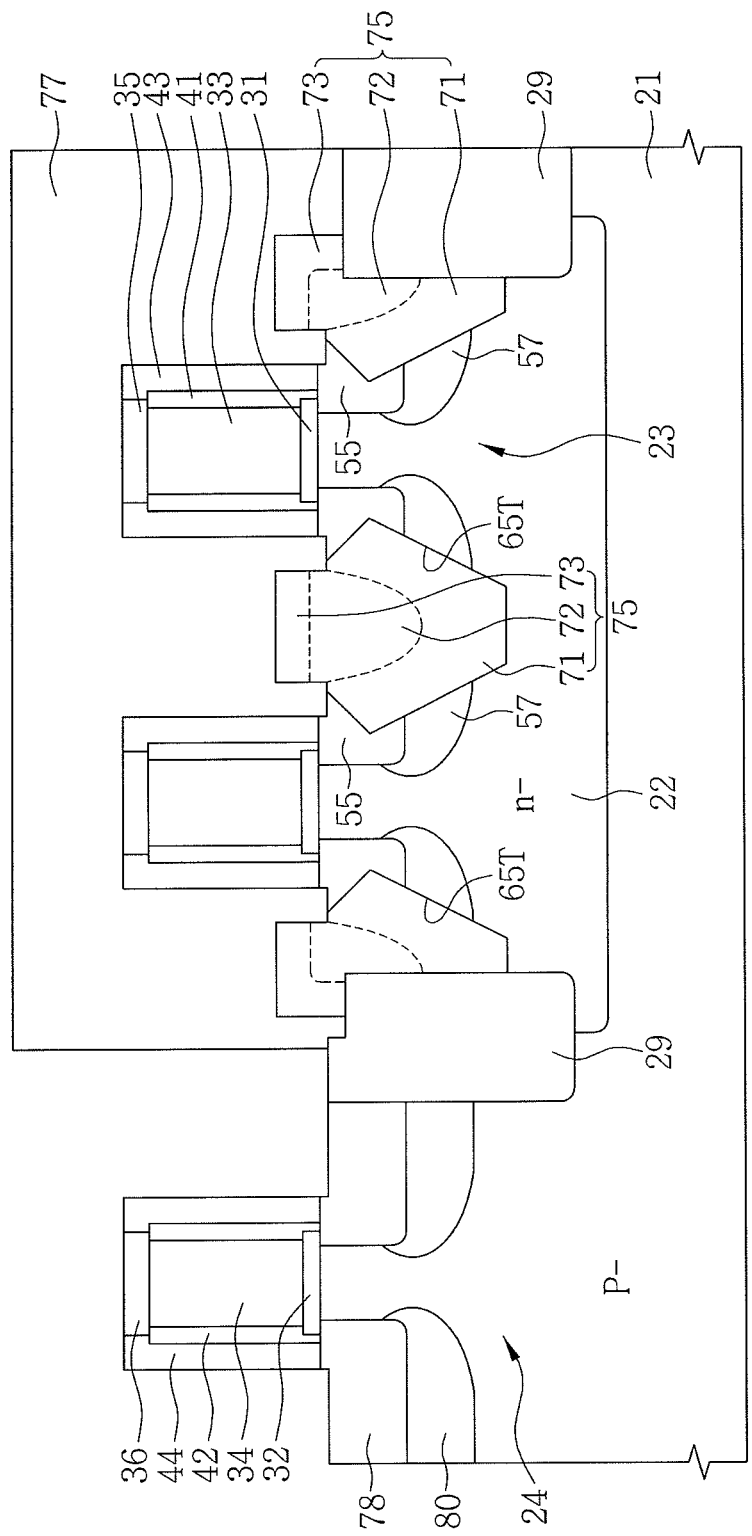

Referring to FIGS. 9 and 19, a fourth mask pattern 77 covering the n-well 22 and exposing the second active region 24 may be formed. The fourth mask pattern 77 may include a photoresist layer.

A second LDDs 78 and a second halos 80 may be formed using the fourth mask pattern 77, the second gate electrode 34, the second buffer pattern 36, and the second inner spacers 44 as an ion-implantation mask. The second LDDs 78 may include different conductivity type impurities from the second active region 24. For example, the second LDDs 78 may include n-type impurities. The second halos 80 may include different conductivity type impurities from the second LDDs 78, and the second halos 80 may include the same conductivity type impurities as the second active region 24. For example, the second halos 80 may include p-type impurities.

Figure 20A:
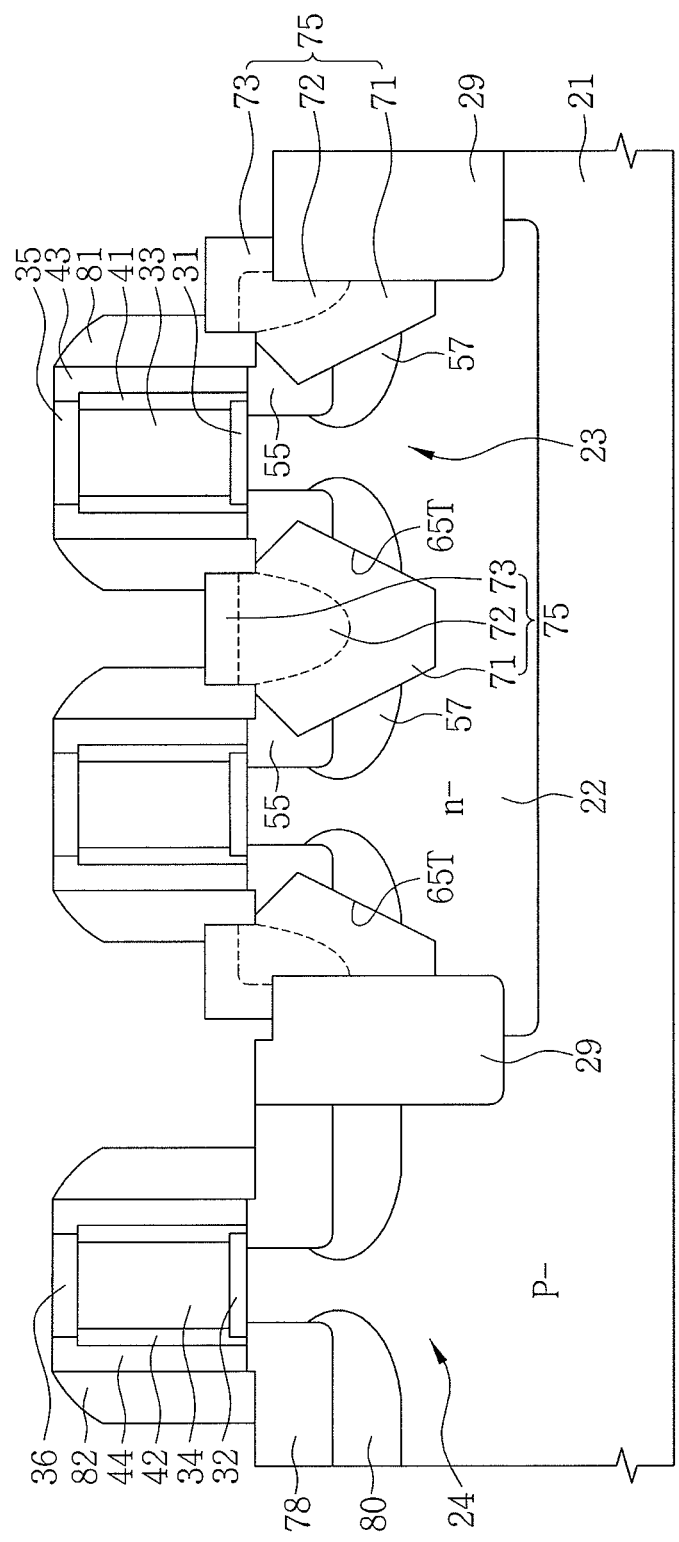

Referring to FIGS. 9 and 20A, the fourth mask pattern 77 may be removed, and first outer spacers 81 and second outer spacers 82 may be formed. The first outer spacers 81 may cover outer sides of the first inner spacers 43. The second outer spacers 82 may cover outer side of the second inner spacers 44. In some embodiments, the first outer spacers 81 and the second outer spacers 82 may be formed using a thin-film formation process and an anisotropic etch process. In some embodiments, the first outer spacers 81 and the second outer spacers 82 may include silicon oxide, silicon nitride, silicon oxynitride, or a combination thereof. For example, the first outer spacers 81 and the second outer spacers 82 may include silicon nitride.

Figure 20B:
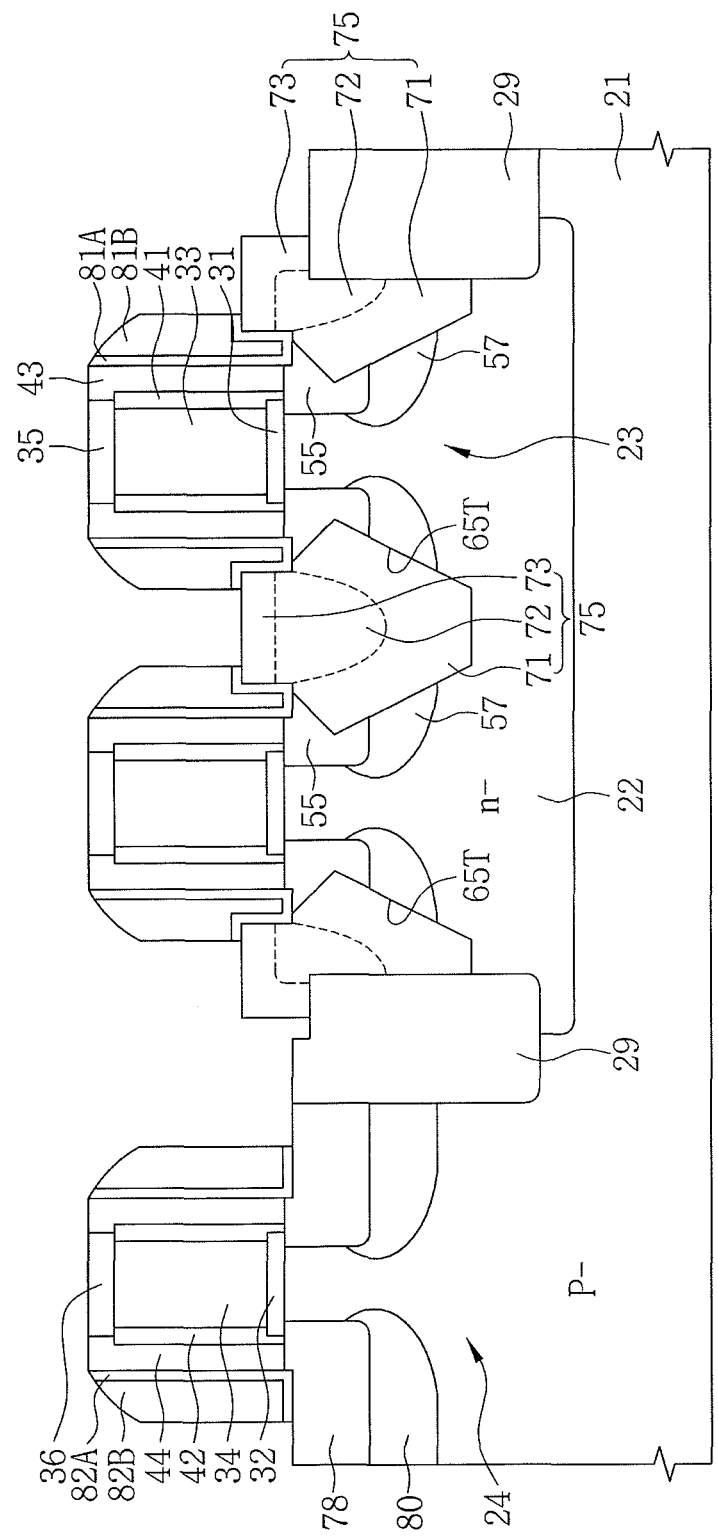

Referring to FIG. 20B, a first outer spacer 81 and second outer spacers 82A and 82B may include a first material layer 81A and 82A and a second material layer 81B and 82B disposed on the first material layer 81A and 82A. For example, the first material layer 81A and 82A may include silicon oxide, and the second material layer 81B and 82B may include silicon nitride.

Figure 21:
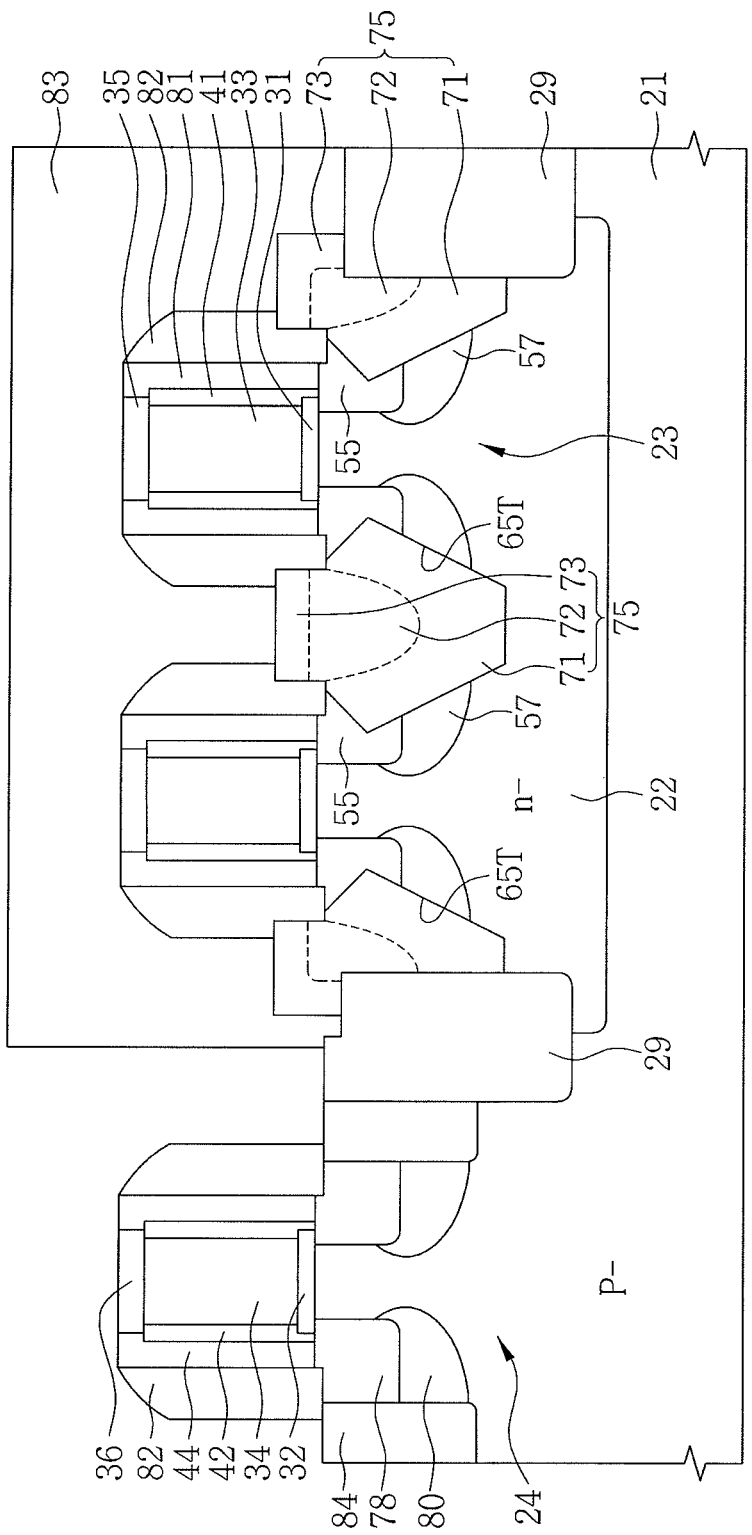

Referring to FIGS. 9 and 21, a fifth mask pattern 83 covering the n-well 22 region and exposing the second active region 24. The fifth mask pattern 83 may include a photoresist layer.

N-source/drains 84 may be formed using the fifth mask pattern 83, the second gate electrode 34, the second buffer pattern 36, the second inner spacers 44, and the second outer spacers 82 as an ion-implantation mask. The second LDDs 78 may be retained under the second inner spacers 44 and the second outer spacers 82. The N-source/drains 84 may include n-type impurities.

Figure 22A:
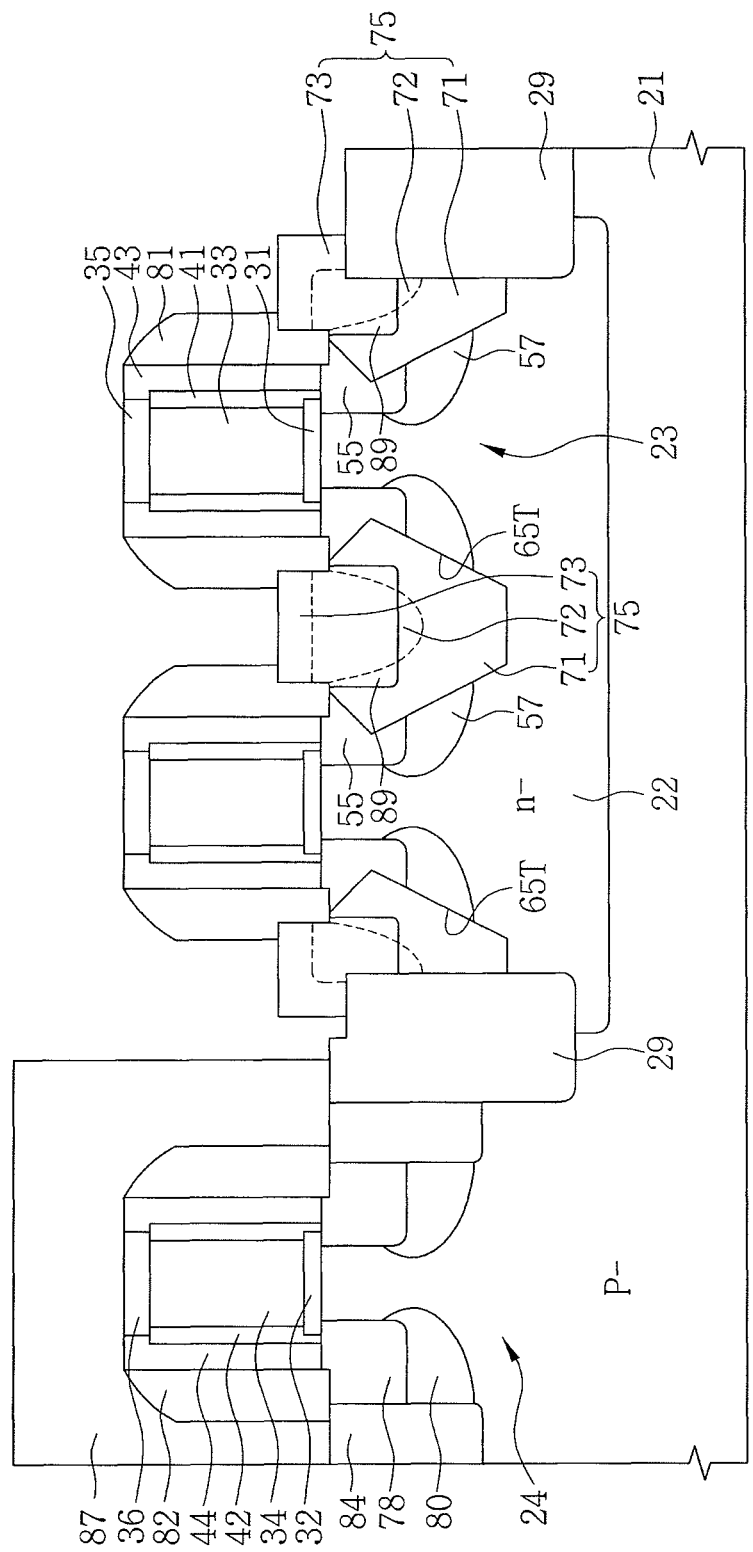

Referring to FIGS. 9 and 22A, the fifth mask pattern 83 may be removed, and a sixth mask pattern 87 covering the second active region 24 may be formed. The sixth mask pattern 87 may include a photoresist layer. P-source/drains 89 may be formed using the sixth mask pattern 87, the first gate electrodes 33, the first buffer patterns 35, the first inner spacers 43, and the first outer spacers 81 as an ion-implantation mask. The P-source/drains 89 may include p-type impurities. The P-source/drains 89 may be formed on the upper end portion of the strain-inducing pattern 75. For example, the P-source/drains 89 may be formed at a higher level than a bottom of the first LDD 55.

Referring to FIG. 22B, in some embodiments, the P-source/drains 89 may extend to a lower level than the first LDD 55. The P-source/drains 89 may extend to a part of the first LDD 55 adjacent to the strain-inducing pattern 75.

Figure 23:
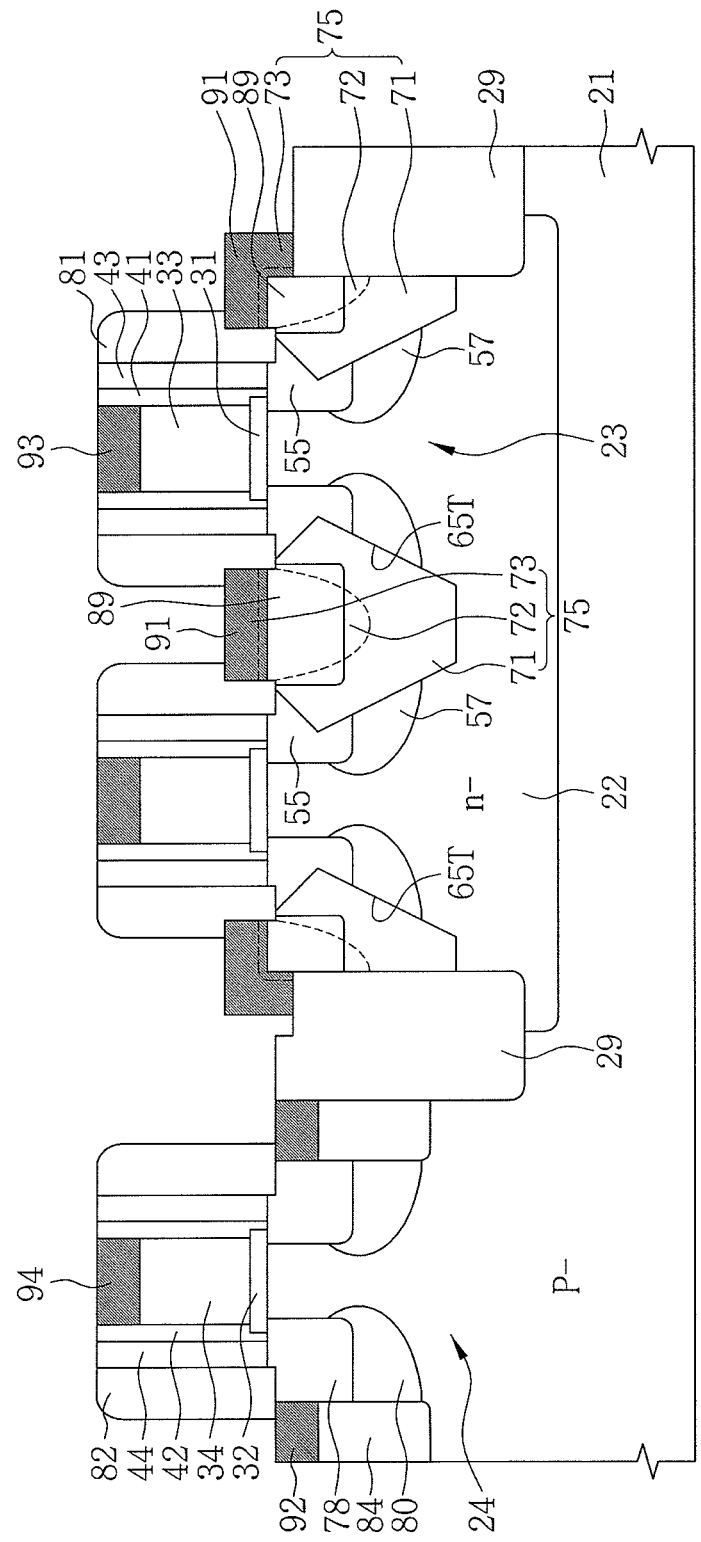

Referring to FIGS. 9 and 23, the sixth mask pattern 87, the first buffer patterns 35, and the second buffer pattern 36 may be removed to expose the first gate electrodes 33, the second gate electrode 34, the P-source/drains 89, and the N-source/drains 84. Metal silicide patterns 91, 92, 93, 94 may be formed on the first gate electrodes 33, the second gate electrode 34, the P-source/drains 89, and the N-source/drains 84 (S180).

The metal silicide patterns 91, 92, 93, 94 may include first metal silicide patterns 91 formed on upper ends of the P-source/drains 89, second metal silicide patterns 93 formed on upper ends of the first gate electrodes 33, third metal silicide patterns 92 formed on upper ends of N-source/drains 84, and a fourth metal silicide pattern 94 formed on an upper end of second gate electrode 34. The first metal silicide patterns 91 may be formed in the third semiconductor layer 73 and the second semiconductor layer 72. For example, the third semiconductor layer 73 may fully be converted into the first metal silicide patterns 91. The second semiconductor layer 72 adjacent to the third semiconductor layer 73 may be converted into the first metal silicide patterns 91.

Figure 24:
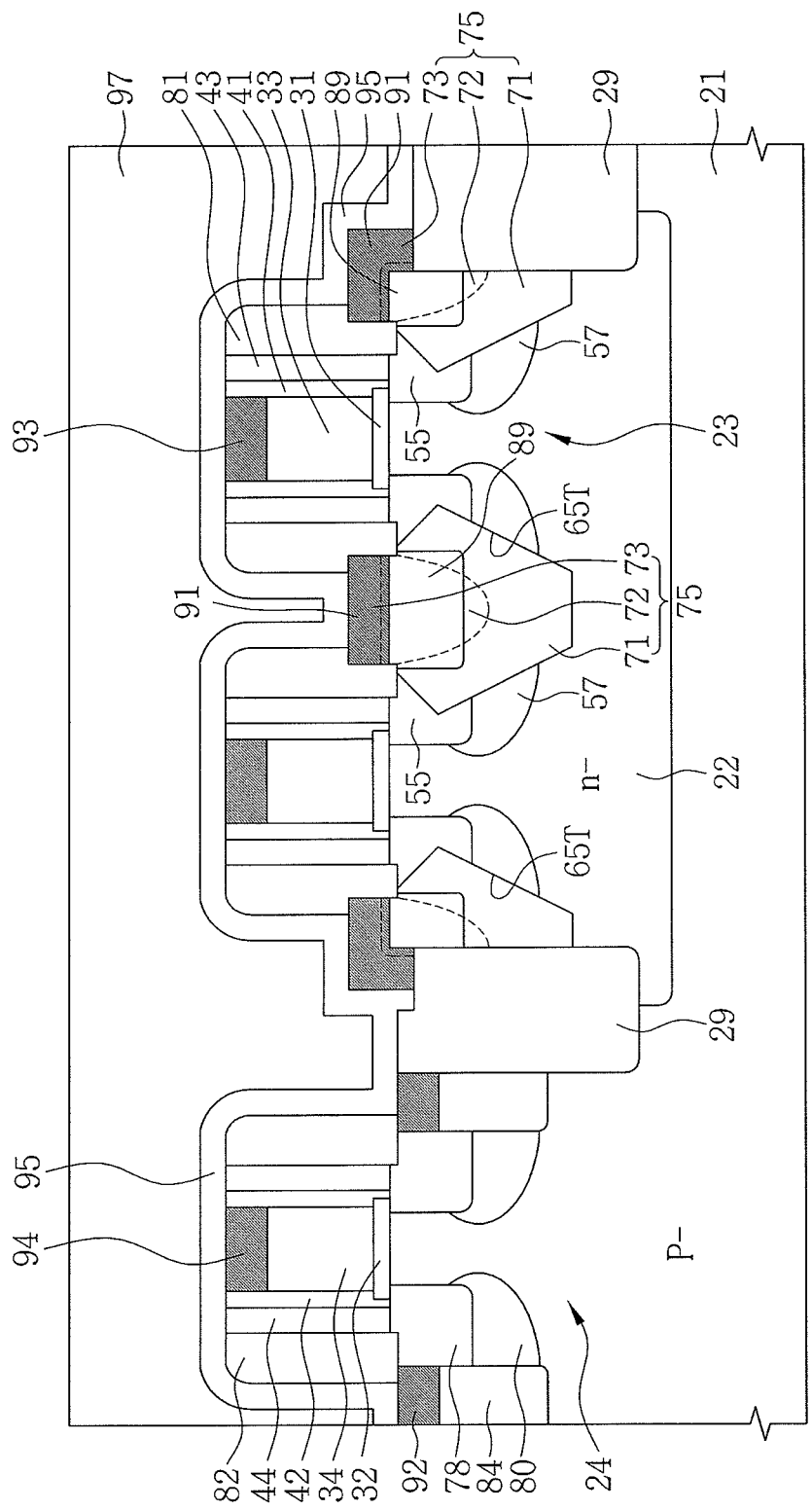

Referring to FIGS. 9 and 24, an etch-stopping layer 95 conformally covering the entire substrate 21 may be formed. An interlayer insulating layer 97 may be formed on the etch-stopping layer 95 (190). In some embodiments, the etch-stopping layer 95 may include a material having an etch selectivity with respect to the interlayer insulating layer 97. For example, the etch-stopping layer 95 may include silicon nitride, and the interlayer insulating layer 97 may include silicon oxide.

TABLE 1

Difference caused by pattern loading effect

| Component | Experiment 1 | | Experiment 2 | | Experiment 3 | |
|---|---|---|---|---|---|---|
| Sacrificial spacer | 13.5 nm | | 7.5 nm | | 13.5 nm | |
| First trench | N/A | | 24 nm | | 16 nm | |
| Second trench | 35 nm | | 13 nm | | 17 nm | |
| Third trench | NH4OH 40:1 | | NH4OH 40:1 | | TMAH | |
| Pattern density | High | Low | High | Low | High | Low |
| X2 | 4.0 nm | 1.1 nm | 2.8 nm | 1.9 nm | 3.7 nm | 3.1 nm |
| Δ | 2.9 nm | | 0.9 nm | | 0.6 nm | |

Table 1 shows experimental examples of variation in the locations of the second edge E2 due to the pattern loading effect.

Referring to Table 1 and FIG. 14B, in Experiment 1, the process of forming the first trench described in the embodiments of the inventive concepts is omitted, and the difference in second horizontal distance X2 between a high pattern-density region and a lower pattern-density region is 2.9 nm, which is relatively great. In Experiments 2 and 3, the conditions of forming the sacrificial spacer, the first trench, the second trench, and the third trench described in the embodiments of the inventive concepts, are controlled so as to be formed according to different processes with respect to each other, and the differences of the second horizontal distance X2 between a high pattern-density region and a lower pattern-density region are respectively 0.9 nm and 0.6 nm, which are relatively small as compared to Experiment 1. As shown in the experimental examples of Table. 1, according to the embodiments of the inventive concepts, it can be seen that the differences of the second horizontal distance X2 between the high pattern density region and the low pattern density region can be significantly improved, as compared to the related art.

TABLE 2

Difference between the center area and the edge area of the active region

| Component | Experiment 4 | Experiment 5 |
|---|---|---|
| Sacrificial spacer | 13.5 nm | 13.5 nm |
| First trench | N/A | 16 nm |
| Second trench | 35 nm | 17 nm |
| Third trench | NH4OH 40:1 | TMAH |
| X21-X22 | 3.5 nm | 0.7 nm |

Table 2 illustrates variation in the locations of the second edge E2 in the center and edge areas of the active region.

Referring to Table 2 and FIG. 6, in the experiment 4, the process of forming the first trench described in the embodiments of the inventive concepts is omitted, and the difference between the second horizontal distance X21 and the third horizontal distance X22 is 3.5 nm, which is relatively great. In Experiment 5, the conditions of forming the first trench, the second trench, and the third trench described in the embodiments of the inventive concepts are controlled, and the difference between the second horizontal distance X21 and the third horizontal distance X22 is 0.7 nm, which is relatively small. As shown in the experimental examples of Table. 2, according to the embodiments of the inventive concepts, it can be seen that the difference between the locations of the second edge E2 in the center and edge areas of the active region can be significantly improved, as compared to the related art.

Figure 25:
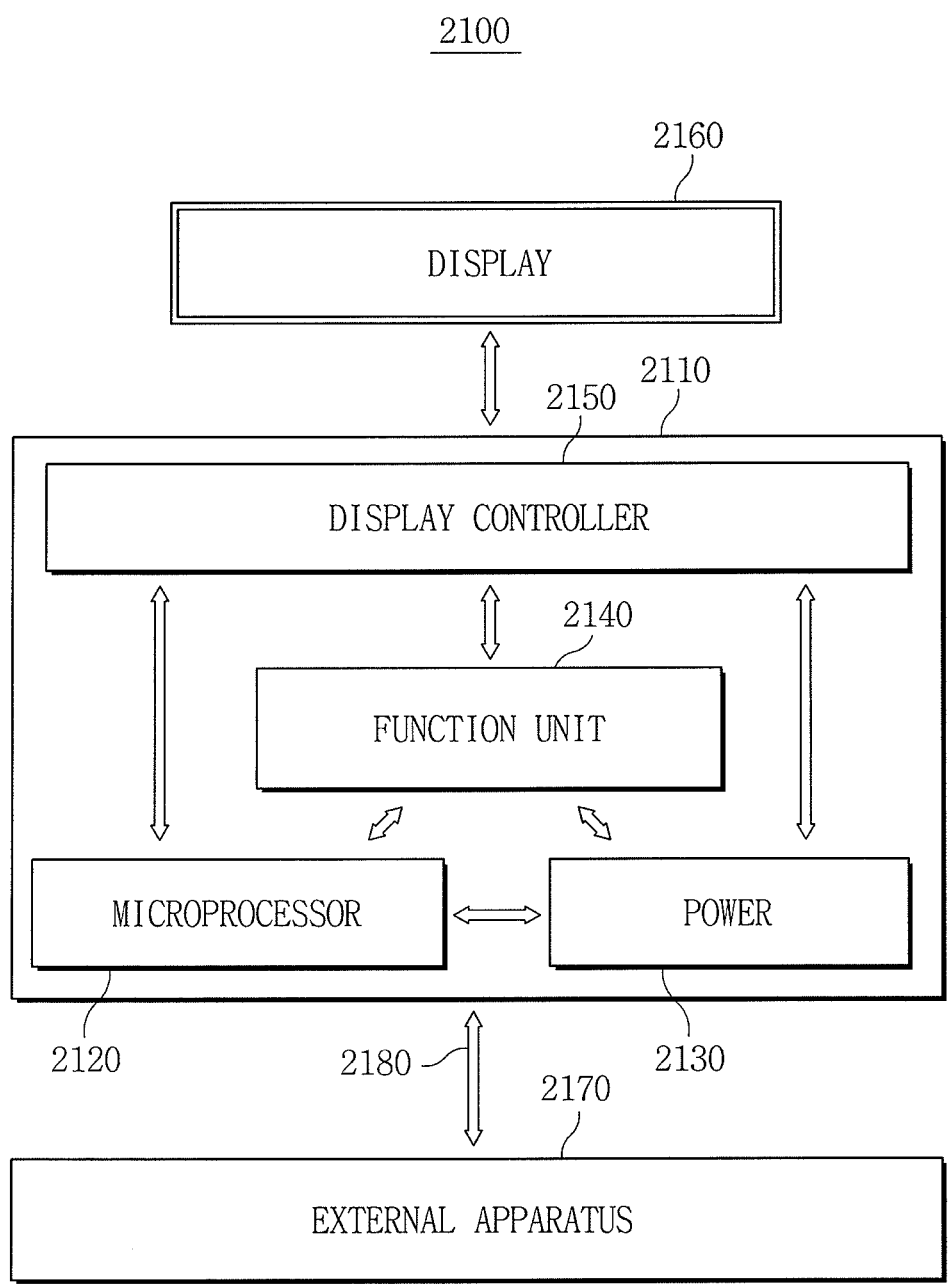
FIGS. 25 and 26 are system block diagrams for describing electronic apparatuses in accordance with various embodiments of the inventive concepts.

FIG. 25 is a system block diagram for describing an electronic apparatus in accordance with various embodiments of the inventive concepts.

Referring to FIG. 25, the semiconductor device as described with reference to FIGS. 1 to 24 may be applied to an electronic system 2100. The electronic system 2100 may include a body 2110, a microprocessor unit 2120, a power unit 2130, a function unit 2140, and a display controller unit 2150. The body 2110 may be a motherboard formed of a printed circuit board (PCB). The microprocessor unit 2120, the power unit 2130, the function unit 2140, and the display controller unit 2150 may be installed on the body 2110. A display unit 2160 may be arranged an inside or outside of the body 2110. For example, the display unit 2160 may be arranged on a surface of the body 2110 and display an image processed by the display controller unit 2150.

The power unit 2130 may receive a constant voltage from an external battery (not shown), etc., divide the voltage into required voltage levels, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a mobile phone, the function unit 2140 may have several components which perform functions of the mobile phone such as output of an image to the display unit 2160 or output of a voice to a speaker, by dialing or communication with an external apparatus 2170. If a camera is installed, the function unit 2140 may function as a camera image processor.

In the embodiment to which the inventive concepts is applied, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), etc. in order to expand functionality, the function unit 2140 may function as an interface controller. Further, the function unit 2140 may include a mass storage apparatus.

The semiconductor device as described with reference to FIGS. 1 to 24 may be applied to the function unit 2140 or the microprocessor unit 2120. For example, the function unit 2140 may include the strain-inducing pattern 75. The microprocessor unit 2120 may have superior electrical characteristics to the related art, due to the configuration of the strain-inducing pattern 75.

Figure 26:
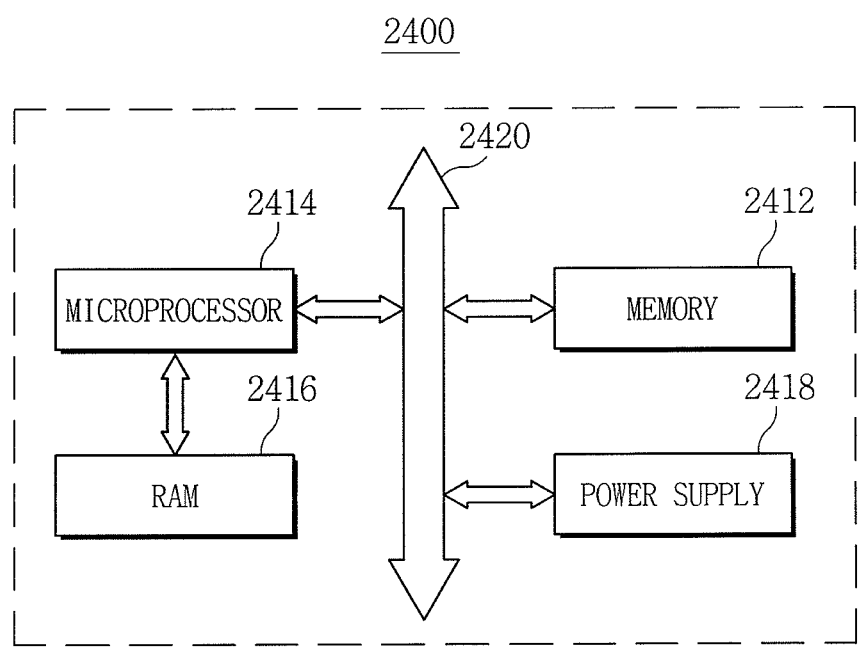

FIG. 26 is a block diagram schematically showing another electronic system 2400 including at least one of the semiconductor devices in accordance with various embodiments of the inventive concepts.

Referring to FIG. 26, the electronic system 2400 may include at least one of semiconductor devices in accordance with various embodiments of the inventive concepts. The electronic system 2400 may be used to fabricate a mobile apparatus or a computer. For example, the electronic system 2400 may include a memory system 2412, a microprocessor 2414, a random access memory (RAM), and a power supply 2418. The microprocessor 2414 may program and control the electronic system 2400. The RAM 2416 may be used as an operation memory of the microprocessor 2414. For example, the microprocessor 2414, the RAM 2416, and/or other components may include at least one of semiconductor devices fabricated in accordance with various embodiments of the inventive concepts. The microprocessor 2414, the RAM 2416, and/or other components can be assembled in a single package. The memory system 2412 may store codes for operating the microprocessor 2414, data processed by the microprocessor 2414, or external input data. The memory system 2412 may include a controller and a memory device.

The semiconductor device as described with reference to FIGS. 1 to 24 may be applied to the microprocessor 2414, the RAM 2416, or the memory system 2412. For example, the microprocessor 2414 may include the strain-inducing pattern 75. The microprocessor 2414 may have superior electrical characteristics to the related art, due to the configuration of the strain-inducing pattern 75.

According to the embodiments of the inventive concepts, the strain-inducing pattern filling a trench formed in an active region may be provided. The trench may include a first trench formed by an anisotropic etch process, a second trench formed by an isotropic etch process, and a third trench formed by a directional etch process. The configuration of the trench may have superior effect to the related art in that the pattern loading effect is minimized and the difference between the locations of the edges formed in the center and edge areas of the active region is improved. A semiconductor device having superior electrical characteristics to the related art can be implemented.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures.

What is claimed is:

1. A semiconductor device, comprising:
 a substrate having a first region and having a second region having a higher pattern density than the first region, the substrate extending in a horizontal direction of extension;
 a first active region defined in the first region;
 a first gate electrode on the first active region;
 a first trench in the first active region and offset-aligned to the first gate electrode;
 a first strain-inducing pattern in the first trench;
 a second active region defined in the second region;
 a second gate electrode on the second active region;
 a second trench in the second active region and offset-aligned to the second gate electrode; and
 a second strain-inducing pattern in the second trench,
 wherein the first active region has a first Σ-shaped configuration bordered in part by the first trench, and the second active region has a second Σ-shaped configuration bordered in part by the second trench, and
 wherein a vertical line that is perpendicular to the horizontal direction of extension of the substrate and intersects a side surface of the first gate electrode is defined as a first vertical line, wherein a vertical line that is perpendicular to the horizontal direction of extension of the substrate and intersects a side surface of the second gate electrode is defined as a second vertical line, wherein a shortest distance between the first vertical line and the first trench is defined as a first horizontal distance, wherein a shortest distance between the second vertical line and the second trench is defined as a second horizontal distance, and wherein a difference between the first horizontal distance and the second horizontal distance is equal to or less than 1 nm.

2. The semiconductor device of claim 1, wherein:
the first active region includes:
a first upper surface facing the first gate electrode;
a first upper side surface facing the first strain-inducing pattern below the first upper surface;
a first lower side surface facing the first strain-inducing pattern below the first upper side surface;
a first upper edge disposed between the first upper surface and the first upper side surface; and
a first intermediate edge disposed between the first upper side surface and the first lower side surface, the first intermediate edge being nearer than the first upper edge with respect to the first vertical line, and the first horizontal distance being a horizontal distance between the first vertical line and the first intermediate edge; and
the second active region includes:
a second upper surface facing the second gate electrode;
a second upper side surface facing the second strain-inducing pattern below the second upper surface;
a second lower side surface facing the second strain-inducing pattern below the second upper side surface;
a second upper edge disposed between the second upper surface and the second upper side surface; and
a second intermediate edge disposed between the second upper side surface and the second lower side surface, the second intermediate edge being nearer than the second upper edge with respect to the second vertical line, and the second horizontal distance being a horizontal distance between the second vertical line and the second intermediate edge.

3. The semiconductor device of claim 2, wherein a horizontal line that is parallel to the substrate and intersects an upper end of the first active region is defined as a first horizontal line, when a horizontal line that intersects the first upper edge is defined as a second horizontal line, when a horizontal line that intersects the first intermediate edge is defined as a third horizontal line, and when a horizontal line that intersects a bottom of the trench is defined as a fourth horizontal line, and wherein
a first vertical distance between the first horizontal line and the third horizontal line is smaller than a second vertical distance between the third horizontal line and the fourth horizontal line when taken along the first vertical line.

4. The semiconductor device of claim 3, wherein a third horizontal distance between the first upper edge and the first vertical line is greater than the first horizontal distance when taken along the second horizontal line.

5. The semiconductor device of claim 4, wherein the third horizontal distance is one to 1.5 times the first vertical distance.

6. The semiconductor device of claim 4, wherein an angle of intersection between the first upper side surface of the first active region and the second horizontal line ranges from 30 to 40 degrees.

7. The semiconductor device of claim 4, wherein an angle of intersection between the first lower side surface of the first active region and the fourth horizontal line ranges from 50 to 60 degrees.

8. The semiconductor device of claim 1, wherein each of the first and second strain-inducing patterns includes a first semiconductor layer, a second semiconductor layer on the first semiconductor layer, and a third semiconductor layer on the second semiconductor layer and that has an protrudes at a level that is greater than those of the first and second active regions.

9. The semiconductor device of claim 8, wherein the first semiconductor layer is in direct contact with the first and second active regions.

10. The semiconductor device of claim 8, wherein:
the first and second active regions include single crystalline silicon;
the first and second semiconductor layers include a SiGe layer; and
the second semiconductor layer has a higher Ge content than the first semiconductor layer.

11. The semiconductor device of claim 10, wherein the third semiconductor layer comprises a SiGe layer having a lower Ge content than the second semiconductor layer.

12. The semiconductor device of claim 10, wherein the third semiconductor layer comprises an Si layer.

13. The semiconductor device of claim 8, wherein:
the first and second active regions include n-type impurities;
the first semiconductor layer includes p-type impurities; and
the second semiconductor layer includes p-type impurities having a higher concentration than the first semiconductor layer.

14. A semiconductor device, comprising:
a substrate having a first region and a having second region having a higher pattern density than the first region;
a first active region defined in the first region;
a first gate electrode covering an upper portion and a side surface of the first active region;
a first trench in the first active region and offset-aligned to the first gate electrode;
a first strain-inducing pattern the first trench;
a second active region defined in the second region;
a second gate electrode covering an upper portion and a side surface of the second active region;
a second trench in the second active region and offset-aligned to the second gate electrode; and
a second strain-inducing pattern in the second trench,
wherein the first active region has a first Σ-shaped configuration bordered in part the first trench, and the second active region has a second Σ-shape configuration bordered in part by the second trench, and
wherein a vertical line that is perpendicular to the substrate and intersects the side surface of the first gate electrode is defined as a first vertical line, wherein a vertical line that is perpendicular to the substrate and intersects the side surface of the second gate electrode is defined as a second vertical line, wherein a shortest distance between the first vertical line and the first trench is defined as a first horizontal distance, wherein a shortest distance between the second vertical line and the second trench is defined as a second horizontal distance, and wherein a difference between the first horizontal distance and the second horizontal distance is equal to or less than 1 nm.

15. A semiconductor device comprising:
an active region defined on a substrate;
a gate electrode on the active region;
a lightly doped drain (LDD) in the active region adjacent to the gate electrode;
a trench in the active region adjacent to the gate electrode and disposed at an outer side of the LDD; and
a strain-inducing pattern in the trench,
wherein the active region includes:
  an upper surface;
  a first side surface facing the strain-inducing pattern below the upper surface;
  a second side surface facing the strain-inducing pattern below the first side surface;
  a first edge disposed between the upper surface and the first side surface; and
  a second edge between the first side surface and the second side surface,
wherein the second edge is nearer than the first edge with respect to a vertical line that is perpendicular to the substrate and intersects a side surface of the gate electrode, and
wherein the second edge is formed on a surface of the LDD;
wherein:
  the strain-inducing pattern includes a first semiconductor layer, a second semiconductor layer on the first semiconductor layer, and a third semiconductor layer on the second semiconductor layer and that protrudes at a higher level than the first edge;
  the active region includes n-type impurities;
  the LDD includes p-type impurities;
  the first semiconductor layer includes p-type impurities having a higher concentration than the LDD; and
  the second semiconductor layer includes p-type impurities having a higher concentration than the first semiconductor layer.

16. The semiconductor device of claim 15, further comprising:
  a first spacer on the side surface of the gate electrode; and
  a second spacer on the first spacer,
  wherein the first spacer is in direct contact with the LDD.

17. The semiconductor device of claim 16, wherein the second spacer is in direct contact with the LDD and the strain-inducing pattern.

18. The semiconductor device of claim 17, wherein:
  the strain-inducing pattern includes:
    a first surface connected to the first edge and having a different slope from the first side surface of the active region;
    a second surface connected to the first surface and having a different slope from the first surface; and
    a third surface connected to the second surface and formed at an upper end of the strain-inducing pattern, and
  the second spacer is in direct contact with the LDD, the first edge, the first surface, the second surface, and the third surface.

19. The semiconductor device of claim 18, wherein an angle of intersection between a horizontal line passing the first edge and the first surface of the strain-inducing pattern is smaller than that between the horizontal line and the first side surface of the active region.

20. The semiconductor device of claim 15, further comprising a halo formed within the active region and having different conductive impurities from the LDD, wherein
  the halo covers a side surface and a lower end of the LDD, and
  the first side surface is formed on a surface of the LDD, and the second side surface is formed on surfaces of the LDD and the halo.

* * * * *

UNITED STATES PATENT AND TRADEMARK OFFICE
CERTIFICATE OF CORRECTION

PATENT NO.       : 8,907,426 B2                                       Page 1 of 1
APPLICATION NO.  : 13/908440
DATED            : December 9, 2014
INVENTOR(S)      : Dong-Suk Shin et al.

It is certified that error appears in the above-identified patent and that said Letters Patent is hereby corrected as shown below:

In the specification,
Column 9, line 24, Please delete "a first surface 7551" and insert --a first surface 75S1--
Column 9, line 37, Please delete "the first surface 7551" and insert --the first surface 75S1--
Column 18, line 31, Please delete "a first surface 7551" and insert --a first surface 75S1--

Signed and Sealed this
Tenth Day of May, 2016

Michelle K. Lee
*Director of the United States Patent and Trademark Office*